(12) United States Patent
Loewenstern et al.

(10) Patent No.: US 10,230,310 B2
(45) Date of Patent: Mar. 12, 2019

(54) SAFETY SWITCH FOR PHOTOVOLTAIC SYSTEMS

(71) Applicant: Solaredge Technologies Ltd., Herziliya Pituach (IL)

(72) Inventors: Yakir Loewenstern, Ariel (IL); Ilan Yoscovich, Ramat-Gan (IL); David Braginsky, Ashdod (IL); Tzachi Glovinsky, Petah Tikva (IL); Izak Assia, Shoham (IL)

(73) Assignee: Solaredge Technologies Ltd, Herzeliya (IL)

( * ) Notice: Subject to any disclaimer, the term of this patent is extended or adjusted under 35 U.S.C. 154(b) by 59 days.

(21) Appl. No.: 15/250,068

(22) Filed: Aug. 29, 2016

(65) Prior Publication Data

US 2017/0288384 A1 Oct. 5, 2017

Related U.S. Application Data

(60) Provisional application No. 62/341,147, filed on May 25, 2016, provisional application No. 62/318,303, filed on Apr. 5, 2016.

(51) Int. Cl.
*H02J 1/00* (2006.01)
*H02J 3/00* (2006.01)
(Continued)

(52) U.S. Cl.
CPC ............... *H02M 7/48* (2013.01); *H02H 7/20* (2013.01); *H02M 3/145* (2013.01); *H02S 40/30* (2014.12);
(Continued)

(58) Field of Classification Search
CPC .. H02H 3/00; H02H 3/08; H02H 7/12; H02H 7/1213; H02H 7/122; H02H 5/00;
(Continued)

(56) References Cited

U.S. PATENT DOCUMENTS

| 2,367,925 A | 1/1945 | Brown |
| 2,586,804 A | 2/1952 | Fluke |

(Continued)

FOREIGN PATENT DOCUMENTS

| AU | 2073800 A | 9/2000 |
| AU | 2005262278 A1 | 1/2006 |

(Continued)

OTHER PUBLICATIONS

Chinese Office Action—CN Appl. 201310035221.8—dated Aug. 11, 2016.

(Continued)

*Primary Examiner* — Fritz M Fleming
*Assistant Examiner* — Jagdeep Dhillon

(57) ABSTRACT

Various implementations described herein are directed to a methods and apparatuses for disconnecting, by a device, elements at certain parts of an electrical system. The method may include measuring operational parameters at certain locations within the system and/or receiving messages from control devices indicating a potentially unsafe condition, disconnecting and/or short-circuiting system elements in response, and reconnection the system elements when it is safe to do so. Certain embodiments relate to methods and apparatuses for providing operational power to safety switches during different modes of system operation.

25 Claims, 22 Drawing Sheets

(51) Int. Cl.
*H02M 7/48* (2007.01)
*H02M 3/145* (2006.01)
*H02S 50/10* (2014.01)
*H02S 40/30* (2014.01)
*H02S 40/36* (2014.01)
*H02H 7/20* (2006.01)
*H02H 3/08* (2006.01)

(52) U.S. Cl.
CPC .............. *H02S 40/36* (2014.12); *H02S 50/10* (2014.12); *H02H 3/08* (2013.01)

(58) Field of Classification Search
CPC .......... H02M 3/145; H02M 7/48; H02M 7/00; H02S 40/32; H02S 40/34; H02S 40/00; H02J 7/0052; H02J 7/00
USPC ........... 307/84, 82, 80, 66, 64, 9.1; 320/108, 320/109, 107, 137
See application file for complete search history.

(56) References Cited

U.S. PATENT DOCUMENTS

| | | |
|---|---|---|
| 2,758,219 A | 8/1956 | Miller |
| 2,852,721 A | 9/1958 | Harders et al. |
| 2,958,171 A | 11/1960 | Deckers |
| 3,369,210 A | 2/1968 | Manickella |
| 3,392,326 A | 7/1968 | Lamberton |
| 3,496,029 A | 2/1970 | King et al. |
| 3,566,143 A | 2/1971 | Paine et al. |
| 3,643,564 A | 2/1972 | Uchiyama |
| 3,696,286 A | 10/1972 | Ule |
| 3,740,652 A | 6/1973 | Burgener |
| 3,958,136 A | 5/1976 | Schroeder |
| 4,060,757 A | 11/1977 | McMurray |
| 4,101,816 A | 7/1978 | Shepter |
| 4,104,687 A | 8/1978 | Zulaski |
| 4,127,797 A | 11/1978 | Perper |
| 4,129,788 A | 12/1978 | Chavannes |
| 4,129,823 A | 12/1978 | van der Pool et al. |
| 4,146,785 A | 3/1979 | Neale |
| 4,161,771 A | 7/1979 | Bates |
| 4,171,861 A | 10/1979 | Hohorst |
| 4,183,079 A | 1/1980 | Wachi |
| 4,257,087 A | 3/1981 | Cuk |
| 4,296,461 A | 10/1981 | Mallory et al. |
| 4,321,581 A | 3/1982 | Tappeiner et al. |
| 4,324,225 A | 4/1982 | Trihey |
| 4,327,318 A | 4/1982 | Kwon et al. |
| 4,346,341 A | 8/1982 | Blackburn et al. |
| 4,363,040 A | 12/1982 | Inose |
| 4,367,557 A | 1/1983 | Stern et al. |
| 4,375,662 A | 3/1983 | Baker |
| 4,384,321 A | 5/1983 | Rippel |
| 4,404,472 A | 9/1983 | Steigerwald |
| 4,412,142 A | 10/1983 | Ragonese et al. |
| 4,452,867 A | 6/1984 | Conforti |
| 4,453,207 A | 6/1984 | Paul |
| 4,460,232 A | 7/1984 | Sotolongo |
| 4,470,213 A | 9/1984 | Thompson |
| 4,479,175 A | 10/1984 | Gille et al. |
| 4,481,654 A | 11/1984 | Daniels et al. |
| 4,488,136 A | 12/1984 | Hansen et al. |
| 4,526,553 A | 7/1985 | Guerrero |
| 4,533,986 A | 8/1985 | Jones |
| 4,545,997 A | 10/1985 | Wong et al. |
| 4,549,254 A | 10/1985 | Kissel |
| 4,554,502 A | 11/1985 | Rohatyn |
| 4,554,515 A | 11/1985 | Burson et al. |
| 4,580,090 A | 4/1986 | Bailey et al. |
| 4,591,965 A | 5/1986 | Dickerson |
| 4,598,330 A | 7/1986 | Woodworth |
| 4,602,322 A | 7/1986 | Merrick |
| 4,604,567 A | 8/1986 | Chetty |
| 4,611,090 A | 9/1986 | Catella et al. |
| 4,623,753 A | 11/1986 | Feldman et al. |
| 4,626,983 A | 12/1986 | Harada et al. |
| 4,631,565 A | 12/1986 | Tihanyi |
| 4,637,677 A | 1/1987 | Barkus |
| 4,639,844 A | 1/1987 | Gallios et al. |
| 4,641,042 A | 2/1987 | Miyazawa |
| 4,641,079 A | 2/1987 | Kato et al. |
| 4,644,458 A | 2/1987 | Harafuji et al. |
| 4,649,334 A | 3/1987 | Nakajima |
| 4,652,770 A | 3/1987 | Kumano |
| 4,683,529 A | 7/1987 | Bucher, II |
| 4,685,040 A | 8/1987 | Steigerwald et al. |
| 4,686,617 A | 8/1987 | Colton |
| 4,706,181 A | 11/1987 | Mercer |
| 4,719,553 A | 1/1988 | Hinckley |
| 4,720,667 A | 1/1988 | Lee et al. |
| 4,720,668 A | 1/1988 | Lee et al. |
| 4,736,151 A | 4/1988 | Dishner |
| 4,746,879 A | 5/1988 | Ma et al. |
| 4,772,994 A | 9/1988 | Harada et al. |
| 4,783,728 A | 11/1988 | Hoffman |
| 4,797,803 A | 1/1989 | Carroll |
| 4,819,121 A | 4/1989 | Saito et al. |
| RE33,057 E | 9/1989 | Clegg et al. |
| 4,864,213 A | 9/1989 | Kido |
| 4,868,379 A | 9/1989 | West |
| 4,873,480 A | 10/1989 | Lafferty |
| 4,888,063 A | 12/1989 | Powell |
| 4,888,702 A | 12/1989 | Gerken et al. |
| 4,899,246 A | 2/1990 | Tripodi |
| 4,899,269 A | 2/1990 | Rouzies |
| 4,903,851 A | 2/1990 | Slough |
| 4,906,859 A | 3/1990 | Kobayashi et al. |
| 4,910,518 A | 3/1990 | Kim et al. |
| 4,951,117 A | 8/1990 | Kasai |
| 4,978,870 A | 12/1990 | Chen et al. |
| 4,987,360 A | 1/1991 | Thompson |
| 5,001,415 A | 3/1991 | Watkinson |
| 5,027,051 A | 6/1991 | Lafferty |
| 5,027,059 A | 6/1991 | de Montgolfier et al. |
| 5,045,988 A | 9/1991 | Gritter et al. |
| 5,081,558 A | 1/1992 | Mahler |
| 5,097,196 A | 3/1992 | Schoneman |
| 5,138,422 A | 8/1992 | Fujii et al. |
| 5,143,556 A | 9/1992 | Matlin |
| 5,144,222 A | 9/1992 | Herbert |
| 5,155,670 A | 10/1992 | Brian |
| 5,191,519 A | 3/1993 | Kawakami |
| 5,196,781 A | 3/1993 | Jamieson et al. |
| 5,210,519 A | 5/1993 | Moore |
| 5,235,266 A | 8/1993 | Schaffrin |
| 5,237,194 A | 8/1993 | Takahashi |
| 5,268,832 A | 12/1993 | Kandatsu |
| 5,280,133 A | 1/1994 | Nath |
| 5,280,232 A | 1/1994 | Kohl et al. |
| 5,287,261 A | 2/1994 | Ehsani |
| 5,289,361 A | 2/1994 | Vinciarelli |
| 5,289,998 A | 3/1994 | Bingley et al. |
| 5,327,071 A | 7/1994 | Frederick et al. |
| 5,329,222 A | 7/1994 | Gyugyi et al. |
| 5,345,375 A | 9/1994 | Mohan |
| 5,379,209 A | 1/1995 | Goff |
| 5,381,327 A | 1/1995 | Yan |
| 5,391,235 A | 2/1995 | Inoue |
| 5,402,060 A | 3/1995 | Erisman |
| 5,404,059 A | 4/1995 | Loftier |
| 5,412,558 A | 5/1995 | Sakurai et al. |
| 5,413,313 A | 5/1995 | Mutterlein et al. |
| 5,428,286 A | 6/1995 | Kha |
| 5,446,645 A | 8/1995 | Shirahama et al. |
| 5,460,546 A | 10/1995 | Kunishi et al. |
| 5,472,614 A | 12/1995 | Rossi |
| 5,493,154 A | 2/1996 | Smith et al. |
| 5,497,289 A | 3/1996 | Sugishima et al. |
| 5,504,415 A | 4/1996 | Podrazhansky et al. |
| 5,504,418 A | 4/1996 | Ashley |
| 5,504,449 A | 4/1996 | Prentice |
| 5,513,075 A | 4/1996 | Capper et al. |
| 5,517,378 A | 5/1996 | Asplund et al. |

(56) References Cited

U.S. PATENT DOCUMENTS

| | | |
|---|---|---|
| 5,530,335 A | 6/1996 | Decker et al. |
| 5,539,238 A | 7/1996 | Malhi |
| 5,548,504 A | 8/1996 | Takehara |
| 5,563,780 A | 10/1996 | Goad |
| 5,565,855 A | 10/1996 | Knibbe |
| 5,566,022 A | 10/1996 | Segev |
| 5,576,941 A | 11/1996 | Nguyen et al. |
| 5,580,395 A | 12/1996 | Yoshioka et al. |
| 5,585,749 A | 12/1996 | Pace et al. |
| 5,604,430 A | 2/1997 | Decker et al. |
| 5,616,913 A | 4/1997 | Litterst |
| 5,631,534 A | 5/1997 | Lewis |
| 5,636,107 A | 6/1997 | Lu et al. |
| 5,644,212 A | 7/1997 | Takahashi |
| 5,644,219 A | 7/1997 | Kurokawa |
| 5,646,501 A | 7/1997 | Fishman et al. |
| 5,648,731 A | 7/1997 | Decker et al. |
| 5,654,740 A | 8/1997 | Schulha |
| 5,659,465 A | 8/1997 | Flack et al. |
| 5,677,833 A | 10/1997 | Bingley |
| 5,684,385 A | 11/1997 | Guyonneau et al. |
| 5,686,766 A | 11/1997 | Tamechika |
| 5,696,439 A | 12/1997 | Presti et al. |
| 5,703,390 A | 12/1997 | Itoh |
| 5,708,576 A | 1/1998 | Jones et al. |
| 5,719,758 A | 2/1998 | Nakata et al. |
| 5,722,057 A | 2/1998 | Wu |
| 5,726,505 A | 3/1998 | Yamada et al. |
| 5,726,615 A | 3/1998 | Bloom |
| 5,731,603 A | 3/1998 | Nakagawa et al. |
| 5,734,258 A | 3/1998 | Esser |
| 5,734,259 A | 3/1998 | Sisson et al. |
| 5,734,565 A | 3/1998 | Mueller et al. |
| 5,747,967 A | 5/1998 | Muljadi et al. |
| 5,751,120 A | 5/1998 | Zeitler et al. |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,793,184 A | 8/1998 | O'Connor |
| 5,798,631 A | 8/1998 | Spec et al. |
| 5,801,519 A | 9/1998 | Midya et al. |
| 5,804,894 A | 9/1998 | Leeson et al. |
| 5,812,045 A | 9/1998 | Ishikawa et al. |
| 5,814,970 A | 9/1998 | Schmidt |
| 5,821,734 A | 10/1998 | Faulk |
| 5,822,186 A | 10/1998 | Bull et al. |
| 5,838,148 A | 11/1998 | Kurokami et al. |
| 5,847,549 A | 12/1998 | Dodson, III |
| 5,859,772 A | 1/1999 | Hilpert |
| 5,869,956 A | 2/1999 | Nagao et al. |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,898,585 A | 4/1999 | Sirichote et al. |
| 5,903,138 A | 5/1999 | Hwang et al. |
| 5,905,645 A | 5/1999 | Cross |
| 5,917,722 A | 6/1999 | Singh |
| 5,919,314 A | 7/1999 | Kim |
| 5,923,100 A | 7/1999 | Lukens et al. |
| 5,923,158 A | 7/1999 | Kurokami et al. |
| 5,929,614 A | 7/1999 | Copple |
| 5,930,128 A | 7/1999 | Dent |
| 5,930,131 A | 7/1999 | Feng |
| 5,932,994 A | 8/1999 | Jo et al. |
| 5,933,327 A | 8/1999 | Leighton et al. |
| 5,945,806 A | 8/1999 | Faulk |
| 5,946,206 A | 8/1999 | Shimizu et al. |
| 5,949,668 A | 9/1999 | Schweighofer |
| 5,955,885 A | 9/1999 | Kurokami et al. |
| 5,959,438 A | 9/1999 | Jovanovic et al. |
| 5,961,739 A | 10/1999 | Osborne |
| 5,963,010 A | 10/1999 | Hayashi et al. |
| 5,963,078 A | 10/1999 | Wallace |
| 5,982,253 A | 11/1999 | Perrin et al. |
| 5,986,909 A | 11/1999 | Hammond et al. |
| 5,990,659 A | 11/1999 | Frannhagen |
| 6,002,290 A | 12/1999 | Avery et al. |
| 6,002,603 A | 12/1999 | Carver |
| 6,008,971 A * | 12/1999 | Duba ................ H02H 7/30 361/64 |
| 6,021,052 A | 2/2000 | Unger et al. |
| 6,031,736 A | 2/2000 | Takehara et al. |
| 6,037,720 A | 3/2000 | Wong et al. |
| 6,038,148 A | 3/2000 | Farrington et al. |
| 6,046,470 A | 4/2000 | Williams et al. |
| 6,046,919 A | 4/2000 | Madenokouji et al. |
| 6,050,779 A | 4/2000 | Nagao et al. |
| 6,058,035 A | 5/2000 | Madenokouji et al. |
| 6,064,086 A | 5/2000 | Nakagawa et al. |
| 6,078,511 A | 6/2000 | Fasullo et al. |
| 6,081,104 A | 6/2000 | Kern |
| 6,082,122 A | 7/2000 | Madenokouji et al. |
| 6,087,738 A | 7/2000 | Hammond |
| 6,091,329 A | 7/2000 | Newman |
| 6,093,885 A | 7/2000 | Takehara et al. |
| 6,094,129 A | 7/2000 | Baiatu |
| 6,101,073 A | 8/2000 | Takehara |
| 6,105,317 A | 8/2000 | Tomiuchi et al. |
| 6,111,188 A | 8/2000 | Kurokami et al. |
| 6,111,391 A | 8/2000 | Cullen |
| 6,111,767 A | 8/2000 | Handleman |
| 6,130,458 A | 10/2000 | Takagi et al. |
| 6,150,739 A | 11/2000 | Baumgartl et al. |
| 6,151,234 A | 11/2000 | Oldenkamp |
| 6,163,086 A | 12/2000 | Choo |
| 6,166,455 A | 12/2000 | Li |
| 6,166,527 A | 12/2000 | Dwelley et al. |
| 6,169,678 B1 | 1/2001 | Kondo et al. |
| 6,175,219 B1 | 1/2001 | Imamura et al. |
| 6,175,512 B1 | 1/2001 | Hagihara et al. |
| 6,191,456 B1 | 2/2001 | Stoisiek et al. |
| 6,219,623 B1 | 4/2001 | Wills |
| 6,225,793 B1 | 5/2001 | Dickmann |
| 6,255,360 B1 | 7/2001 | Domschke et al. |
| 6,255,804 B1 | 7/2001 | Herniter et al. |
| 6,256,234 B1 | 7/2001 | Keeth et al. |
| 6,259,234 B1 | 7/2001 | Perol |
| 6,262,558 B1 | 7/2001 | Weinberg |
| 6,268,559 B1 | 7/2001 | Yamawaki |
| 6,274,804 B1 | 8/2001 | Psyk et al. |
| 6,275,016 B1 | 8/2001 | Ivanov |
| 6,281,485 B1 | 8/2001 | Sin |
| 6,285,572 B1 | 9/2001 | Onizuka et al. |
| 6,292,379 B1 | 9/2001 | Edevold et al. |
| 6,297,621 B1 | 10/2001 | Hui et al. |
| 6,301,128 B1 | 10/2001 | Jang et al. |
| 6,304,065 B1 | 10/2001 | Wittenbreder |
| 6,307,749 B1 | 10/2001 | Daanen et al. |
| 6,311,137 B1 | 10/2001 | Kurokami et al. |
| 6,316,716 B1 | 11/2001 | Hilgrath |
| 6,320,769 B2 | 11/2001 | Kurokami et al. |
| 6,329,808 B1 | 12/2001 | Enguent |
| 6,331,670 B2 | 12/2001 | Takehara et al. |
| 6,339,538 B1 | 1/2002 | Handleman |
| 6,344,612 B1 | 2/2002 | Kuwahara et al. |
| 6,346,451 B1 | 2/2002 | Simpson et al. |
| 6,348,781 B1 | 2/2002 | Midya et al. |
| 6,350,944 B1 | 2/2002 | Sherif et al. |
| 6,351,130 B1 | 2/2002 | Preiser et al. |
| 6,369,461 B1 | 4/2002 | Jungreis et al. |
| 6,369,462 B1 | 4/2002 | Siri |
| 6,380,719 B2 | 4/2002 | Underwood et al. |
| 6,396,170 B1 | 5/2002 | Laufenberg et al. |
| 6,396,239 B1 | 5/2002 | Benn et al. |
| 6,400,579 B2 | 6/2002 | Cuk |
| 6,425,248 B1 | 7/2002 | Tonomura et al. |
| 6,429,546 B1 | 8/2002 | Ropp et al. |
| 6,429,621 B1 | 8/2002 | Arai |
| 6,433,522 B1 | 8/2002 | Siri |
| 6,433,978 B1 | 8/2002 | Neiger et al. |
| 6,441,597 B1 | 8/2002 | Lethellier |
| 6,445,599 B1 | 9/2002 | Nguyen |

(56) References Cited

U.S. PATENT DOCUMENTS

| | | |
|---|---|---|
| 6,448,489 B2 | 9/2002 | Kimura et al. |
| 6,452,814 B1 | 9/2002 | Wittenbreder |
| 6,465,910 B2 | 10/2002 | Young et al. |
| 6,465,931 B2 | 10/2002 | Knowles et al. |
| 6,469,919 B1 | 10/2002 | Bennett |
| 6,472,254 B2 | 10/2002 | Cantarini et al. |
| 6,483,203 B1 | 11/2002 | McCormack |
| 6,493,246 B2 | 12/2002 | Suzui et al. |
| 6,501,362 B1 | 12/2002 | Hoffman et al. |
| 6,507,176 B2 | 1/2003 | Wittenbreder, Jr. |
| 6,509,712 B1 | 1/2003 | Landis |
| 6,512,444 B1 | 1/2003 | Morris, Jr. et al. |
| 6,515,215 B1 | 2/2003 | Mimura |
| 6,519,165 B2 | 2/2003 | Koike |
| 6,528,977 B2 | 3/2003 | Arakawa |
| 6,531,848 B1 | 3/2003 | Chitsazan et al. |
| 6,545,211 B1 | 4/2003 | Mimura |
| 6,548,205 B2 | 4/2003 | Leung et al. |
| 6,560,131 B1 | 5/2003 | vonBrethorst |
| 6,587,051 B2 | 7/2003 | Takehara et al. |
| 6,590,793 B1 | 7/2003 | Nagao et al. |
| 6,590,794 B1 | 7/2003 | Carter |
| 6,593,520 B2 | 7/2003 | Kondo et al. |
| 6,593,521 B2 | 7/2003 | Kobayashi |
| 6,600,100 B2 | 7/2003 | Ho et al. |
| 6,603,672 B1 | 8/2003 | Deng et al. |
| 6,608,468 B2 | 8/2003 | Nagase |
| 6,611,130 B2 | 8/2003 | Chang |
| 6,611,441 B2 | 8/2003 | Kurokami et al. |
| 6,628,011 B2 | 9/2003 | Droppo et al. |
| 6,633,824 B2 | 10/2003 | Dollar, II |
| 6,636,431 B2 | 10/2003 | Seki et al. |
| 6,650,031 B1 | 11/2003 | Goldack |
| 6,650,560 B2 | 11/2003 | MacDonald et al. |
| 6,653,549 B2 | 11/2003 | Matsushita et al. |
| 6,655,987 B2 | 12/2003 | Higashikozono et al. |
| 6,657,419 B2 | 12/2003 | Renyolds |
| 6,664,762 B2 | 12/2003 | Kutkut |
| 6,672,018 B2 | 1/2004 | Shingleton |
| 6,678,174 B2 | 1/2004 | Suzui et al. |
| 6,690,590 B2 | 2/2004 | Stamenic et al. |
| 6,693,327 B2 | 2/2004 | Priefert et al. |
| 6,693,781 B1 | 2/2004 | Kroker |
| 6,709,291 B1 | 3/2004 | Wallace et al. |
| 6,724,593 B1 | 4/2004 | Smith |
| 6,731,136 B2 | 5/2004 | Knee |
| 6,738,692 B2 | 5/2004 | Schienbein et al. |
| 6,744,643 B2 | 6/2004 | Luo et al. |
| 6,750,391 B2 | 6/2004 | Bower et al. |
| 6,765,315 B2 | 7/2004 | Hammerstrom et al. |
| 6,768,047 B2 | 7/2004 | Chang et al. |
| 6,768,180 B2 | 7/2004 | Salama et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,800,964 B2 | 10/2004 | Beck |
| 6,801,442 B2 | 10/2004 | Suzui et al. |
| 6,807,069 B2 | 10/2004 | Nieminen et al. |
| 6,809,942 B2 | 10/2004 | Madenokouji et al. |
| 6,810,339 B2 | 10/2004 | Wills |
| 6,812,396 B2 | 11/2004 | Makita et al. |
| 6,828,503 B2 | 12/2004 | Yoshikawa et al. |
| 6,828,901 B2 | 12/2004 | Birchfield et al. |
| 6,837,739 B2 | 1/2005 | Gorringe et al. |
| 6,838,611 B2 | 1/2005 | Kondo et al. |
| 6,838,856 B2 | 1/2005 | Raichle |
| 6,842,354 B1 | 1/2005 | Tallam et al. |
| 6,844,739 B2 | 1/2005 | Kasai et al. |
| 6,850,074 B2 | 2/2005 | Adams et al. |
| 6,856,102 B1 | 2/2005 | Lin et al. |
| 6,882,131 B1 | 4/2005 | Takada et al. |
| 6,888,728 B2 | 5/2005 | Takagi et al. |
| 6,894,911 B2 | 5/2005 | Telefus et al. |
| 6,897,370 B2 | 5/2005 | Kondo et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,933,714 B2 | 8/2005 | Fasshauer et al. |
| 6,936,995 B2 | 8/2005 | Kapsokavathis et al. |
| 6,940,735 B2 | 9/2005 | Deng et al. |
| 6,949,843 B2 | 9/2005 | Dubovsky |
| 6,950,323 B2 | 9/2005 | Achleitner et al. |
| 6,963,147 B2 | 11/2005 | Kurokami et al. |
| 6,966,184 B2 | 11/2005 | Toyomura et al. |
| 6,970,365 B2 | 11/2005 | Turchi |
| 6,980,783 B2 | 12/2005 | Liu et al. |
| 6,984,967 B2 | 1/2006 | Notman |
| 6,984,970 B2 | 1/2006 | Capel |
| 6,987,444 B2 | 1/2006 | Bub et al. |
| 6,996,741 B1 | 2/2006 | Pittelkow et al. |
| 7,030,597 B2 | 4/2006 | Bruno et al. |
| 7,031,176 B2 | 4/2006 | Kotsopoulos et al. |
| 7,038,430 B2 | 5/2006 | Itabashi et al. |
| 7,042,195 B2 | 5/2006 | Tsunetsugu et al. |
| 7,045,991 B2 | 5/2006 | Nakamura et al. |
| 7,046,531 B2 | 5/2006 | Zocchi et al. |
| 7,053,506 B2 | 5/2006 | Alonso et al. |
| 7,061,211 B2 | 6/2006 | Satoh et al. |
| 7,061,214 B2 | 6/2006 | Mayega et al. |
| 7,064,967 B2 | 6/2006 | Ichinose et al. |
| 7,068,017 B2 | 6/2006 | Willner et al. |
| 7,072,194 B2 | 7/2006 | Nayar et al. |
| 7,078,883 B2 | 7/2006 | Chapman et al. |
| 7,079,406 B2 | 7/2006 | Kurokami et al. |
| 7,087,332 B2 | 8/2006 | Harris |
| 7,088,595 B2 | 8/2006 | Nino |
| 7,090,509 B1 | 8/2006 | Gilliland et al. |
| 7,091,707 B2 | 8/2006 | Cutler |
| 7,097,516 B2 | 8/2006 | Werner et al. |
| 7,099,169 B2 | 8/2006 | West et al. |
| 7,126,053 B2 | 10/2006 | Kurokami et al. |
| 7,126,294 B2 | 10/2006 | Minami et al. |
| 7,138,786 B2 | 11/2006 | Ishigaki et al. |
| 7,142,997 B1 | 11/2006 | Widner |
| 7,148,669 B2 | 12/2006 | Maksimovic et al. |
| 7,150,938 B2 | 12/2006 | Munshi et al. |
| 7,158,359 B2 | 1/2007 | Bertele et al. |
| 7,158,395 B2 | 1/2007 | Deng et al. |
| 7,161,082 B2 | 1/2007 | Matsushita et al. |
| 7,174,973 B1 | 2/2007 | Lysaght |
| 7,183,667 B2 | 2/2007 | Colby et al. |
| 7,193,872 B2 | 3/2007 | Siri |
| 7,202,653 B2 | 4/2007 | Pai |
| 7,208,674 B2 | 4/2007 | Aylaian |
| 7,218,541 B2 | 5/2007 | Price et al. |
| 7,248,946 B2 | 7/2007 | Bashaw et al. |
| 7,256,566 B2 | 8/2007 | Bhavaraju et al. |
| 7,259,474 B2 | 8/2007 | Blanc |
| 7,262,979 B2 | 8/2007 | Wai et al. |
| 7,276,886 B2 | 10/2007 | Kinder et al. |
| 7,277,304 B2 | 10/2007 | Stancu et al. |
| 7,281,141 B2 | 10/2007 | Elkayam et al. |
| 7,282,814 B2 | 10/2007 | Jacobs |
| 7,291,036 B1 | 11/2007 | Daily et al. |
| RE39,976 E | 1/2008 | Schiff et al. |
| 7,315,052 B2 | 1/2008 | Alter |
| 7,319,313 B2 | 1/2008 | Dickerson et al. |
| 7,324,361 B2 | 1/2008 | Siri |
| 7,336,004 B2 | 2/2008 | Lai |
| 7,336,056 B1 | 2/2008 | Dening |
| 7,339,287 B2 | 3/2008 | Jepsen et al. |
| 7,348,802 B2 | 3/2008 | Kasanyal et al. |
| 7,352,154 B2 | 4/2008 | Cook |
| 7,361,952 B2 | 4/2008 | Miura et al. |
| 7,371,963 B2 | 5/2008 | Suenaga et al. |
| 7,372,712 B2 | 5/2008 | Stancu et al. |
| 7,385,380 B2 | 6/2008 | Ishigaki et al. |
| 7,385,833 B2 | 6/2008 | Keung |
| 7,388,348 B2 | 6/2008 | Mattichak |
| 7,394,237 B2 | 7/2008 | Chou et al. |
| 7,405,117 B2 | 7/2008 | Zuniga et al. |
| 7,414,870 B2 | 8/2008 | Rottger et al. |
| 7,420,354 B2 | 9/2008 | Cutler |

(56) References Cited

U.S. PATENT DOCUMENTS

| | | |
|---|---|---|
| 7,420,815 B2 | 9/2008 | Love |
| 7,432,691 B2 | 10/2008 | Cutler |
| 7,435,134 B2 | 10/2008 | Lenox |
| 7,435,897 B2 | 10/2008 | Russell |
| 7,443,052 B2 | 10/2008 | Wendt et al. |
| 7,443,152 B2 | 10/2008 | Utsunomiya |
| 7,450,401 B2 | 11/2008 | Iida |
| 7,456,510 B2 | 11/2008 | Ito et al. |
| 7,456,523 B2 | 11/2008 | Kobayashi |
| 7,463,500 B2 | 12/2008 | West |
| 7,466,566 B2 | 12/2008 | Fukumoto |
| 7,471,014 B2 | 12/2008 | Lum et al. |
| 7,471,524 B1 | 12/2008 | Batarseh et al. |
| 7,479,774 B2 | 1/2009 | Wai et al. |
| 7,482,238 B2 | 1/2009 | Sung |
| 7,485,987 B2 | 2/2009 | Mori et al. |
| 7,495,419 B1 | 2/2009 | Ju |
| 7,504,811 B2 | 3/2009 | Watanabe et al. |
| 7,518,346 B2 | 4/2009 | Prexl et al. |
| 7,538,451 B2 | 5/2009 | Nomoto |
| 7,560,915 B2 | 7/2009 | Ito et al. |
| 7,589,437 B2 | 9/2009 | Henne et al. |
| 7,595,616 B2 | 9/2009 | Prexl et al. |
| 7,596,008 B2 | 9/2009 | Iwata et al. |
| 7,599,200 B2 | 10/2009 | Tomonaga |
| 7,600,349 B2 | 10/2009 | Liebendorfer |
| 7,602,080 B1 | 10/2009 | Hadar et al. |
| 7,602,626 B2 | 10/2009 | Iwata et al. |
| 7,605,498 B2 | 10/2009 | Ledenev et al. |
| 7,612,283 B2 | 11/2009 | Toyomura et al. |
| 7,615,981 B2 | 11/2009 | Wong et al. |
| 7,626,834 B2 | 12/2009 | Chisenga et al. |
| 7,646,116 B2 | 1/2010 | Batarseh et al. |
| 7,649,434 B2 | 1/2010 | Xu et al. |
| 7,701,083 B2 | 4/2010 | Savage |
| 7,709,727 B2 | 5/2010 | Roehrig et al. |
| 7,719,140 B2 | 5/2010 | Ledenev et al. |
| 7,723,865 B2 | 5/2010 | Kitanaka |
| 7,733,069 B2 | 6/2010 | Toyomura et al. |
| 7,748,175 B2 | 7/2010 | Liebendorfer |
| 7,759,575 B2 | 7/2010 | Jones et al. |
| 7,763,807 B2 | 7/2010 | Richter |
| 7,772,716 B2 | 8/2010 | Shaver, II et al. |
| 7,780,472 B2 | 8/2010 | Lenox |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,807,919 B2 | 10/2010 | Powell et al. |
| 7,808,125 B1 | 10/2010 | Sachdeva et al. |
| 7,812,592 B2 | 10/2010 | Prior et al. |
| 7,812,701 B2 | 10/2010 | Lee et al. |
| 7,821,225 B2 | 10/2010 | Chou et al. |
| 7,824,189 B1 | 11/2010 | Lauermann et al. |
| 7,839,022 B2 | 11/2010 | Wolfs |
| 7,843,085 B2 | 11/2010 | Ledenev et al. |
| 7,864,497 B2 | 1/2011 | Quardt et al. |
| 7,868,599 B2 | 1/2011 | Rahman et al. |
| 7,880,334 B2 | 2/2011 | Evans et al. |
| 7,883,808 B2 | 2/2011 | Norimatsu et al. |
| 7,884,278 B2 | 2/2011 | Powell et al. |
| 7,893,346 B2 | 2/2011 | Nachamkin et al. |
| 7,898,112 B2 | 3/2011 | Powell et al. |
| 7,900,361 B2 | 3/2011 | Adest et al. |
| 7,906,007 B2 | 3/2011 | Gibson et al. |
| 7,906,870 B2 | 3/2011 | Ohm |
| 7,919,952 B1 | 4/2011 | Fahrenbruch |
| 7,919,953 B2 | 4/2011 | Porter et al. |
| 7,925,552 B2 | 4/2011 | Tarbell et al. |
| 7,944,191 B2 | 5/2011 | Xu |
| 7,945,413 B2 | 5/2011 | Krein |
| 7,948,221 B2 | 5/2011 | Watanabe et al. |
| 7,952,897 B2 | 5/2011 | Nocentini et al. |
| 7,960,650 B2 | 6/2011 | Richter et al. |
| 7,960,950 B2 | 6/2011 | Glovinsky |
| 7,969,133 B2 | 6/2011 | Zhang et al. |
| 8,003,885 B2 | 8/2011 | Richter et al. |
| 8,004,113 B2 | 8/2011 | Sander et al. |
| 8,004,116 B2 | 8/2011 | Ledenev et al. |
| 8,004,117 B2 | 8/2011 | Adest et al. |
| 8,004,866 B2 | 8/2011 | Bucella et al. |
| 8,013,472 B2 | 9/2011 | Adest et al. |
| 8,018,748 B2 | 9/2011 | Leonard |
| 8,035,249 B2 | 10/2011 | Shaver, II et al. |
| 8,039,730 B2 | 10/2011 | Hadar et al. |
| 8,049,363 B2 | 11/2011 | McLean et al. |
| 8,050,804 B2 | 11/2011 | Kernahan |
| 8,058,747 B2 | 11/2011 | Avrutsky et al. |
| 8,058,752 B2 | 11/2011 | Erickson, Jr. et al. |
| 8,067,855 B2 | 11/2011 | Mumtaz et al. |
| 8,077,437 B2 | 12/2011 | Mumtaz et al. |
| 8,080,986 B2 | 12/2011 | Lai et al. |
| 8,089,780 B2 | 1/2012 | Mochikawa et al. |
| 8,089,785 B2 | 1/2012 | Rodriguez |
| 8,090,548 B2 | 1/2012 | Abdennadher et al. |
| 8,093,756 B2 | 1/2012 | Porter et al. |
| 8,093,757 B2 | 1/2012 | Wolfs |
| 8,097,818 B2 | 1/2012 | Gerull et al. |
| 8,098,055 B2 | 1/2012 | Avrutsky et al. |
| 8,102,074 B2 | 1/2012 | Hadar et al. |
| 8,102,144 B2 | 1/2012 | Capp et al. |
| 8,111,052 B2 | 2/2012 | Glovinsky |
| 8,116,103 B2 | 2/2012 | Zacharias et al. |
| 8,138,631 B2 | 3/2012 | Allen et al. |
| 8,138,914 B2 | 3/2012 | Wong et al. |
| 8,139,335 B2 | 3/2012 | Quardt et al. |
| 8,139,382 B2 | 3/2012 | Zhang et al. |
| 8,148,849 B2 | 4/2012 | Zanarini et al. |
| 8,158,877 B2 | 4/2012 | Klein et al. |
| 8,169,252 B2 | 5/2012 | Fahrenbruch et al. |
| 8,179,147 B2 | 5/2012 | Dargatz et al. |
| 8,184,460 B2 | 5/2012 | O'Brien et al. |
| 8,188,610 B2 | 5/2012 | Scholte-Wassink |
| 8,204,709 B2 | 6/2012 | Presher, Jr. et al. |
| 8,212,408 B2 | 7/2012 | Fishman |
| 8,212,409 B2 | 7/2012 | Bettenwort et al. |
| 8,248,804 B2 | 8/2012 | Han et al. |
| 8,271,599 B2 | 9/2012 | Eizips et al. |
| 8,274,172 B2 | 9/2012 | Hadar et al. |
| 8,279,644 B2 | 10/2012 | Zhang et al. |
| 8,289,183 B1 | 10/2012 | Foss |
| 8,289,742 B2 | 10/2012 | Adest et al. |
| 8,294,451 B2 | 10/2012 | Hasenfus |
| 8,304,932 B2 | 11/2012 | Ledenev et al. |
| 8,310,101 B2 | 11/2012 | Amaratunga et al. |
| 8,310,102 B2 | 11/2012 | Raju |
| 8,314,375 B2 | 11/2012 | Arditi et al. |
| 8,324,921 B2 | 12/2012 | Adest et al. |
| 8,325,059 B2 | 12/2012 | Rozenboim |
| 8,344,548 B2 | 1/2013 | Stern |
| 8,369,113 B2 | 2/2013 | Rodriguez |
| 8,378,656 B2 | 2/2013 | de Rooij et al. |
| 8,379,418 B2 | 2/2013 | Falk |
| 8,391,031 B2 | 3/2013 | Garrity |
| 8,391,032 B2 | 3/2013 | Garrity et al. |
| 8,395,366 B2 | 3/2013 | Uno |
| 8,405,248 B2 | 3/2013 | Mumtaz et al. |
| 8,405,349 B2 | 3/2013 | Kikinis et al. |
| 8,405,367 B2 | 3/2013 | Chisenga et al. |
| 8,410,359 B2 | 4/2013 | Richter |
| 8,410,889 B2 | 4/2013 | Garrity et al. |
| 8,410,950 B2 | 4/2013 | Takehara et al. |
| 8,415,552 B2 | 4/2013 | Hadar et al. |
| 8,415,937 B2 | 4/2013 | Hester |
| 8,427,009 B2 | 4/2013 | Shaver, II et al. |
| 8,436,592 B2 | 5/2013 | Saitoh |
| 8,461,809 B2 | 6/2013 | Rodriguez |
| 8,466,789 B2 | 6/2013 | Muhlberger et al. |
| 8,472,220 B2 | 6/2013 | Garrity et al. |
| 8,473,250 B2 | 6/2013 | Adest et al. |
| 8,509,032 B2 | 8/2013 | Rakib |
| 8,526,205 B2 | 9/2013 | Garrity |
| 8,531,055 B2 | 9/2013 | Adest et al. |
| 8,542,512 B2 | 9/2013 | Garrity |

(56) References Cited

U.S. PATENT DOCUMENTS

| | | |
|---|---|---|
| 8,570,017 B2 | 10/2013 | Perichon et al. |
| 8,581,441 B2 | 11/2013 | Rotzoll et al. |
| 8,587,151 B2 | 11/2013 | Adest et al. |
| 8,618,692 B2 | 12/2013 | Adest et al. |
| 8,624,443 B2 | 1/2014 | Mumtaz |
| 8,653,689 B2 | 2/2014 | Rozenboim |
| 8,669,675 B2 | 3/2014 | Capp et al. |
| 8,670,255 B2 | 3/2014 | Gong et al. |
| 8,674,548 B2 | 3/2014 | Mumtaz |
| 8,674,668 B2 | 3/2014 | Chisenga et al. |
| 8,686,333 B2 | 4/2014 | Arditi et al. |
| 8,710,351 B2 | 4/2014 | Robbins |
| 8,751,053 B2 | 6/2014 | Hadar et al. |
| 8,773,236 B2 | 7/2014 | Makhota et al. |
| 8,791,598 B2 | 7/2014 | Jain |
| 8,809,699 B2 | 8/2014 | Funk |
| 8,811,047 B2 | 8/2014 | Rodriguez |
| 8,816,535 B2 | 8/2014 | Adest et al. |
| 8,823,212 B2 | 9/2014 | Garrity et al. |
| 8,823,218 B2 | 9/2014 | Hadar et al. |
| 8,823,342 B2 | 9/2014 | Williams |
| 8,835,748 B2 | 9/2014 | Frolov et al. |
| 8,841,916 B2 | 9/2014 | Avrutsky |
| 8,853,886 B2 | 10/2014 | Avrutsky et al. |
| 8,854,193 B2 | 10/2014 | Makhota et al. |
| 8,859,884 B2 | 10/2014 | Dunton et al. |
| 8,860,241 B2 | 10/2014 | Hadar et al. |
| 8,860,246 B2 | 10/2014 | Hadar et al. |
| 8,878,563 B2 | 11/2014 | Robbins |
| 8,917,156 B2 | 12/2014 | Garrity et al. |
| 8,922,061 B2 | 12/2014 | Arditi |
| 8,933,321 B2 | 1/2015 | Hadar et al. |
| 8,934,269 B2 | 1/2015 | Garrity |
| 8,963,375 B2 | 2/2015 | DeGraaff |
| 8,963,378 B1 | 2/2015 | Fornage et al. |
| 8,972,765 B1 | 3/2015 | Krolak et al. |
| 9,130,401 B2 | 9/2015 | Adest et al. |
| 9,257,848 B2 | 2/2016 | Coccia et al. |
| 9,291,696 B2 | 3/2016 | Adest et al. |
| 9,407,161 B2 | 8/2016 | Adest et al. |
| 9,660,527 B2 | 5/2017 | Glovinski |
| 9,673,630 B2 | 6/2017 | Ledenev et al. |
| 9,819,178 B2 | 11/2017 | Gazit et al. |
| 9,843,193 B2 * | 12/2017 | Getsla .................... H02J 3/383 |
| 9,923,516 B2 * | 3/2018 | Har-Shai ............. H02H 1/0015 |
| 2001/0000957 A1 | 5/2001 | Birchfield et al. |
| 2001/0023703 A1 | 9/2001 | Kondo et al. |
| 2001/0032664 A1 | 10/2001 | Takehara et al. |
| 2001/0034982 A1 | 11/2001 | Nagao et al. |
| 2001/0035180 A1 | 11/2001 | Kimura et al. |
| 2001/0048605 A1 | 12/2001 | Kurokami et al. |
| 2001/0050102 A1 | 12/2001 | Matsumi et al. |
| 2001/0054881 A1 | 12/2001 | Watanabe |
| 2002/0002040 A1 | 1/2002 | Kline et al. |
| 2002/0014262 A1 | 2/2002 | Matsushita et al. |
| 2002/0017900 A1 | 2/2002 | Takeda et al. |
| 2002/0034083 A1 | 3/2002 | Ayyanar et al. |
| 2002/0038667 A1 | 4/2002 | Kondo et al. |
| 2002/0041505 A1 | 4/2002 | Suzui et al. |
| 2002/0044473 A1 | 4/2002 | Toyomura et al. |
| 2002/0047309 A1 | 4/2002 | Droppo et al. |
| 2002/0047693 A1 | 4/2002 | Chang |
| 2002/0056089 A1 | 5/2002 | Houston |
| 2002/0063552 A1 | 5/2002 | Arakawa |
| 2002/0063625 A1 | 5/2002 | Takehara et al. |
| 2002/0078991 A1 | 6/2002 | Nagao et al. |
| 2002/0080027 A1 | 6/2002 | Conley |
| 2002/0085397 A1 | 7/2002 | Suzui et al. |
| 2002/0113689 A1 | 8/2002 | Gehlot et al. |
| 2002/0118559 A1 | 8/2002 | Kurokami et al. |
| 2002/0134567 A1 | 9/2002 | Rasmussen et al. |
| 2002/0148497 A1 | 10/2002 | Sasaoka et al. |
| 2002/0149950 A1 | 10/2002 | Takebayashi |
| 2002/0162585 A1 | 11/2002 | Sugawara et al. |
| 2002/0165458 A1 | 11/2002 | Carter et al. |
| 2002/0177401 A1 | 11/2002 | Judd et al. |
| 2002/0179140 A1 | 12/2002 | Toyomura |
| 2002/0180408 A1 | 12/2002 | McDaniel et al. |
| 2002/0190696 A1 | 12/2002 | Darshan |
| 2003/0002303 A1 | 1/2003 | Riggio et al. |
| 2003/0025594 A1 | 2/2003 | Akiyama et al. |
| 2003/0038615 A1 | 2/2003 | Elbanhawy |
| 2003/0047207 A1 | 3/2003 | Aylaian |
| 2003/0058593 A1 | 3/2003 | Bertele et al. |
| 2003/0058662 A1 | 3/2003 | Baudelot et al. |
| 2003/0066076 A1 | 4/2003 | Minahan |
| 2003/0066555 A1 | 4/2003 | Hui et al. |
| 2003/0075211 A1 | 4/2003 | Makita et al. |
| 2003/0080741 A1 | 5/2003 | Lerow et al. |
| 2003/0085621 A1 | 5/2003 | Potega |
| 2003/0090233 A1 | 5/2003 | Browe |
| 2003/0090246 A1 | 5/2003 | Shenai et al. |
| 2003/0094931 A1 | 5/2003 | Renyolds |
| 2003/0107352 A1 | 6/2003 | Downer et al. |
| 2003/0111103 A1 | 6/2003 | Bower et al. |
| 2003/0116154 A1 | 6/2003 | Butler et al. |
| 2003/0121514 A1 | 7/2003 | Davenport et al. |
| 2003/0140960 A1 | 7/2003 | Baum et al. |
| 2003/0156439 A1 | 8/2003 | Ohmichi et al. |
| 2003/0164695 A1 | 9/2003 | Fasshauer et al. |
| 2003/0185026 A1 | 10/2003 | Matsuda et al. |
| 2003/0193821 A1 | 10/2003 | Krieger et al. |
| 2003/0201674 A1 | 10/2003 | Droppo et al. |
| 2003/0214274 A1 | 11/2003 | Lethellier |
| 2003/0223257 A1 | 12/2003 | Onoe |
| 2004/0004402 A1 | 1/2004 | Kippley |
| 2004/0041548 A1 | 3/2004 | Perry |
| 2004/0056642 A1 | 3/2004 | Nebrigic et al. |
| 2004/0056768 A1 | 3/2004 | Matsushita et al. |
| 2004/0061527 A1 | 4/2004 | Knee |
| 2004/0076028 A1 | 4/2004 | Achleitner et al. |
| 2004/0117676 A1 | 6/2004 | Kobayashi et al. |
| 2004/0118446 A1 | 6/2004 | Toyomura |
| 2004/0123894 A1 | 7/2004 | Erban |
| 2004/0124816 A1 | 7/2004 | DeLepaut |
| 2004/0125618 A1 | 7/2004 | De Rooij et al. |
| 2004/0140719 A1 | 7/2004 | Vulih et al. |
| 2004/0141345 A1 | 7/2004 | Cheng et al. |
| 2004/0144043 A1 | 7/2004 | Stevenson et al. |
| 2004/0150410 A1 | 8/2004 | Schoepf et al. |
| 2004/0164718 A1 | 8/2004 | McDaniel et al. |
| 2004/0165408 A1 | 8/2004 | West et al. |
| 2004/0167676 A1 | 8/2004 | Mizumaki |
| 2004/0169499 A1 | 9/2004 | Huang et al. |
| 2004/0170038 A1 | 9/2004 | Ichinose et al. |
| 2004/0189090 A1 | 9/2004 | Yanagida et al. |
| 2004/0189432 A1 | 9/2004 | Yan et al. |
| 2004/0201279 A1 | 10/2004 | Templeton |
| 2004/0201933 A1 | 10/2004 | Blanc |
| 2004/0207366 A1 | 10/2004 | Sung |
| 2004/0211458 A1 | 10/2004 | Gui et al. |
| 2004/0213169 A1 | 10/2004 | Allard et al. |
| 2004/0223351 A1 | 11/2004 | Kurokami et al. |
| 2004/0230343 A1 | 11/2004 | Zalesski |
| 2004/0233685 A1 | 11/2004 | Matsuo et al. |
| 2004/0246226 A1 | 12/2004 | Moon |
| 2004/0258141 A1 | 12/2004 | Tustison et al. |
| 2004/0262998 A1 | 12/2004 | Kunow et al. |
| 2004/0263183 A1 | 12/2004 | Naidu et al. |
| 2004/0264225 A1 | 12/2004 | Bhavaraju et al. |
| 2005/0002214 A1 | 1/2005 | Deng et al. |
| 2005/0005785 A1 | 1/2005 | Poss et al. |
| 2005/0006958 A1 | 1/2005 | Dubovsky |
| 2005/0017697 A1 | 1/2005 | Capel |
| 2005/0017701 A1 | 1/2005 | Hsu |
| 2005/0030772 A1 | 2/2005 | Phadke |
| 2005/0040800 A1 | 2/2005 | Sutardja |
| 2005/0041442 A1 | 2/2005 | Balakrishnan |
| 2005/0057214 A1 | 3/2005 | Matan |
| 2005/0057215 A1 | 3/2005 | Matan |
| 2005/0068012 A1 | 3/2005 | Cutler |
| 2005/0068820 A1 | 3/2005 | Radosevich et al. |
| 2005/0077879 A1 | 4/2005 | Near |
| 2005/0099138 A1 | 5/2005 | Wilhelm |

(56) References Cited

U.S. PATENT DOCUMENTS

| | | |
|---|---|---|
| 2005/0103376 A1 | 5/2005 | Matsushita et al. |
| 2005/0105224 A1 | 5/2005 | Nishi |
| 2005/0105306 A1 | 5/2005 | Deng et al. |
| 2005/0109386 A1 | 5/2005 | Marshall |
| 2005/0110454 A1 | 5/2005 | Tsai et al. |
| 2005/0121067 A1 | 6/2005 | Toyomura et al. |
| 2005/0135031 A1 | 6/2005 | Colby et al. |
| 2005/0139258 A1 | 6/2005 | Liu et al. |
| 2005/0140335 A1 | 6/2005 | Lee et al. |
| 2005/0162018 A1 | 7/2005 | Realmuto et al. |
| 2005/0163063 A1 | 7/2005 | Kuchler et al. |
| 2005/0172995 A1 | 8/2005 | Rohrig et al. |
| 2005/0179420 A1 | 8/2005 | Satoh et al. |
| 2005/0194937 A1 | 9/2005 | Jacobs |
| 2005/0201397 A1 | 9/2005 | Petite |
| 2005/0213272 A1 | 9/2005 | Kobayashi |
| 2005/0218876 A1 | 10/2005 | Nino |
| 2005/0225090 A1 | 10/2005 | Wobben |
| 2005/0226017 A1 | 10/2005 | Kotsopoulos et al. |
| 2005/0242795 A1 | 11/2005 | Al-Kuran et al. |
| 2005/0257827 A1 | 11/2005 | Gaudiana et al. |
| 2005/0269988 A1 | 12/2005 | Thrap |
| 2005/0275386 A1 | 12/2005 | Jepsen et al. |
| 2005/0275527 A1 | 12/2005 | Kates |
| 2005/0275979 A1 | 12/2005 | Xu |
| 2005/0281064 A1 | 12/2005 | Olsen et al. |
| 2005/0287402 A1 | 12/2005 | Maly et al. |
| 2006/0001406 A1 | 1/2006 | Matan |
| 2006/0017327 A1 | 1/2006 | Sin et al. |
| 2006/0034106 A1 | 2/2006 | Johnson |
| 2006/0038692 A1 | 2/2006 | Schnetker |
| 2006/0043792 A1 | 3/2006 | Hjort et al. |
| 2006/0043942 A1 | 3/2006 | Cohen |
| 2006/0053447 A1 | 3/2006 | Krzyzanowski et al. |
| 2006/0066349 A1 | 3/2006 | Murakami |
| 2006/0068239 A1 | 3/2006 | Norimatsu et al. |
| 2006/0077046 A1 | 4/2006 | Endo |
| 2006/0103360 A9 | 5/2006 | Cutler |
| 2006/0108979 A1 | 5/2006 | Daniel et al. |
| 2006/0109009 A1 | 5/2006 | Banke et al. |
| 2006/0113843 A1 | 6/2006 | Beveridge |
| 2006/0113979 A1 | 6/2006 | Ishigaki et al. |
| 2006/0116968 A1 | 6/2006 | Arisawa |
| 2006/0118162 A1 | 6/2006 | Saelzer et al. |
| 2006/0132102 A1 | 6/2006 | Harvey |
| 2006/0149396 A1 | 7/2006 | Templeton |
| 2006/0152085 A1 | 7/2006 | Flett et al. |
| 2006/0162772 A1 | 7/2006 | Presher et al. |
| 2006/0163946 A1 | 7/2006 | Henne et al. |
| 2006/0164065 A1 | 7/2006 | Hoouk et al. |
| 2006/0171182 A1 | 8/2006 | Siri et al. |
| 2006/0174939 A1 | 8/2006 | Matan |
| 2006/0176029 A1 | 8/2006 | McGinty et al. |
| 2006/0176031 A1 | 8/2006 | Forman et al. |
| 2006/0176036 A1 | 8/2006 | Flatness et al. |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0222916 A1 | 10/2006 | Norimatsu et al. |
| 2006/0225781 A1 | 10/2006 | Locher |
| 2006/0227577 A1 | 10/2006 | Horiuchi et al. |
| 2006/0227578 A1 | 10/2006 | Datta et al. |
| 2006/0231132 A1 | 10/2006 | Neussner |
| 2006/0232220 A1 | 10/2006 | Melis |
| 2006/0235717 A1 | 10/2006 | Sharma et al. |
| 2006/0237058 A1 | 10/2006 | McClintock et al. |
| 2006/0261751 A1 | 11/2006 | Okabe et al. |
| 2006/0266408 A1 | 11/2006 | Horne et al. |
| 2006/0267515 A1 | 11/2006 | Burke et al. |
| 2006/0290317 A1 | 12/2006 | McNulty et al. |
| 2007/0001653 A1 | 1/2007 | Xu |
| 2007/0013349 A1 | 1/2007 | Bassett |
| 2007/0019613 A1 | 1/2007 | Frezzolini |
| 2007/0024257 A1 | 2/2007 | Boldo |
| 2007/0027644 A1 | 2/2007 | Bettenwort et al. |
| 2007/0029636 A1 | 2/2007 | Kanemaru et al. |
| 2007/0030068 A1 | 2/2007 | Motonobu et al. |
| 2007/0035975 A1 | 2/2007 | Dickerson et al. |
| 2007/0040540 A1 | 2/2007 | Cutler |
| 2007/0044837 A1 | 3/2007 | Simburger et al. |
| 2007/0075689 A1 | 4/2007 | Kinder et al. |
| 2007/0075711 A1 | 4/2007 | Blanc et al. |
| 2007/0081364 A1 | 4/2007 | Andreycak |
| 2007/0085523 A1 | 4/2007 | Scoones et al. |
| 2007/0089778 A1 | 4/2007 | Horne et al. |
| 2007/0103108 A1 | 5/2007 | Capp et al. |
| 2007/0107767 A1 | 5/2007 | Hayden et al. |
| 2007/0115635 A1 | 5/2007 | Low et al. |
| 2007/0119718 A1 | 5/2007 | Gibson et al. |
| 2007/0121648 A1 | 5/2007 | Hahn |
| 2007/0133241 A1 | 6/2007 | Mumtaz et al. |
| 2007/0133421 A1 | 6/2007 | Young |
| 2007/0147075 A1 | 6/2007 | Bang |
| 2007/0158185 A1 | 7/2007 | Andelman et al. |
| 2007/0159866 A1 | 7/2007 | Siri |
| 2007/0164612 A1 | 7/2007 | Wendt et al. |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0209656 A1 | 9/2007 | Lee |
| 2007/0211888 A1 | 9/2007 | Corcoran et al. |
| 2007/0227574 A1 | 10/2007 | Cart |
| 2007/0235071 A1 | 10/2007 | Work et al. |
| 2007/0236187 A1 | 10/2007 | Wai et al. |
| 2007/0241720 A1 | 10/2007 | Sakamoto et al. |
| 2007/0246546 A1 | 10/2007 | Yoshida |
| 2007/0247135 A1 | 10/2007 | Koga |
| 2007/0247877 A1 | 10/2007 | Kwon et al. |
| 2007/0271006 A1 | 11/2007 | Golden et al. |
| 2007/0273339 A1 | 11/2007 | Haines |
| 2007/0273342 A1 | 11/2007 | Kataoka et al. |
| 2007/0273351 A1 | 11/2007 | Matan |
| 2007/0284451 A1 | 12/2007 | Uramoto |
| 2007/0290636 A1 | 12/2007 | Beck et al. |
| 2007/0290656 A1 | 12/2007 | Lee Tai Keung |
| 2008/0021707 A1 | 1/2008 | Bou-Ghazale et al. |
| 2008/0023061 A1 | 1/2008 | Clemens et al. |
| 2008/0024098 A1 | 1/2008 | Hojo |
| 2008/0036440 A1 | 2/2008 | Garmer |
| 2008/0055941 A1 | 3/2008 | Victor et al. |
| 2008/0080177 A1 | 4/2008 | Chang |
| 2008/0088184 A1 | 4/2008 | Tung et al. |
| 2008/0089277 A1 | 4/2008 | Alexander et al. |
| 2008/0097655 A1 | 4/2008 | Hadar et al. |
| 2008/0106250 A1 | 5/2008 | Prior et al. |
| 2008/0111529 A1 | 5/2008 | Shah et al. |
| 2008/0115823 A1 | 5/2008 | Kinsey |
| 2008/0121272 A1 | 5/2008 | Besser et al. |
| 2008/0122449 A1 | 5/2008 | Besser et al. |
| 2008/0122518 A1 | 5/2008 | Besser et al. |
| 2008/0136367 A1 | 6/2008 | Adest et al. |
| 2008/0142071 A1 | 6/2008 | Dorn et al. |
| 2008/0143188 A1 | 6/2008 | Adest et al. |
| 2008/0143462 A1 | 6/2008 | Belisle et al. |
| 2008/0144294 A1 | 6/2008 | Adest et al. |
| 2008/0147335 A1 | 6/2008 | Adest et al. |
| 2008/0149167 A1 | 6/2008 | Liu |
| 2008/0150366 A1 | 6/2008 | Adest et al. |
| 2008/0150484 A1 | 6/2008 | Kimball et al. |
| 2008/0164766 A1 | 7/2008 | Adest et al. |
| 2008/0179949 A1 | 7/2008 | Besser et al. |
| 2008/0186004 A1 | 8/2008 | Williams |
| 2008/0191560 A1 | 8/2008 | Besser et al. |
| 2008/0191675 A1 | 8/2008 | Besser et al. |
| 2008/0192519 A1 | 8/2008 | Iwata et al. |
| 2008/0198523 A1 | 8/2008 | Schmidt et al. |
| 2008/0205096 A1 | 8/2008 | Lai et al. |
| 2008/0218152 A1 | 9/2008 | Bo |
| 2008/0224652 A1 | 9/2008 | Zhu et al. |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0238372 A1 | 10/2008 | Cintra et al. |

(56) References Cited

U.S. PATENT DOCUMENTS

| | | |
|---|---|---|
| 2008/0246460 A1 | 10/2008 | Smith |
| 2008/0246463 A1 | 10/2008 | Sinton et al. |
| 2008/0252273 A1 | 10/2008 | Woo et al. |
| 2008/0264470 A1 | 10/2008 | Masuda et al. |
| 2008/0266913 A1 | 10/2008 | Brotto et al. |
| 2008/0266919 A1 | 10/2008 | Mallwitz |
| 2008/0291707 A1 | 11/2008 | Fang |
| 2008/0294472 A1 | 11/2008 | Yamada |
| 2008/0297963 A1 | 12/2008 | Lee et al. |
| 2008/0298608 A1 | 12/2008 | Wilcox |
| 2008/0303503 A1 | 12/2008 | Wolfs |
| 2008/0304296 A1 | 12/2008 | NadimpalliRaju et al. |
| 2008/0304298 A1 | 12/2008 | Toba et al. |
| 2009/0012917 A1 | 1/2009 | Thompson et al. |
| 2009/0014050 A1 | 1/2009 | Haaf |
| 2009/0014057 A1 | 1/2009 | Croft et al. |
| 2009/0014058 A1 | 1/2009 | Croft et al. |
| 2009/0015071 A1 | 1/2009 | Iwata et al. |
| 2009/0020151 A1 | 1/2009 | Fornage |
| 2009/0021877 A1 | 1/2009 | Fornage et al. |
| 2009/0039852 A1 | 2/2009 | Fishelov et al. |
| 2009/0064252 A1 | 3/2009 | Howarter et al. |
| 2009/0066357 A1 | 3/2009 | Fornage |
| 2009/0066399 A1 | 3/2009 | Chen et al. |
| 2009/0069950 A1 | 3/2009 | Kurokami et al. |
| 2009/0073726 A1 | 3/2009 | Babcock |
| 2009/0078300 A1 | 3/2009 | Ang et al. |
| 2009/0080226 A1 | 3/2009 | Fornage |
| 2009/0084570 A1 | 4/2009 | Gherardini et al. |
| 2009/0097172 A1 | 4/2009 | Bremicker et al. |
| 2009/0101191 A1 | 4/2009 | Beck et al. |
| 2009/0102440 A1 | 4/2009 | Coles |
| 2009/0114263 A1 | 5/2009 | Powell et al. |
| 2009/0120485 A1 | 5/2009 | Kikinis |
| 2009/0121549 A1 | 5/2009 | Leonard |
| 2009/0133736 A1 | 5/2009 | Powell et al. |
| 2009/0140715 A1 | 6/2009 | Adest et al. |
| 2009/0141522 A1 | 6/2009 | Adest et al. |
| 2009/0145480 A1 | 6/2009 | Adest et al. |
| 2009/0146667 A1 | 6/2009 | Adest et al. |
| 2009/0146671 A1 | 6/2009 | Gazit |
| 2009/0147554 A1 | 6/2009 | Adest et al. |
| 2009/0150005 A1 | 6/2009 | Hadar et al. |
| 2009/0160258 A1 | 6/2009 | Allen et al. |
| 2009/0179500 A1 | 7/2009 | Ragonese et al. |
| 2009/0179662 A1 | 7/2009 | Moulton et al. |
| 2009/0182532 A1 | 7/2009 | Stoeber et al. |
| 2009/0184746 A1 | 7/2009 | Fahrenbruch |
| 2009/0189456 A1 | 7/2009 | Skull |
| 2009/0190275 A1 | 7/2009 | Gilmore et al. |
| 2009/0195081 A1 | 8/2009 | Quardt et al. |
| 2009/0206666 A1 | 8/2009 | Sella et al. |
| 2009/0207543 A1* | 8/2009 | Boniface ............ H02H 3/16 361/86 |
| 2009/0217965 A1 | 9/2009 | Dougal et al. |
| 2009/0224817 A1 | 9/2009 | Nakamura et al. |
| 2009/0234692 A1 | 9/2009 | Powell et al. |
| 2009/0237042 A1 | 9/2009 | Glovinski |
| 2009/0237043 A1 | 9/2009 | Glovinsky |
| 2009/0242011 A1 | 10/2009 | Proisy et al. |
| 2009/0243547 A1 | 10/2009 | Andelfinger |
| 2009/0273241 A1 | 11/2009 | Gazit et al. |
| 2009/0278496 A1 | 11/2009 | Nakao et al. |
| 2009/0282755 A1 | 11/2009 | Abbott et al. |
| 2009/0283129 A1 | 11/2009 | Foss |
| 2009/0283130 A1 | 11/2009 | Gilmore et al. |
| 2009/0284232 A1 | 11/2009 | Zhang et al. |
| 2009/0284998 A1 | 11/2009 | Zhang et al. |
| 2009/0295225 A1 | 11/2009 | Asplund et al. |
| 2009/0322494 A1 | 12/2009 | Lee |
| 2009/0325003 A1 | 12/2009 | Aberle et al. |
| 2010/0001587 A1 | 1/2010 | Casey et al. |
| 2010/0002349 A1 | 1/2010 | La Scala et al. |
| 2010/0013452 A1 | 1/2010 | Tang et al. |
| 2010/0020576 A1 | 1/2010 | Falk |
| 2010/0026097 A1 | 2/2010 | Avrutsky et al. |
| 2010/0026736 A1 | 2/2010 | Plut |
| 2010/0038907 A1 | 2/2010 | Hunt et al. |
| 2010/0052735 A1 | 3/2010 | Burkland et al. |
| 2010/0057267 A1 | 3/2010 | Liu et al. |
| 2010/0060000 A1 | 3/2010 | Scholte-Wassink |
| 2010/0071742 A1 | 3/2010 | de Rooij et al. |
| 2010/0085670 A1 | 4/2010 | Palaniswami et al. |
| 2010/0115093 A1 | 5/2010 | Rice |
| 2010/0124027 A1 | 5/2010 | Handelsman et al. |
| 2010/0124087 A1 | 5/2010 | Falk |
| 2010/0126550 A1 | 5/2010 | Foss |
| 2010/0127570 A1 | 5/2010 | Hadar et al. |
| 2010/0127571 A1 | 5/2010 | Hadar et al. |
| 2010/0132757 A1 | 6/2010 | He et al. |
| 2010/0132758 A1 | 6/2010 | Gilmore |
| 2010/0132761 A1 | 6/2010 | Echizenya et al. |
| 2010/0133911 A1 | 6/2010 | Williams et al. |
| 2010/0139734 A1 | 6/2010 | Hadar et al. |
| 2010/0139743 A1 | 6/2010 | Hadar et al. |
| 2010/0141041 A1 | 6/2010 | Bose et al. |
| 2010/0141153 A1 | 6/2010 | Recker et al. |
| 2010/0147362 A1 | 6/2010 | King et al. |
| 2010/0154858 A1 | 6/2010 | Jain |
| 2010/0176773 A1 | 7/2010 | Capel |
| 2010/0181957 A1 | 7/2010 | Goeltner |
| 2010/0191383 A1 | 7/2010 | Gaul |
| 2010/0195361 A1 | 8/2010 | Stem |
| 2010/0206378 A1 | 8/2010 | Erickson, Jr. et al. |
| 2010/0207764 A1 | 8/2010 | Muhlberger et al. |
| 2010/0207770 A1 | 8/2010 | Thiemann |
| 2010/0208501 A1 | 8/2010 | Matan et al. |
| 2010/0214808 A1 | 8/2010 | Rodriguez |
| 2010/0217551 A1 | 8/2010 | Goff et al. |
| 2010/0229915 A1 | 9/2010 | Ledenev et al. |
| 2010/0241375 A1 | 9/2010 | Kumar et al. |
| 2010/0244575 A1 | 9/2010 | Coccia et al. |
| 2010/0246223 A1 | 9/2010 | Xuan |
| 2010/0264736 A1 | 10/2010 | Mumtaz et al. |
| 2010/0269430 A1 | 10/2010 | Haddock |
| 2010/0277001 A1 | 11/2010 | Wagoner |
| 2010/0282290 A1 | 11/2010 | Schwarze et al. |
| 2010/0286836 A1 | 11/2010 | Shaver, II et al. |
| 2010/0288327 A1 | 11/2010 | Lisi et al. |
| 2010/0289337 A1 | 11/2010 | Stauth et al. |
| 2010/0294528 A1 | 11/2010 | Sella et al. |
| 2010/0294903 A1 | 11/2010 | Shmukler et al. |
| 2010/0295680 A1 | 11/2010 | Dumps |
| 2010/0297860 A1 | 11/2010 | Shmukler et al. |
| 2010/0301991 A1 | 12/2010 | Sella et al. |
| 2010/0308662 A1 | 12/2010 | Schatz et al. |
| 2010/0309692 A1 | 12/2010 | Chisenga et al. |
| 2010/0321148 A1 | 12/2010 | Gevorkian |
| 2010/0326809 A1 | 12/2010 | Lang et al. |
| 2010/0327657 A1 | 12/2010 | Kuran |
| 2010/0327659 A1 | 12/2010 | Lisi et al. |
| 2010/0332047 A1 | 12/2010 | Arditi et al. |
| 2011/0006743 A1 | 1/2011 | Fabbro |
| 2011/0012430 A1 | 1/2011 | Cheng et al. |
| 2011/0025130 A1 | 2/2011 | Hadar et al. |
| 2011/0031816 A1 | 2/2011 | Buthker et al. |
| 2011/0031946 A1 | 2/2011 | Egan et al. |
| 2011/0037600 A1 | 2/2011 | Takehara et al. |
| 2011/0043172 A1 | 2/2011 | Dearn |
| 2011/0045802 A1 | 2/2011 | Bland et al. |
| 2011/0049990 A1 | 3/2011 | Amaratunga et al. |
| 2011/0050002 A1 | 3/2011 | De Luca |
| 2011/0050190 A1 | 3/2011 | Avrutsky |
| 2011/0056533 A1 | 3/2011 | Kuan |
| 2011/0061705 A1 | 3/2011 | Croft et al. |
| 2011/0061713 A1 | 3/2011 | Powell et al. |
| 2011/0062784 A1 | 3/2011 | Wolfs |
| 2011/0068633 A1 | 3/2011 | Quardt et al. |
| 2011/0079263 A1 | 4/2011 | Avrutsky |
| 2011/0080147 A1 | 4/2011 | Schoenlinner et al. |
| 2011/0083733 A1 | 4/2011 | Marroquin et al. |
| 2011/0084553 A1* | 4/2011 | Adest ................ H02J 1/102 307/63 |
| 2011/0108087 A1 | 5/2011 | Croft et al. |

(56) References Cited

U.S. PATENT DOCUMENTS

| | | |
|---|---|---|
| 2011/0114154 A1 | 5/2011 | Lichy et al. |
| 2011/0115295 A1 | 5/2011 | Moon et al. |
| 2011/0121652 A1 | 5/2011 | Sella et al. |
| 2011/0125431 A1 | 5/2011 | Adest et al. |
| 2011/0132424 A1 | 6/2011 | Rakib |
| 2011/0133552 A1 | 6/2011 | Binder et al. |
| 2011/0139213 A1 | 6/2011 | Lee |
| 2011/0140536 A1 | 6/2011 | Adest et al. |
| 2011/0161722 A1 | 6/2011 | Makhota et al. |
| 2011/0172842 A1 | 7/2011 | Makhota et al. |
| 2011/0173276 A1 | 7/2011 | Eizips et al. |
| 2011/0181251 A1 | 7/2011 | Porter et al. |
| 2011/0181340 A1 | 7/2011 | Gazit |
| 2011/0198935 A1 | 8/2011 | Hinman et al. |
| 2011/0210610 A1 | 9/2011 | Mitsuoka et al. |
| 2011/0210611 A1 | 9/2011 | Ledenev et al. |
| 2011/0210612 A1 | 9/2011 | Leutwein |
| 2011/0218687 A1 | 9/2011 | Hadar et al. |
| 2011/0227411 A1 | 9/2011 | Arditi |
| 2011/0232714 A1 | 9/2011 | Bhavaraju et al. |
| 2011/0240100 A1 | 10/2011 | Lu et al. |
| 2011/0245989 A1 | 10/2011 | Makhota et al. |
| 2011/0246338 A1 | 10/2011 | Eich |
| 2011/0254372 A1 | 10/2011 | Haines et al. |
| 2011/0260866 A1 | 10/2011 | Avrutsky et al. |
| 2011/0267859 A1 | 11/2011 | Chapman |
| 2011/0271611 A1 | 11/2011 | Maracci et al. |
| 2011/0273015 A1 | 11/2011 | Adest et al. |
| 2011/0273016 A1 | 11/2011 | Adest et al. |
| 2011/0273017 A1 | 11/2011 | Borup et al. |
| 2011/0273302 A1 | 11/2011 | Fornage et al. |
| 2011/0278955 A1 | 11/2011 | Signorelli et al. |
| 2011/0285205 A1 | 11/2011 | Ledenev et al. |
| 2011/0290317 A1 | 12/2011 | Naumovitz et al. |
| 2011/0291486 A1 | 12/2011 | Adest et al. |
| 2011/0298288 A1 | 12/2011 | Cho et al. |
| 2011/0301772 A1 | 12/2011 | Zuercher et al. |
| 2011/0304204 A1 | 12/2011 | Avrutsky et al. |
| 2011/0304213 A1 | 12/2011 | Avrutsky et al. |
| 2011/0304215 A1 | 12/2011 | Avrutsky et al. |
| 2011/0316346 A1 | 12/2011 | Porter et al. |
| 2012/0007613 A1 | 1/2012 | Gazit |
| 2012/0019966 A1 | 1/2012 | DeBoer |
| 2012/0026763 A1 | 2/2012 | Humphrey et al. |
| 2012/0026769 A1 | 2/2012 | Schroeder et al. |
| 2012/0032515 A1 | 2/2012 | Ledenev et al. |
| 2012/0033392 A1 | 2/2012 | Golubovic et al. |
| 2012/0033463 A1 | 2/2012 | Rodriguez |
| 2012/0039099 A1 | 2/2012 | Rodriguez |
| 2012/0043818 A1* | 2/2012 | Stratakos ............... H02J 3/383 307/77 |
| 2012/0044014 A1 | 2/2012 | Stratakos et al. |
| 2012/0048325 A1 | 3/2012 | Matsuo et al. |
| 2012/0049627 A1 | 3/2012 | Matsuo et al. |
| 2012/0049801 A1 | 3/2012 | Chang |
| 2012/0056483 A1 | 3/2012 | Capp et al. |
| 2012/0063177 A1 | 3/2012 | Garrity |
| 2012/0080943 A1 | 4/2012 | Phadke |
| 2012/0081009 A1 | 4/2012 | Shteynberg et al. |
| 2012/0081933 A1 | 4/2012 | Garrity |
| 2012/0081934 A1 | 4/2012 | Garrity et al. |
| 2012/0081937 A1 | 4/2012 | Phadke |
| 2012/0087159 A1 | 4/2012 | Chapman et al. |
| 2012/0091810 A1 | 4/2012 | Aiello et al. |
| 2012/0091817 A1 | 4/2012 | Seymour et al. |
| 2012/0098344 A1 | 4/2012 | Bergveld et al. |
| 2012/0104863 A1 | 5/2012 | Yuan |
| 2012/0113554 A1 | 5/2012 | Paoletti et al. |
| 2012/0119584 A1 | 5/2012 | Hadar et al. |
| 2012/0133372 A1 | 5/2012 | Tsai et al. |
| 2012/0138123 A1 | 6/2012 | Newdoll et al. |
| 2012/0139343 A1 | 6/2012 | Adest et al. |
| 2012/0146420 A1 | 6/2012 | Wolfs |
| 2012/0146583 A1 | 6/2012 | Gaul et al. |
| 2012/0161526 A1 | 6/2012 | Huang et al. |
| 2012/0161528 A1 | 6/2012 | Mumtaz et al. |
| 2012/0169124 A1 | 7/2012 | Nakashima et al. |
| 2012/0174961 A1 | 7/2012 | Larson et al. |
| 2012/0175961 A1* | 7/2012 | Har-Shai ............... H02H 7/20 307/80 |
| 2012/0175963 A1 | 7/2012 | Adest et al. |
| 2012/0187769 A1 | 7/2012 | Spannhake et al. |
| 2012/0194003 A1 | 8/2012 | Schmidt et al. |
| 2012/0199172 A1 | 8/2012 | Avrutsky |
| 2012/0212066 A1 | 8/2012 | Adest et al. |
| 2012/0215367 A1 | 8/2012 | Eizips et al. |
| 2012/0217973 A1 | 8/2012 | Avrutsky |
| 2012/0240490 A1 | 9/2012 | Gangemi |
| 2012/0253533 A1 | 10/2012 | Eizips et al. |
| 2012/0253541 A1 | 10/2012 | Arditi et al. |
| 2012/0255591 A1 | 10/2012 | Arditi et al. |
| 2012/0271576 A1* | 10/2012 | Kamel ............... H02J 13/0006 702/62 |
| 2012/0274145 A1 | 11/2012 | Taddeo |
| 2012/0274264 A1 | 11/2012 | Mun et al. |
| 2012/0280571 A1 | 11/2012 | Hargis |
| 2013/0002335 A1 | 1/2013 | DeGraaff |
| 2013/0026839 A1 | 1/2013 | Grana |
| 2013/0026840 A1 | 1/2013 | Arditi et al. |
| 2013/0026842 A1 | 1/2013 | Arditi et al. |
| 2013/0026843 A1 | 1/2013 | Arditi et al. |
| 2013/0038124 A1 | 2/2013 | Newdoll et al. |
| 2013/0049710 A1 | 2/2013 | Kraft et al. |
| 2013/0063119 A1 | 3/2013 | Lubomirsky |
| 2013/0082724 A1 | 4/2013 | Noda et al. |
| 2013/0094262 A1 | 4/2013 | Avrutsky |
| 2013/0134790 A1 | 5/2013 | Amaratunga et al. |
| 2013/0181533 A1 | 7/2013 | Capp et al. |
| 2013/0192657 A1 | 8/2013 | Hadar et al. |
| 2013/0193765 A1 | 8/2013 | Yoscovich |
| 2013/0222144 A1 | 8/2013 | Hadar et al. |
| 2013/0229834 A1 | 9/2013 | Garrity et al. |
| 2013/0229842 A1 | 9/2013 | Garrity |
| 2013/0234518 A1 | 9/2013 | Mumtaz et al. |
| 2013/0235637 A1 | 9/2013 | Rodriguez |
| 2013/0279210 A1 | 10/2013 | Chisenga et al. |
| 2013/0294126 A1 | 11/2013 | Garrity et al. |
| 2013/0307556 A1 | 11/2013 | Ledenev et al. |
| 2013/0313909 A1 | 11/2013 | Storbeck et al. |
| 2013/0320778 A1 | 12/2013 | Hopf et al. |
| 2013/0321013 A1 | 12/2013 | Pisklak et al. |
| 2013/0332093 A1 | 12/2013 | Adest et al. |
| 2013/0335861 A1 | 12/2013 | Laschinski et al. |
| 2014/0077756 A1* | 3/2014 | Kataoka ............... H02J 7/0052 320/107 |
| 2014/0097808 A1 | 4/2014 | Clark et al. |
| 2014/0119076 A1 | 5/2014 | Chang et al. |
| 2014/0167715 A1 | 6/2014 | Wu et al. |
| 2014/0191583 A1 | 7/2014 | Chisenga et al. |
| 2014/0233136 A1 | 8/2014 | Heerdt |
| 2014/0246915 A1 | 9/2014 | Mumtaz |
| 2014/0246927 A1 | 9/2014 | Mumtaz |
| 2014/0252859 A1 | 9/2014 | Chisenga et al. |
| 2014/0265551 A1 | 9/2014 | Willis |
| 2014/0265579 A1 | 9/2014 | Mumtaz |
| 2014/0265629 A1 | 9/2014 | Gazit et al. |
| 2014/0265638 A1 | 9/2014 | Orr et al. |
| 2014/0306543 A1 | 10/2014 | Garrity et al. |
| 2014/0327313 A1 | 11/2014 | Arditi et al. |
| 2015/0022006 A1 | 1/2015 | Garrity et al. |
| 2015/0028683 A1 | 1/2015 | Hadar et al. |
| 2015/0028692 A1 | 1/2015 | Makhota et al. |
| 2015/0188415 A1 | 7/2015 | Abido et al. |
| 2015/0263609 A1 | 9/2015 | Weida et al. |
| 2015/0364918 A1 | 12/2015 | Singh et al. |
| 2015/0381111 A1 | 12/2015 | Nicolescu et al. |
| 2016/0006392 A1* | 1/2016 | Hoft ............... H02S 50/10 361/78 |
| 2016/0036235 A1* | 2/2016 | Getsla ............... H02J 3/383 307/80 |
| 2016/0172900 A1* | 6/2016 | Welch, Jr. ............ H05K 7/1492 307/64 |
| 2016/0211841 A1* | 7/2016 | Harrison ............... H02M 1/44 |
| 2016/0226257 A1 | 8/2016 | Porter et al. |

(56) References Cited

U.S. PATENT DOCUMENTS

| | | | | |
|---|---|---|---|---|
| 2016/0241039 A1* | 8/2016 | Cheng | | H02J 3/383 |
| 2016/0268809 A1 | 9/2016 | Ledenev et al. | | |
| 2016/0276820 A1* | 9/2016 | Olivas | | H02H 1/003 |
| 2016/0336899 A1* | 11/2016 | Ledenev | | G01R 31/025 |
| 2016/0380436 A1 | 12/2016 | Porter et al. | | |
| 2017/0184343 A1* | 6/2017 | Freer | | F25D 11/003 |
| 2017/0271879 A1 | 9/2017 | Ledenev et al. | | |
| 2017/0278375 A1* | 9/2017 | Galin | | H02J 3/387 |
| 2017/0331325 A1* | 11/2017 | Ristau | | H02J 3/14 |

FOREIGN PATENT DOCUMENTS

| | | |
|---|---|---|
| AU | 2012225199 A1 | 10/2013 |
| CA | 1183574 A1 | 3/1985 |
| CA | 2063243 A1 | 12/1991 |
| CA | 2301657 A1 | 3/1999 |
| CA | 2394761 A1 | 6/2001 |
| CA | 2658087 A1 | 6/2001 |
| CA | 2443450 A1 | 3/2005 |
| CA | 2572452 A1 | 1/2006 |
| CA | 2613038 A1 | 1/2007 |
| CA | 2704605 A1 | 5/2009 |
| CA | 2702392 C | 9/2015 |
| CN | 2071396 U | 2/1991 |
| CN | 2305016 Y | 1/1999 |
| CN | 1236213 A | 11/1999 |
| CN | 1244745 A | 2/2000 |
| CN | 1262552 A | 8/2000 |
| CN | 1064487 C | 4/2001 |
| CN | 1309451 A | 8/2001 |
| CN | 1362655 A | 8/2002 |
| CN | 2514538 Y | 10/2002 |
| CN | 1122905 C | 10/2003 |
| CN | 1474492 A | 2/2004 |
| CN | 1523726 A | 8/2004 |
| CN | 1185782 C | 1/2005 |
| CN | 2672938 Y | 1/2005 |
| CN | 1588773 A | 3/2005 |
| CN | 2706955 Y | 6/2005 |
| CN | 1245795 C | 3/2006 |
| CN | 1787717 A | 6/2006 |
| CN | 1838191 A | 9/2006 |
| CN | 1841254 A | 10/2006 |
| CN | 1841823 A | 10/2006 |
| CN | 1892239 A | 1/2007 |
| CN | 1902809 A | 1/2007 |
| CN | 1929276 A | 3/2007 |
| CN | 1930925 A | 3/2007 |
| CN | 1933315 A | 3/2007 |
| CN | 2891438 Y | 4/2007 |
| CN | 101030752 A | 9/2007 |
| CN | 101050770 A | 10/2007 |
| CN | 101107712 A | 1/2008 |
| CN | 100371843 C | 2/2008 |
| CN | 101128974 A | 2/2008 |
| CN | 101136129 A | 3/2008 |
| CN | 101180781 A | 5/2008 |
| CN | 101257221 A | 9/2008 |
| CN | 100426175 C | 10/2008 |
| CN | 201167381 Y | 12/2008 |
| CN | 201203438 Y | 3/2009 |
| CN | 101488271 A | 7/2009 |
| CN | 101521459 A | 9/2009 |
| CN | 101523230 A | 9/2009 |
| CN | 101672252 A | 3/2010 |
| CN | 101697462 A | 4/2010 |
| CN | 101779291 A | 7/2010 |
| CN | 101847939 A | 9/2010 |
| CN | 201601477 U | 10/2010 |
| CN | 201623478 U | 11/2010 |
| CN | 101902051 A | 12/2010 |
| CN | 101904015 A | 12/2010 |
| CN | 201663167 U | 12/2010 |
| CN | 101939660 A | 1/2011 |
| CN | 101951011 A | 1/2011 |
| CN | 101951190 A | 1/2011 |
| CN | 101953051 A | 1/2011 |
| CN | 101953060 A | 1/2011 |
| CN | 101976855 A | 2/2011 |
| CN | 101976952 A | 2/2011 |
| CN | 101980409 A | 2/2011 |
| CN | 102089883 A | 6/2011 |
| CN | 102148584 A | 8/2011 |
| CN | 201926948 U | 8/2011 |
| CN | 201956938 U | 8/2011 |
| CN | 202034903 U | 11/2011 |
| CN | 102273039 A | 12/2011 |
| CN | 202103601 U | 1/2012 |
| CN | 201210007491.3 | 1/2012 |
| CN | 102362550 A | 2/2012 |
| CN | 202178274 U | 3/2012 |
| CN | 102474112 A | 5/2012 |
| CN | 201210334311.2 | 9/2012 |
| CN | 201310004123.8 | 1/2013 |
| CN | 201310035223.7 | 1/2013 |
| CN | 201310066888.4 | 3/2013 |
| CN | 202871823 U | 4/2013 |
| CN | 203367304 U | 12/2013 |
| CN | 2014100950254 | 3/2014 |
| CN | 2014100981549 | 3/2014 |
| CN | 2013800294507 | 12/2014 |
| CN | 2015101756928 | 4/2015 |
| CN | 201510423458.2 | 7/2015 |
| CN | 2015105785864 | 9/2015 |
| CN | 2016104040295 | 6/2016 |
| CN | 2016109468355 | 10/2016 |
| CN | 201611078040.3 | 11/2016 |
| CN | 2017102191346 | 4/2017 |
| CN | 2017103626792 | 5/2017 |
| CN | 2017104145944 | 6/2017 |
| DE | 1161639 B | 1/1964 |
| DE | 3236071 A1 | 1/1984 |
| DE | 3525630 A1 | 1/1987 |
| DE | 3729000 A1 | 3/1989 |
| DE | 4019710 A1 | 1/1992 |
| DE | 4032569 A1 | 4/1992 |
| DE | 4041672 A1 | 6/1992 |
| DE | 4232356 A1 | 3/1994 |
| DE | 4325436 A1 | 2/1995 |
| DE | 4328511 A1 | 3/1995 |
| DE | 19515786 A1 | 11/1995 |
| DE | 19502762 A1 | 8/1996 |
| DE | 19609189 A1 | 9/1997 |
| DE | 19618882 A1 | 11/1997 |
| DE | 19701897 A1 | 7/1998 |
| DE | 19718046 A1 | 11/1998 |
| DE | 19732218 C1 | 3/1999 |
| DE | 19737286 A1 | 3/1999 |
| DE | 19838230 A1 | 2/2000 |
| DE | 19846818 A1 | 4/2000 |
| DE | 19904561 C1 | 8/2000 |
| DE | 19928809 A1 | 1/2001 |
| DE | 019937410 A1 | 2/2001 |
| DE | 19961705 A1 | 7/2001 |
| DE | 10064039 A1 | 12/2001 |
| DE | 10060108 A1 | 6/2002 |
| DE | 10103431 A1 | 8/2002 |
| DE | 10136147 A1 | 2/2003 |
| DE | 10219956 A1 | 4/2003 |
| DE | 10222621 A1 | 11/2003 |
| DE | 202004001246 U1 | 4/2004 |
| DE | 10345302 A1 | 4/2005 |
| DE | 102004043478 A1 | 4/2005 |
| DE | 102004053942 A1 | 5/2006 |
| DE | 102004037446 A1 | 6/2006 |
| DE | 69734495 T2 | 7/2006 |
| DE | 69735169 T2 | 8/2006 |
| DE | 102005012213 A1 | 8/2006 |
| DE | 102005018173 A1 | 10/2006 |
| DE | 20 2005 020161 U1 | 11/2006 |
| DE | 102005036153 A1 | 12/2006 |
| DE | 102005030907 A1 | 1/2007 |
| DE | 102005032864 A1 | 1/2007 |
| DE | 102006023563 A1 | 11/2007 |

(56) References Cited

FOREIGN PATENT DOCUMENTS

| | | |
|---|---|---|
| DE | 102006026073 A1 | 12/2007 |
| DE | 202007002077 U1 | 4/2008 |
| DE | 102006060815 A1 | 6/2008 |
| DE | 102007051134 A1 | 3/2009 |
| DE | 202008012345 U1 | 3/2009 |
| DE | 102007037130 B3 | 4/2009 |
| DE | 102007050031 B3 | 4/2009 |
| DE | 202009007318 U1 | 8/2009 |
| DE | 102008057874 A1 | 5/2010 |
| DE | 102009051186 A1 | 5/2010 |
| DE | 102009022569 A1 | 12/2010 |
| DE | 102010023549 A1 | 12/2011 |
| DE | 102013101314 A1 | 8/2014 |
| DE | 102013106255 A1 | 12/2014 |
| DE | 102013106808 A1 | 12/2014 |
| EP | 0027405 A1 | 4/1981 |
| EP | 169673 A1 | 1/1986 |
| EP | 0178757 A2 | 4/1986 |
| EP | 0206253 A1 | 12/1986 |
| EP | 0231211 A1 | 8/1987 |
| EP | 0293219 A2 | 11/1988 |
| EP | 0340006 A2 | 11/1989 |
| EP | 119093 A2 | 3/1991 |
| EP | 0418612 A1 | 3/1991 |
| EP | 420295 A1 | 4/1991 |
| EP | 0521467 A2 | 1/1993 |
| EP | 0576271 A2 | 12/1993 |
| EP | 0577334 A2 | 1/1994 |
| EP | 604777 A1 | 7/1994 |
| EP | 0628901 A2 | 12/1994 |
| EP | 0642199 A1 | 3/1995 |
| EP | 0670915 A1 | 9/1995 |
| EP | 677749 A2 | 10/1995 |
| EP | 0677749 A3 | 1/1996 |
| EP | 756178 A2 | 1/1997 |
| EP | 0756372 A1 | 1/1997 |
| EP | 0780750 A2 | 6/1997 |
| EP | 3809293 A1 | 11/1997 |
| EP | 824273 A2 | 2/1998 |
| EP | 827254 A2 | 3/1998 |
| EP | 0895146 A1 | 2/1999 |
| EP | 0906660 A1 | 4/1999 |
| EP | 0947905 A2 | 10/1999 |
| EP | 964415 A1 | 12/1999 |
| EP | 964457 A2 | 12/1999 |
| EP | 0978884 A3 | 3/2000 |
| EP | 1012886 A1 | 6/2000 |
| EP | 1024575 A2 | 8/2000 |
| EP | 1034465 A1 | 9/2000 |
| EP | 1035640 A1 | 9/2000 |
| EP | 1039361 A1 | 9/2000 |
| EP | 1039620 A2 | 9/2000 |
| EP | 1039621 A2 | 9/2000 |
| EP | 1047179 A1 | 10/2000 |
| EP | 1130770 A2 | 9/2001 |
| EP | 1143594 A2 | 10/2001 |
| EP | 1187291 A2 | 3/2002 |
| EP | 1235339 A2 | 8/2002 |
| EP | 1239573 A1 | 9/2002 |
| EP | 1239576 A2 | 9/2002 |
| EP | 1254505 A2 | 11/2002 |
| EP | 1271742 A2 | 1/2003 |
| EP | 1291997 A2 | 3/2003 |
| EP | 1330009 A2 | 7/2003 |
| EP | 1339153 A2 | 8/2003 |
| EP | 1369983 A1 | 12/2003 |
| EP | 1376706 A2 | 1/2004 |
| EP | 1388774 A1 | 2/2004 |
| EP | 1400988 A2 | 3/2004 |
| EP | 1407534 A2 | 4/2004 |
| EP | 1120895 A3 | 5/2004 |
| EP | 1418482 A1 | 5/2004 |
| EP | 1429393 A2 | 6/2004 |
| EP | 1442473 A2 | 8/2004 |
| EP | 1447561 A1 | 8/2004 |
| EP | 1457857 A2 | 9/2004 |
| EP | 1463188 A2 | 9/2004 |
| EP | 1475882 A2 | 11/2004 |
| EP | 1503490 A1 | 2/2005 |
| EP | 1521345 A1 | 4/2005 |
| EP | 1526633 A2 | 4/2005 |
| EP | 1531542 A2 | 5/2005 |
| EP | 1531545 A2 | 5/2005 |
| EP | 1532727 A2 | 5/2005 |
| EP | 1552563 A2 | 7/2005 |
| EP | 1562281 A1 | 8/2005 |
| EP | 1580862 A1 | 9/2005 |
| EP | 1603212 A2 | 12/2005 |
| EP | 1610571 A2 | 12/2005 |
| EP | 1623495 A1 | 2/2006 |
| EP | 1642355 A2 | 4/2006 |
| EP | 0964457 A3 | 5/2006 |
| EP | 1657557 A1 | 5/2006 |
| EP | 1657797 A1 | 5/2006 |
| EP | 1691246 A2 | 8/2006 |
| EP | 1706937 A1 | 10/2006 |
| EP | 1708070 A1 | 10/2006 |
| EP | 1716272 A1 | 11/2006 |
| EP | 1728413 A1 | 12/2006 |
| EP | 1734373 A2 | 12/2006 |
| EP | 1750193 A1 | 2/2007 |
| EP | 1766490 A1 | 3/2007 |
| EP | 1782146 A2 | 5/2007 |
| EP | 1785800 A1 | 5/2007 |
| EP | 1842121 A2 | 10/2007 |
| EP | 1887675 A2 | 2/2008 |
| EP | 1901419 A2 | 3/2008 |
| EP | 1902349 A2 | 3/2008 |
| EP | 1911101 A1 | 4/2008 |
| EP | 1914857 A1 | 4/2008 |
| EP | 2048679 A1 | 4/2009 |
| EP | 2061088 A2 | 5/2009 |
| EP | 2092625 A2 | 8/2009 |
| EP | 2092631 A2 | 8/2009 |
| EP | 2130286 A1 | 12/2009 |
| EP | 2135296 A2 | 12/2009 |
| EP | 2135348 A2 | 12/2009 |
| EP | 2144133 A1 | 1/2010 |
| EP | 2206159 A2 | 7/2010 |
| EP | 08856716.9 | 7/2010 |
| EP | 08857835.6 | 7/2010 |
| EP | 2232690 A1 | 9/2010 |
| EP | 2234237 A1 | 9/2010 |
| EP | 09725443.7 | 10/2010 |
| EP | 2249457 A1 | 11/2010 |
| EP | 2256819 A1 | 12/2010 |
| EP | 2315328 A2 | 4/2011 |
| EP | 2355268 A1 | 8/2011 |
| EP | 2374190 A1 | 10/2011 |
| EP | 2386122 A2 | 11/2011 |
| EP | 2393178 A2 | 12/2011 |
| EP | 2395648 A2 | 12/2011 |
| EP | 12150819.6 | 1/2012 |
| EP | 12176089.6 | 7/2012 |
| EP | 12176618.2 | 7/2012 |
| EP | 12177067.1 | 7/2012 |
| EP | 2495766 A1 | 9/2012 |
| EP | 12183811.4 | 9/2012 |
| EP | 2515424 A2 | 10/2012 |
| EP | 12188944.8 | 10/2012 |
| EP | 2533299 A1 | 12/2012 |
| EP | 10740722.3 | 12/2012 |
| EP | 2549635 A1 | 1/2013 |
| EP | 13150911.9 | 1/2013 |
| EP | 13152966.1 | 1/2013 |
| EP | 13152967.9 | 1/2013 |
| EP | 2561596 A2 | 2/2013 |
| EP | 13157876.7 | 3/2013 |
| EP | 2615644 A2 | 7/2013 |
| EP | 2621045 A2 | 7/2013 |
| EP | 12707899.6 | 8/2013 |
| EP | 2666222 A1 | 11/2013 |
| EP | 14151651.8 | 1/2014 |
| EP | 14159457.2 | 3/2014 |

(56) References Cited

FOREIGN PATENT DOCUMENTS

| | | |
|---|---|---|
| EP | 14159696.5 | 3/2014 |
| EP | 2722979 A1 | 4/2014 |
| EP | 2779251 A1 | 9/2014 |
| EP | 13800859.4 | 12/2014 |
| EP | 15183689.7 | 9/2015 |
| EP | 17171489.2 | 5/2016 |
| EP | 16183846.1 | 8/2016 |
| EP | 17165027.8 | 4/2017 |
| EP | 3176933 A1 | 6/2017 |
| ES | 2249147 A1 | 3/2006 |
| ES | 2249149 A1 | 3/2006 |
| FR | 2796216 A1 | 1/2001 |
| FR | 2819653 A1 | 7/2002 |
| FR | 2894401 A1 | 6/2007 |
| GB | 310362 A | 9/1929 |
| GB | 612859 A | 11/1948 |
| GB | 1211885 A | 11/1970 |
| GB | 1231961 A | 5/1971 |
| GB | 1261838 A | 1/1972 |
| GB | 1571681 A | 7/1980 |
| GB | 1597508 A | 9/1981 |
| GB | 2128017 A | 4/1984 |
| GB | 2327208 A | 1/1999 |
| GB | 2339465 A | 1/2000 |
| GB | 2376801 A | 12/2002 |
| GB | 2399463 A | 9/2004 |
| GB | 2399465 A | 9/2004 |
| GB | 2415841 A | 1/2006 |
| GB | 2419968 A | 5/2006 |
| GB | 2421847 A | 7/2006 |
| GB | 2434490 A | 7/2007 |
| GB | 1109618.7 | 12/2008 |
| GB | 2476508 A | 6/2011 |
| GB | 2480015 A | 11/2011 |
| GB | 2480015 B | 11/2011 |
| GB | 2482653 A | 2/2012 |
| GB | 2483317 A | 3/2012 |
| GB | 2485527 A | 5/2012 |
| GB | 2486408 A | 6/2012 |
| GB | 2487368 A | 7/2012 |
| GB | 2497275 A | 6/2013 |
| GB | 2498365 A | 7/2013 |
| GB | 2498790 A | 7/2013 |
| GB | 2498791 A | 7/2013 |
| GB | 2499991 A | 9/2013 |
| JP | S56042365 A | 4/1981 |
| JP | S60027964 A | 2/1985 |
| JP | S60148172 A | 8/1985 |
| JP | 61065320 A | 4/1986 |
| JP | S62154121 A | 7/1987 |
| JP | H01311874 A | 12/1989 |
| JP | H04219982 A | 8/1992 |
| JP | H04364378 A | 12/1992 |
| JP | H05003678 A | 1/1993 |
| JP | H06035555 A | 2/1994 |
| JP | H06141261 A | 5/1994 |
| JP | H07026849 A | 1/1995 |
| JP | H07058843 A | 3/1995 |
| JP | H07-222436 A | 8/1995 |
| JP | 8009557 A | 1/1996 |
| JP | H08033347 A | 2/1996 |
| JP | H08066050 A | 3/1996 |
| JP | H0897460 A | 4/1996 |
| JP | H08116628 A | 5/1996 |
| JP | H08181343 A | 7/1996 |
| JP | H08185235 A | 7/1996 |
| JP | H08204220 A | 8/1996 |
| JP | H08227324 A | 9/1996 |
| JP | H08316517 A | 11/1996 |
| JP | H08317664 A | 11/1996 |
| JP | H094692 A | 1/1997 |
| JP | H09097918 A | 4/1997 |
| JP | H09148611 A | 6/1997 |
| JP | H09148613 A | 6/1997 |
| JP | H09275644 A | 10/1997 |
| JP | 2676789 B2 | 11/1997 |
| JP | H1017445 A | 1/1998 |
| JP | H1075580 A | 3/1998 |
| JP | H10201086A A | 7/1998 |
| JP | H10308523 A | 11/1998 |
| JP | 11041832 A | 2/1999 |
| JP | H1146457 A | 2/1999 |
| JP | 11103538 A | 4/1999 |
| JP | 2892183 B2 | 5/1999 |
| JP | 11206038 A | 7/1999 |
| JP | H11266545 A | 9/1999 |
| JP | 11289891 A | 10/1999 |
| JP | 11318042 A | 11/1999 |
| JP | 2000020150 A | 1/2000 |
| JP | 3015512 B2 | 3/2000 |
| JP | 2000160789 A | 6/2000 |
| JP | 2000166097 A | 6/2000 |
| JP | 2000174307 A | 6/2000 |
| JP | 2000232791 A | 8/2000 |
| JP | 2000232793 A | 8/2000 |
| JP | 2000316282 A | 11/2000 |
| JP | 2000324852 A | 11/2000 |
| JP | 2000339044 A | 12/2000 |
| JP | 2000341974 A | 12/2000 |
| JP | 2000347753 A | 12/2000 |
| JP | 2000358330 A | 12/2000 |
| JP | 2001060120 A | 3/2001 |
| JP | 2001075662 A | 3/2001 |
| JP | 2001086765 A | 3/2001 |
| JP | 2001178145 A | 6/2001 |
| JP | 2001189476 A | 7/2001 |
| JP | 2001224142 A | 8/2001 |
| JP | 2001250964 A | 9/2001 |
| JP | 2002073184 A | 3/2002 |
| JP | 2002231578 A | 8/2002 |
| JP | 2002238246 A | 8/2002 |
| JP | 2002270876 A | 9/2002 |
| JP | 2002300735 A | 10/2002 |
| JP | 2002339591 A | 11/2002 |
| JP | 2002354677 A | 12/2002 |
| JP | 2003102134A A | 4/2003 |
| JP | 2003124492 A | 4/2003 |
| JP | 2003134661 A | 5/2003 |
| JP | 2003134667 A | 5/2003 |
| JP | 2003282916 A | 10/2003 |
| JP | 2003289674 A | 10/2003 |
| JP | 3499941 B2 | 2/2004 |
| JP | 2004055603 A | 2/2004 |
| JP | 2004111754 A | 4/2004 |
| JP | 2004194500 A | 7/2004 |
| JP | 2004260944 A | 9/2004 |
| JP | 2004312994 A | 11/2004 |
| JP | 2004334704 A | 11/2004 |
| JP | 3656531 B2 | 6/2005 |
| JP | 2005192314 A | 7/2005 |
| JP | 2005-235082 A | 9/2005 |
| JP | 2005251039 A | 9/2005 |
| JP | 2006041440 A | 2/2006 |
| JP | 2006262619 A | 9/2006 |
| JP | 2006278755 A | 10/2006 |
| JP | 2007058845 A | 3/2007 |
| JP | 2007104872 A | 4/2007 |
| JP | 2007225625 A | 9/2007 |
| JP | 4174227H B2 | 10/2008 |
| JP | 2010-537134 | 5/2010 |
| JP | 2010-146047 A | 7/2010 |
| JP | 2010245532 A | 10/2010 |
| JP | 2011-249790 A | 12/2011 |
| JP | 2012-60714 A | 3/2012 |
| JP | 2012511299 A | 5/2012 |
| JP | 2012178535 A | 9/2012 |
| KR | 20010044490 A | 6/2001 |
| KR | 20040086088 A | 10/2004 |
| KR | 100468127 B1 | 1/2005 |
| KR | 200402282 Y1 | 11/2005 |
| KR | 20060060825 A | 6/2006 |
| KR | 20070036528 A | 4/2007 |
| KR | 100725755 B1 | 5/2007 |
| KR | 20080092747 A | 10/2008 |

(56) References Cited

FOREIGN PATENT DOCUMENTS

| | | |
|---|---|---|
| KR | 100912892 B1 | 8/2009 |
| KR | 101073143 B1 | 10/2011 |
| NL | 1011483 C2 | 9/2000 |
| TW | 497326 B | 8/2002 |
| TW | 200913291 A | 3/2009 |
| WO | 8202134 A1 | 6/1982 |
| WO | 1982002134 A1 | 6/1982 |
| WO | 1984003402 A1 | 8/1984 |
| WO | 1988004801 A1 | 6/1988 |
| WO | 9003680 A1 | 4/1990 |
| WO | 1992007418 A1 | 4/1992 |
| WO | 1993013587 A1 | 7/1993 |
| WO | 95/25374 A1 | 9/1995 |
| WO | 95/34121 A1 | 12/1995 |
| WO | 1996007130 A1 | 3/1996 |
| WO | 1996013093 A1 | 5/1996 |
| WO | 1998023021 A2 | 5/1998 |
| WO | 1999028801 A1 | 6/1999 |
| WO | 00/00839 A1 | 1/2000 |
| WO | 00/21178 A1 | 4/2000 |
| WO | 0075947 A1 | 12/2000 |
| WO | 0077522 A1 | 12/2000 |
| WO | 01/13502 A1 | 2/2001 |
| WO | 01047095 A2 | 6/2001 |
| WO | 02/17469 A1 | 2/2002 |
| WO | 0231517 | 4/2002 |
| WO | 02056126 A1 | 7/2002 |
| WO | 2002073785 A1 | 9/2002 |
| WO | 0278164 A1 | 10/2002 |
| WO | 02078164 A1 | 10/2002 |
| WO | 02093655 A1 | 11/2002 |
| WO | 03012569 A1 | 2/2003 |
| WO | 2003012569 | 2/2003 |
| WO | 03/026114 A2 | 3/2003 |
| WO | 2003036688 A2 | 5/2003 |
| WO | 2003050938 A2 | 6/2003 |
| WO | 2003071655 A1 | 8/2003 |
| WO | 03084041 A1 | 10/2003 |
| WO | 2003098703 | 11/2003 |
| WO | 2004001942 A1 | 12/2003 |
| WO | 2004006342 A1 | 1/2004 |
| WO | 2004008619 A2 | 1/2004 |
| WO | 2004023278 A2 | 3/2004 |
| WO | 2004053993 A1 | 6/2004 |
| WO | 2004090993 A2 | 10/2004 |
| WO | 2004098261 A2 | 11/2004 |
| WO | 2004100344 A2 | 11/2004 |
| WO | 2004100348 A1 | 11/2004 |
| WO | 2004107543 A2 | 12/2004 |
| WO | 2005015584 A2 | 2/2005 |
| WO | 2005027300 A1 | 3/2005 |
| WO | 2005036725 A1 | 4/2005 |
| WO | 2005053189 A1 | 6/2005 |
| WO | 2005069096 A1 | 7/2005 |
| WO | 2005076444 A1 | 8/2005 |
| WO | 2005076445 A1 | 8/2005 |
| WO | 2005089030 A1 | 9/2005 |
| WO | 2005112551 A2 | 12/2005 |
| WO | 2005119278 A1 | 12/2005 |
| WO | 2005119609 A2 | 12/2005 |
| WO | 2005124498 A1 | 12/2005 |
| WO | 2006002380 A2 | 1/2006 |
| WO | 2006005125 A1 | 1/2006 |
| WO | 2006007198 A1 | 1/2006 |
| WO | 2006011071 A2 | 2/2006 |
| WO | 2006011359 A1 | 2/2006 |
| WO | 2006013600 A2 | 2/2006 |
| WO | 2006/013600 A3 | 5/2006 |
| WO | 2006048688 A1 | 5/2006 |
| WO | 2006048689 A2 | 5/2006 |
| WO | 2006/074561 A1 | 7/2006 |
| WO | 2006071436 A2 | 7/2006 |
| WO | 2006078685 A2 | 7/2006 |
| WO | 2006079503 A2 | 8/2006 |
| WO | 2006089778 A2 | 8/2006 |
| WO | 2006110613 A2 | 10/2006 |
| WO | 2006/125664 A1 | 11/2006 |
| WO | 2006117551 A2 | 11/2006 |
| WO | 2006130520 A2 | 12/2006 |
| WO | 2006137948 A2 | 12/2006 |
| WO | 2007006564 A2 | 1/2007 |
| WO | 2007007360 A2 | 1/2007 |
| WO | 2007010326 A1 | 1/2007 |
| WO | 2007/020419 A1 | 2/2007 |
| WO | 2007048421 A2 | 5/2007 |
| WO | 2007072517 A1 | 6/2007 |
| WO | 2007073951 A1 | 7/2007 |
| WO | 2007080429 A2 | 7/2007 |
| WO | 2007084196 A2 | 7/2007 |
| WO | 2007090476 A2 | 8/2007 |
| WO | 2007113358 A1 | 10/2007 |
| WO | 2007124518 A1 | 11/2007 |
| WO | 2007142693 A2 | 12/2007 |
| WO | 2008008528 A2 | 1/2008 |
| WO | 2008026207 A2 | 3/2008 |
| WO | 2008/046370 A1 | 4/2008 |
| WO | 2008077473 A2 | 7/2008 |
| WO | 2008069926 A3 | 8/2008 |
| WO | 2008097591 A2 | 8/2008 |
| WO | 2008119034 A1 | 10/2008 |
| WO | 2008121266 A2 | 10/2008 |
| WO | 2008125915 A2 | 10/2008 |
| WO | 2008132551 A2 | 11/2008 |
| WO | 2008132553 A2 | 11/2008 |
| WO | 2008142480 A2 | 11/2008 |
| WO | 2009003680 A1 | 1/2009 |
| WO | 2009006879 A2 | 1/2009 |
| WO | 2009007782 A2 | 1/2009 |
| WO | 2009011780 A2 | 1/2009 |
| WO | 2009020917 A2 | 2/2009 |
| WO | 2009/026602 A1 | 3/2009 |
| WO | 2009007782 A3 | 3/2009 |
| WO | 2009046533 A1 | 4/2009 |
| WO | 2009051221 A1 | 4/2009 |
| WO | 2009051222 A1 | 4/2009 |
| WO | 2009051853 A1 | 4/2009 |
| WO | 2009051854 A1 | 4/2009 |
| WO | 2009051870 A1 | 4/2009 |
| WO | 2009055474 A1 | 4/2009 |
| WO | 2009/059877 A1 | 5/2009 |
| WO | 2009056957 A2 | 5/2009 |
| WO | 2009059028 A2 | 5/2009 |
| WO | 2009064683 A2 | 5/2009 |
| WO | 2009/072075 A2 | 6/2009 |
| WO | 2009/073867 A1 | 6/2009 |
| WO | 2009072076 A2 | 6/2009 |
| WO | 2009072077 A1 | 6/2009 |
| WO | 2009073995 A1 | 6/2009 |
| WO | 2009075985 A2 | 6/2009 |
| WO | 2009/075985 A3 | 7/2009 |
| WO | 2009114341 A2 | 9/2009 |
| WO | 2009118682 A2 | 10/2009 |
| WO | 2009118683 A2 | 10/2009 |
| WO | 2009073868 A1 | 11/2009 |
| WO | 2009118683 A3 | 11/2009 |
| WO | 2009136358 A1 | 11/2009 |
| WO | 2009140536 A2 | 11/2009 |
| WO | 2009140539 A2 | 11/2009 |
| WO | 2009140543 A2 | 11/2009 |
| WO | 2009140551 A2 | 11/2009 |
| WO | 2009118682 A3 | 12/2009 |
| WO | 2009155392 A1 | 12/2009 |
| WO | 2010/002960 A1 | 1/2010 |
| WO | 2010/003941 A2 | 1/2010 |
| WO | 2009136358 A4 | 1/2010 |
| WO | 2009/140536 A3 | 2/2010 |
| WO | 2009/140543 A3 | 2/2010 |
| WO | 2009/140551 A3 | 2/2010 |
| WO | 2010014116 A1 | 2/2010 |
| WO | 2010020385 A2 | 2/2010 |
| WO | 2010/042124 A1 | 4/2010 |
| WO | 2010037393 A1 | 4/2010 |
| WO | 2010/071855 A2 | 6/2010 |
| WO | 2010062410 A1 | 6/2010 |

(56) References Cited

FOREIGN PATENT DOCUMENTS

| WO | 2010062662 A2 | 6/2010 |
|---|---|---|
| WO | 2010065043 A1 | 6/2010 |
| WO | 2010065388 A1 | 6/2010 |
| WO | 2010072717 A1 | 7/2010 |
| WO | 2010078303 A2 | 7/2010 |
| WO | 2010080672 A2 | 7/2010 |
| WO | 2010091025 A2 | 8/2010 |
| WO | 2010094012 A1 | 8/2010 |
| WO | 2010118503 A1 | 10/2010 |
| WO | 2010120315 A1 | 10/2010 |
| WO | 2010/132369 A1 | 11/2010 |
| WO | 2010134057 A1 | 11/2010 |
| WO | 20100134057 A1 | 11/2010 |
| WO | 2011005339 A1 | 1/2011 |
| WO | 2011011711 A2 | 1/2011 |
| WO | 2011014275 A1 | 2/2011 |
| WO | 2011017721 A1 | 2/2011 |
| WO | 2011019936 A1 | 2/2011 |
| WO | 2011023732 A2 | 3/2011 |
| WO | 2011028456 A2 | 3/2011 |
| WO | 2011028457 A2 | 3/2011 |
| WO | 2011044641 A1 | 4/2011 |
| WO | 2011049985 A1 | 4/2011 |
| WO | 2011059067 A1 | 5/2011 |
| WO | 2011074025 A1 | 6/2011 |
| WO | 2011076707 A2 | 6/2011 |
| WO | 2011085259 A2 | 7/2011 |
| WO | 2011089607 A1 | 7/2011 |
| WO | 2011119587 A2 | 9/2011 |
| WO | 2011133843 A2 | 10/2011 |
| WO | 2011133928 A2 | 10/2011 |
| WO | 2011151672 A1 | 12/2011 |
| WO | 2012024538 A3 | 5/2012 |
| WO | 2012100263 A2 | 7/2012 |
| WO | 2013015921 A1 | 1/2013 |
| WO | 1998023021 A | 7/2013 |
| WO | 2013130563 A1 | 9/2013 |
| WO | 2014143021 A1 | 9/2014 |
| WO | WO PCT/US17/31571 | 5/2017 |
| WO | 2017/125375 A1 | 7/2017 |

OTHER PUBLICATIONS

Zhou, Wilson and Theo Phillips—"Industry's First 4-Switch Buck-Boost Controller Achieves Highest Efficiency Using a Single Inductor—Design Note 369"—Linear Technology Corporation—www.linear.com—2005.

"Micropower Synchronous Buck-Boost DC/DC Converter"—Linear Technology Corporation—www.linear.com/LTC3440—2001.

Caricchi, F. et al—20 kW Water-Cooled Prototype of a Buck-Boost Bidirectional DC-DC Converter Topology for Electrical Vehicle Motor Drives—University of Rome—IEEE 1995—pp. 887-892.

Roy, Arunanshu et al—"Battery Charger using Bicycle"—EE318 Electronic Design Lab Project Report, EE Dept, IIT Bombay, Apr. 2006.

Viswanathan, K et al—Dual-Mode Control of Cascade Buck-Boost PFC Converter—35th Annual IEEE Power Electronics Specialists Conference—Aachen, Germany, 2004.

Zhang, Pei et al.—"Hardware Design Experiences in ZebraNet"—Department of Electrical Engineering, Princeton University—SenSys '04, Nov. 3-5, 2004.

"High Efficiency, Synchronous, 4-Switch Buck-Boost Controller"—Linear Technology Corporation—www.linear.com/LTC3780—2005.

Chomsuwan, Komkrit et al. "Photovoltaic Grid-Connected Inverter Using Two-Switch Buck-Boost Converter"—Department of Electrical Engineering, King Mongkut's Institute of Technology Ladkrabang, Thailand, National Science and Technology Development Agency, Thailand—IEEE—2002.

Midya, Pallab et al.—"Buck or Boost Tracking Power Converter"—IEEE Power Electronics Letters, vol. 2, No. 4—Dec. 2004.

Chinese Office Action—CN Appl. 201510111948.9—dated Sep. 14, 2016.

Chinese Office Action—CN Appl. 201310066888.4—dated Nov. 2, 2016.

"Power-Switching Converters—the Principle, Simulation and Design of the Switching Power (the Second Edition)", Ang, Oliva, et al., translated by Xu Dehong, et al., China Machine Press, Aug. 2010, earlier publication 2005.

European Notice of Opposition—EP Patent 2092625—dated Nov 29, 2016.

Vishay Siliconix "Si 7884DP—n-Channel 40-V (D-S) MOSFET" (2003).

QT Technical Application Papers, "ABB Circuit-Breakers for Direct current Applications", ABB SACE S.p. A., An ABB Group Company, L.V. Breakers, Via Baioni, 35, 24123 Bergamo-Italy, Tel.: +39 035.395.111—Telefax: +39 035.395.306-433, Sep. 2007.

Woyte, et al., "Mains Monitoring and Protection in a European Context", 17th European Photovoltaic Solar Energy Conference and Exhibition, Munich, Germany, Oct. 22-26, 2001, Achim, Woyte, et al., pp. 1-4.

"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.

Fairchild Semiconductor, Application Note 9016, IGBT Basics 1, by K.S. OH Feb. 1, 2001.

"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.

Walker, "A DC Circuit Breaker for an Electric Vehicle Battery Pack", Australasian Universities Power Engineering Conference and IEAust Electric Energy Conference, Sep. 26-29, 1999.

Combined Search and Examination Report for GB1018872.0 dated Apr. 15, 2011, 2 pages.

International Search Report and Opinion of International Patent Application PCT/2009/051221, dated Oct. 19, 2009.

International Search Report and Opinion of International Patent Application PCT/2009/051222, dated Oct. 7, 2009.

Communication in EP07874025.5 dated Aug. 17, 2011.

IPRP for PCT/IB2008/055095 dated Jun. 8, 2010, with Written Opinion.

ISR for PCT/IB2008/055095 dated Apr. 30, 2009.

ISR for PCT/IL07/01064 dated Mar. 25, 2008.

IPRP for PCT/IB2007/004584 dated Jun. 10, 2009, with Written Opinion.

IPRP for PCT/IB2007/004591 dated Jul. 13, 2010, with Written Opinion.

IPRP for PCT/IB2007/004643 dated Jun. 10, 2009, with Written Opinion.

Written Opinion for PCT/IB2008/055092 submitted with IPRP dated Jun. 8, 2010.

IPRP for PCT/US2008/085754 dated Jun. 8, 2010, with Written Opinion dated Jan. 21, 2009.

IPRP for PCT/US2008/085755 dated Jun. 8, 2010, with Written Opinion dated Jan. 20, 2009.

IPRP for PCT/IB2009/051221 dated Sep. 28, 2010, with Written Opinion.

IPRP for PCT/IB2009/051222 dated Sep. 28, 2010, with Written Opinion.

IPRP for PCT/IB2009/051831 dated Nov. 9, 2010, with Written Opinion.

IPRP for PCT/US2008/085736 dated Jun. 7, 2011, with Written Opinion.

IPRP for PCT/IB2010/052287 dated Nov. 22, 2011, with Written Opinion.

ISR for PCT/IB2010/052413 dated Sep. 7, 2010.

UK Intellectual Property Office, Application No. GB1109618.7, Patents Act 1977, Examination Report 18(3), dated Sep. 16, 2011.

UK Intellectual Property Office, Patents Act 1977: Patents Rules Notification of Grant: Patent Serial No. GB2480015, Nov. 29, 2011.

(56) References Cited

OTHER PUBLICATIONS

Walker, et al. "PV String Per-Module Maximum Power Point Enabling Converters", School of Information Technology and Electrical Engineering The University of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. CAIRNS, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.
IPRP for PCT/IL2007/001064 dated Mar. 17, 2009, with Written Opinion dated Mar. 25, 2008.
IPRP for PCT/IB2007/004586 dated Jun. 10, 2009, with Written Opinion.
Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.
IPRP PCT/IB2007/004610—date of issue Jun. 10, 2009.
Extended European Search Report—EP12176089.6—dated Nov. 8, 2012.
Gwon-Jong Yu et al: "Maximum power point tracking with temperature compensation of photovoltaic for air aonditioning system with fuzzy controller", May 13, 1996; May 13, 1996-May 17, 1996, May 13, 1996 ( May 13, 1996), pp. 1429-1432, XP010208423.
Extended European Search Report—EP12177067.1—dated Dec. 7, 2012.
GB Combined Search and Examination Report—GB1200423.0—dated Apr. 30, 2012.
GB Combined Search and Examination Report—GB1201499.9—dated May 28, 2012.
GB Combined Search and Examination Report—GB1201506.1—dated May 22, 2012.
"Study of Energy Storage Capacitor Reduction for Single Phase PWM Rectifier", Ruxi Wang et al., Virginia Polytechnic Institute and State University, Feb. 2009.
"Multilevel Inverters: A Survey of Topologies, Controls, and Applications", José Rodriguez et al., IEEE Transactions on Industrial Electronics, vol. 49, No. 4, Aug. 2002.
Extended European Search Report—EP 08878650.4—dated Mar. 28, 2013.
Satcon Solstice—Satcon Solstice 100 kW System Solution Sheet—2010.
John Xue, "PV Module Series String Balancing Converters", University of Queensland—School of Information Technology & Electrical Engineering, Nov. 6, 2002.

Robert W. Erickson, "Future of Power Electronics for Photovoltaics", IEEE Applied Power Electronics Conference, Feb. 2009.
Ciobotaru, et al., Control of single-stage single-phase PV inverter, Aug. 7, 2006.
International Search Report and Written Opinion for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.
Chen, et al., "A New Low-Stress Buck-Boost Converter for Universal-Input PFC Applications", IEEE Applied Power Electronics Conference, Feb. 2001, Colorado Power Electronics Center Publications.
Chen, et al., "Buck-Boost PWM Converters Having Two Independently Controlled Switches", IEEE Power Electronics Specialists Conference, Jun. 2001, Colorado Power Electronics Center Publications.
Esram, et al., "Comparison of Photovoltaic Array Maximum Power Point Tracking Techniques", IEEE Transactions on Energy Conversion, vol. 22, No. 2, Jun. 2007, pp. 439-449.
Walker, et al., "Photovoltaic DC-DC Module Integrated Converter for Novel Cascaded and Bypass Grid Connection Topologies-Design and Optimisation", 37th IEEE Power Electronics Specialists Conference, Jun. 18-22, 2006, Jeju, Korea.
Geoffrey R. Walker Affidavit re: U.S. Appl. No. 11/950,307, submitted in an IDS for U.S. Appl. No. 11/950,271, filed Mar. 9, 2010.
Geoffrey R. Walker Affidavit re: U.S. Appl. No. 11/950,271, submitted in an IDS for U.S. Appl. No. 11/950,271, filed Mar. 9, 2010.
International Search Report for PCT/IB2007/004610 dated Feb. 23, 2009.
International Search Report for PCT/IB2007/004584 dated Jan. 28, 2009.
International Search Report for PCT/IB2007/004586 dated Mar. 5, 2009.
International Search Report for PCT/IB2007/004643 dated Jan. 30, 2009.
International Search Report for PCT/US2008/085736 dated Jan. 28, 2009.
International Search Report for PCT/US2008/085754 dated Feb. 9, 2009.
International Search Report for PCT/US2008/085755 dated Feb. 3, 2009.
Kajihara, et al., "Model of Photovoltaic Cell Circuits Under Partial Shading", 2005 IEEE, pp. 866-870.
Knaupp, et al., "Operation of a 10 KW PV Fagade with 100 W AC Photovoltaic Modules", 1996 IEEE, 25th PVSC, May 13-17, 1996, pp. 1235-1238, Washington, DC.
Alonso, et al., "Cascaded H-Bridge Multilevel Converter for Grid Connected Photovoltaic Generators with Independent Maximum Power Point Tracking of Each Solar Array", 2003 IEEE 34th, Annual Power Electronics Specialists Conference, Acapulco, Mexico, Jun. 15-19, 2003, pp. 731-735, vol. 2.
Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.
Chen, et al., "Predictive Digital Current Programmed Control", IEEE Transactions on Power Electronics, vol. 18, Issue 1, Jan. 2003.
Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.
Alonso, "A New Distributed Converter Interface for PV Panels", 20th European Photovoltaic Solar Energy Conference, Jun. 6-10, 2005, Barcelona, Spain, pp. 2288-2291.
Alonso, "Experimental Results of Intelligent PV Module for Grid-Connected PV Systems", 21st European Photovoltaic Solar Energy Conference, Sep. 4-8, 2006, Dresden, Germany, pp. 2297-2300.
Enslin, "Integrated Photovoltaic Maximum Power Point Tracking Converter", IEEE Transactions on Industrial Electronics, vol. 44, No. 6, Dec. 1997, pp. 769-773.
Lindgren, "Topology for Decentralised Solar Energy Inverters with a Low Voltage AC-Bus", Chalmers University of Technology, Department of Electrical Power Engineering, EPE '99—Lausanne.

(56) References Cited

OTHER PUBLICATIONS

Nikraz, "Digital Control of a Voltage Source Inverter in a Photovoltaic Applications", 2004 35th Annual IEEE Power Electronics Specialists Conference, Aachen, Germany, 2004, pp. 3266-3271.
Orduz, "Evaluation Test Results of a New Distributed MPPT Converter", 22nd European Photovoltaic Solar Energy Conference, Sep. 3-7, 2007, Milan, Italy.
Palma, "A Modular Fuel Cell, Modular DC-DC Converter Concept for High Performance and Enhanced Reliability", IEEE 2007, pp. 2633-2638.
Quaschning, "Cost Effectiveness of Shadow Tolerant Photovoltaic Systems", Berlin University of Technology, Institute of Electrical Energy Technology, Renewable Energy Section. EuroSun '96, pp. 819-824.
Roman, "Intelligent PV Module for Grid-Connected PV Systems", IEEE Transactions on Industrial Electronics, vol. 52, No. 4, Aug. 2006, pp. 1066-1073.
Roman, "Power Line Communications in Modular PV Systems", 20th European Photovoltaic Solar Energy Conference, Jun. 5-10, 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.
Walker, "Cascaded DC-DC Converter Connection of Photovoltaic Modules", IEEE Transactions on Power Electronics, vol. 19, No. 4, Jul. 2004, pp. 1130-1139.
Matsui, et al., "A New Maximum Photovoltaic Power Tracking Control Scheme Based on Power Equilibrium at DC Link", IEEE, 1999, pp. 804-809.
Hou, et al., Application of Adaptive Algorithm of Solar Cell Battery Charger, Apr. 2004.
Stamenic, et al., "Maximum Power Point Tracking for Building Integrated Photovoltaic Ventilation Systems", 2000.
International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18 (3), dated Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfreld, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.
Sandia Report SAND96-2797 I UC-1290 Unlimited Release, Printed Dec. 1996, "Photovoltaic Power Systems and the National Electrical Code: Suggested Practices", by John Wiles, Southwest Technology Development Institute New Mexico State University Las Cruces, NM.
United Kingdom Intellectual Property Office, Combined Search and Examination Report Under Sections 17 and 18(3), GB1020862.7, dated Jun. 16, 2011.
GB Combined Search and Examination Report—GB1203763.6—dated Jun. 25, 2012.
Mohammad Reza Amini et al., "Quasi Resonant DC Link Inverter with a Simple Auxiliary Circuit", Journal of Power Electronics, vol. 11, No. 1, Jan. 2011.
Khairy Fathy et al., "A Novel Quasi-Resonant Snubber-Assisted ZCS-PWM DC-DC Converter with High Frequency Link", Journal of Power Electronics, vol. 7, No. 2, Apr. 2007.
Cheng K.W.E., "New Generation of Switched Capacitor Converters", Department of Electrical Engineering, The Hong Kong Polytechnic University, Hung Horn, Hong Kong, Power Electronics Conference, 1998, PESC 98.
Per Karlsson, "Quasi Resonant DC Link Converters—Analysis and Design for a Battery Charger Application", Universitetstryckeriet, Lund University, 1999, ISBN 91-88934-14-4.
Hsiao Sung-Hsin et al., "ZCS Switched-Capacitor Bidirectional Converters with Secondary Output Power Amplifier for Biomedical Applications", Power Electronics Conference (IPEC) Jun. 21, 2010.
Yuang-Shung Lee et al.,"A Novel QR ZCS Switched-Capacitor Bidirectional Converter", IEEE, 2007.
Antti Tolvanen et al., "Seminar on Solar Simulation Standards and Measurement Principles", May 9, 2006 Hawaii.
J.A. Eikelboom and M.J. Jansen, "Characterisation of PV Modules of New Generations—Results of tests and simulations", Jun. 2000.
Yeong-Chau Kuo et al., "Novel Maximum-Power-Point-Tracking Controller for Photovoltaic Energy Conversion System", IEEE Transactions on Industrial Electronics, vol. 48, No. 3, Jun. 2001.
C. Liu et al., "Advanced Algorithm for MPPT Control of Photovoltaic Systems", Canadian Solar Buildings Conference, Montreal, Aug. 20-24, 2004.
Chihchiang Hua and Chihming Shen, "Study of Maximum Power Tracking Techniques and Control of DC/DC Converters for Photovoltaic Power System", IEEE 1998.
Tore Skjellnes et al., "Load sharing for parallel inverters without communication", Nordic Workshop in Power and Industrial Electronics, Aug. 12-14, 2002.
Giorgio Spiazzi at el., "A New Family of Zero-Current-Switching Variable Frequency dc-dc Converters", IEEE 2000.
Nayar, C.V., M. Ashari and W.W.L Keerthiphala, "A Grid Interactive Photovoltaic Uninterruptible Power Supply System Using Battery Storage and a Back up Diesel Generator", IEEE Transactions on Energy Conversion, vol. 15, No. 3, Sep. 2000, pp. 348?353.
Ph Strauss et al., "AC coupled PV Hybrid systems and Micro Grids-state of the art and future trends", 3rd World Conference on Photovoltaic Energy Conversion, Osaka, Japan May 11-18, 2003.
Nayar, C.V., abstract, Power Engineering Society Summer Meeting, 2000. IEEE, 2000, pp. 1280-1282 vol. 2.
D. C. Martins et al., "Analysis of Utility Interactive Photovoltaic Generation System using a Single Power Static Inverter", Asian J. Energy Environ., vol. 5, Issue 2, (2004), pp. 115-137.
Rafael C. Beltrame et al., "Decentralized Multi String PV System With Integrated ZVT Cell", Congresso Brasileiro de Automática / Sep. 12-16, 2010, Bonito—MS.
Sergio Busquets-Monge et al., "Multilevel Diode-clamped Converter for Photovoltaic Generators with Independent Voltage Control of Each Solar Array", IEEE Transactions on Industrial Electronics, vol. 55, No. 7, Jul. 2008.
Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.
Office Action—JP 2011-539491—dated Mar. 26, 2013.
Supplementary European Search Report—EP08857456—dated Dec. 6, 2013.
Extended European Search Report—EP14151651.8—dated Feb. 25, 2014.
Iyomori H et al: "Three-phase bridge power block module type auxiliary resonant AC link snubber-assisted soft switching inverter for distributed AC power supply", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 650-656, XP031895550, ISBN: 978-4-88552-196-6.
Yuqing Tang: "High Power Inverter EMI characterization and Improvement Using Auxiliary Resonant Snubber Inverter", Dec. 17, 1998 (Dec. 17, 1998), XP055055241, Blacksburg, Virginia Retrieved

(56) References Cited

OTHER PUBLICATIONS from the Internet: URL:http:jjscholar.lib.vt.edu/theses/available/etd-012299-165108/unrestricted/THESIS.PDF, [retrieved on Mar. 5, 2013].
Yoshida M et al: "Actual efficiency and electromagnetic noises evaluations of a single inductor resonant AC link snubber-assisted three-phase soft-switching inverter", INTELEC 2003. 25th. International Telecommunications Energy Conference Yokohama, Japan, Oct. 19-23, 2003; Tokyo, IEICE, JP, Oct. 23, 2003 (Oct. 23, 2003), pp. 721-726, XP031895560, ISBN: 978-4-88552-196-6.
Third party observation—EP07874025.5—dated Aug. 6, 2011.
Extended European Search Report—EP 13152967.9—dated Aug. 28, 2014.
Extended European Search Report—EP 14159696—dated Jun. 20, 2014.
Gow Ja A et al: "A Modular DC-DC Converter and Maximum Power Tracking Controller for Medium to Large Scale Photovoltaic Generating Plant"8$^{th}$ European Conference on Power Electronics and Applications. Lausaane, CH, Sep. 7-9, 1999, EPE. European Conference on Power Electronics and Applications, Brussls: EPE Association, BE, vol. Cont. 8, Sep. 7, 1999, pp. 1-8, XP000883026.
Chihchiang Hua et al: "Comparative Study of Peak Power Tracking Techniques for Solar Storage System" Applied Power Electronics Conference and Exposition, 1998. APEC '98. Conference Proceedings 1998, Thirteenth Annual Anaheim, CA USA Feb. 15-19, 1998, New York, NY, USA, IEEE, US, Feb. 15, 1998, pp. 679-685, XP010263666.
Matsuo H et al: "Novel Solar Cell Power Supply System Using the Multiple-input DC-DC Converter" 20$^{th}$ International telecommunications Energy Conference. Intelec '98 San Francisco, CA, Oct. 4-8, 1998, Intelec International Telecommunications Energy Conference, New York, NY: IEEE, US, Oct. 4, 1998, pp. 797-802, XP000896384.
Chihchiang Hua et al: "DSP-based controller application in battery storage of photovoltaic system" Industrial Electronics, Electronics, Control, and Instrumentation, 1996, Proceedings of the 1996 IEEE IECON 22$^{nd}$ International Conference on Taipei, Taiwan Aug. 5-10, 1996, New York, NY, USA, IEEE, US, Aug. 5, 1996, pp. 1705-1710, XP010203239.
Hua C et al: "Implementation of a DSP-Controlled Photovoltaic System with Peak Power Tracking"IEEE Transactions on industrial Electronics, IEEE, Inc. New York, US, vol. 45, No. 1, Feb. 1, 1998, pp. 99-107, XP000735209.
I. Weiss et al.: "A new PV system technology-the development of a magnetic power transmission from the PV module to the power bus" 16th European Photovoltaic Solar Energy Conference, vol. III, May 1-5, 2000, pp. 2096-2099, XP002193468 Glasgow,UK.
Basso, Tim, "IEEE Standard for Interconnecting Distributed Resources With the Electric Power System," IEEE PES Meeting, Jun. 9, 2004.
Boostbuck.com, "The Four Boostbuck Topologies," located at http://www.boostbuck.com/TheFourTopologies.html, 2003.
Gautam, Nalin K. et al., "An Efficient Algorithm to Simulate the Electrical Performance of Solar Photovoltaic Arrays," Energy, vol. 27, No. 4, pp. 347-361, 2002.
Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.
Wiles, John, "Photovoltaic Power Systems and the National Electrical Code: Suggested Practices," Sandia National Laboratories, document No. SAND2001-0674, Mar. 2001.
Hewes, J. "Relays," located at http://web.archive.org/web/20030816010159/www.kpsec.freeuk.com/components/relay.htm, Aug. 16, 2003.
Definition of "remove" from Webster's Third New International Dictionary, Unabridged, 1993.
Definition of "removable" from Webster's Third New International Dictionary, Unabridged, 1993.

Advanced Energy Group, "The Basics of Solar Power Systems," located at http://web.archive.org/web/20010331044156/http://www.solar4power.com/solar-power-basics.html, Mar. 31, 2001.
International Patent Application No. PCT/AU2005/001017, International Search Report and Written Opinion, dated Aug. 18, 2005.
Baek, Ju-Won et al., "High Boost Converter using Voltage Multiplier," 2005 IEEE Conference, IECON 05, pp. 567-572, Nov. 2005.
Wikimedia Foundation, Inc., "Electric Power Transmission," located at http://web.archive.org/web/20041210095723/en.wikipedia.org/wiki/Electric-power-transmission, Nov. 17, 2004.
Jacobsen, K.S., "Synchronized Discrete Multi-Tone (SDMT) Modulation for Cable Modems: Making the Most of the Scarce Reverse Channel Bandwidth," Conference Proceedings of Wescon/97, pp. 374-380, Nov. 4, 1997.
Loyola, L. et al., "A Multi-Channel Infrastructure based on DCF Access Mechanism for Wireless LAN Mesh Networks Compliant with IEEE 802.11," 2005 Asia-Pacific Conference on Communications, pp. 497-501, Oct. 5, 2005.
International Search Report for corresponding PCT/GB2004/001965, completed Aug. 16, 2004 by A. Roider.
Naik et al., A Novel Grid Interface for Photovoltaic, Wind-Electric, and Fuel-Cell Systems With a Controllable Power Factor or Operation, IEEE, 1995, pp. 995-998.
Petkanchin, Processes following changes of phase angle between current and voltage in electric circuits, Aug. 1999, Power Engineering Review, IEEE vol. 19, Issue 8, pp. 59-60.
Mumtaz, Asim, et al., "Grid Connected Pv Inverter Using a Commercially Available Power IC," PV in Europe conference, Oct. 2002, 3 pages, Rome, Italy.
Koutroulis, Eftichios, et al., "Development of a Microcontroller-Based, Photovoltaic Maximum Power Point Tracking Control System," IEEE Transactions on Power Electronics, Jan. 2001, pp. 46-54, vol. 16, No. 1, IEEE.
European Search Report—EP App. 14159457.2—dated Jun. 12, 2015.
European Search Report and Written Opinion—EP Appl. 12150819.6—dated Jul. 6, 2015.
Alonso, O. et al. "Cascaded H-Bridge Multilevel Converter for Grid Connected Photovoltaic Generators With Independent Maximum Power Point Tracking of Each Solar Array." IEEE 34th Annual Power Electronics Specialists Conference. vol. 2, Jun. 15, 2003.
Alonso, et al., "Cascaded H-Bridge Multilevel Converter for Grid Connected Photovoltaic Generators with Independent Maximum Power Point Tracking of Each Solor Array", 2003 IEEE 34th, Annual Power Electronics Specialists Conference, Acapulco, Mexico, Jun. 15-19, 2003, pp. 731-735, vol. 2.
Chinese Office Action—CN Appl. 201280006369.2—dated Aug. 4, 2015.
Chinese Office Action—CN Appl. 201210253614.1—dated Aug. 18, 2015.
Extended European Search Report, EP Application 04753488.8, dated Apr. 29, 2015.
International Search Report from PCT/US04/16668, form PCT/ISA/220, filed May 27, 2004.
Office Action U.S. Appl. No. 13/785,857, dated Jun. 6, 2013.
Partial Extended European Search Report, EP Application 04753488.8, dated Feb. 2, 2015.
The International Search Report (Form PCT /ISA/220) Issued in corresponding international application No. PCT/US04/16668, filed May 27, 2004.
International Search Report—PCT/US2004/016668, form PCT/ISA/220—filed May 27, 2004—dated Jan. 19, 2005.
Written Opinion of the International Searching Authority—PCT/US2004/016668, form PCT/ISA/220—filing date May 27, 2004—dated Jan. 19, 2005
Extended European Search Report—EP Appl. 04753488.8—dated Apr. 29, 2015.
Supplementary Partial European Search Report—EP Appl. 04753488.8—dated Feb. 2, 2015.
U.S. Office Action—U.S. Appl. No. 13/785,857—dated Jun. 6, 2013.
European Office Action—EP Appl. 09725443.7—dated Aug. 18, 2015.

(56) References Cited

OTHER PUBLICATIONS

Definition of Isomorphism by Merriam-Webster, <http://www.merriaum-webster.com/dictionary/isomorphism, dated Oct. 20, 2015.
Definition of Isomorphic by Merriam-Webster, <http://www.merriam-webster.com/dictionary/isomorphic, dated Oct. 20, 2015.
Chinese Office Action—CN Appl. 201110349734.7—dated Oct. 13, 2015.
Chinese Office Action—CN Appl. 201210007491.3—dated Nov. 23, 2015.
European Office Action—EP Appl. 12176089.6—dated Dec. 16, 2015.
Chinese Office Action—CN Appl. 201310035223.7—dated Dec. 29, 2015.
Chinese Office Action—CN Application 201210334311.2—dated Jan. 20, 2016.
European Search Report—EP Appl. 13800859.4—dated Feb. 15, 2016.
Chinese Office Action—CN App. 201310035221.8—dated Mar. 1, 2016.
PCT/2008/058473 International Preliminary Report, 6 pages, dated Oct. 30, 2009.
International Search Report and Written Opinion, WO 2010080672, dated Aug. 19, 2010.
PCT/US2010/045352 International Search Report and Written Opinion; 12 pages; dated Oct. 26, 2010.
International Search Report and Written Opinion dated Feb. 6, 2009, in counteprart PCT/US2008/008451, 13 pages.
European Search Report: dated Jan. 10, 2013 in corresponding EP application No. 09838022.3, 7 pages.
D. Ton and W. Bower; Summary Report of the DOE High-Tech Inverter Workshop; Jan. 2005.
First Action Interview Pre-Interview Communication from U.S. Appl. No. 13/174,495 dated Jun. 18, 2014, 7 pgs.
Johnson et al., "Arc-fault detector algorithm evaluation method utilizing prerecorded arcing signatures", Photovoltaic Specialists Conference (PVSC), Jun. 2012.
Philippe Welter, et al. "Electricity at 32 kHz," Photon International, The Photovoltaic Magazine, Http://www.photon-magazine.com/archiv/articles.aspx?criteria=4&HeftNr=0807&Title=Elec . . . printed May 27, 2011).
PCT/US2009/069582 Int. Search Report—dated Aug. 19, 2010.
Chinese Office Action—CN Appl. 201210007491.3—dated Apr. 25, 2016.
CN Office Action—CN Appl. 201310004123.8—dated May 5, 2016.
Law et al, "Design and Analysis of Switched-Capacitor-Based Step-Up Resonant Converters," IEEE Transactions on Circuits and Systems, vol. 52, No. 5, published May 2005.
CN Office Action—CN Appl. 201310066888.4—dated May 30, 2016.
European Search Report—EP Appl. 13152966.1—dated Jul. 21, 2016.
European Search Report—EP Appl. 12183811.4—dated Aug. 4, 2016.
European Notice of Opposition—EP Patent 2374190—dated Jul. 19, 2016.
"Es werde Dunkelheit. Freischaltung von Solarmodulen im Brandfall"—"Let there be Darkness: Quality control of Solar Modules in Case of Fire"; PHOTON, May 2005, 75-77, ISSN 1430-5348, English translation provided.
Chinese Office Action—CN Appl. 201380029450.7—dated Jul. 28, 2016.
Starter, Lior, "Enhancing Cable Modem TCP Performance," Texas Instruments Inc. white paper, Jul. 2003.
Philips Semiconductors, Data Sheet PSMN005-55B; PSMN005-55P N-channel logic trenchMOS transistor, Oct. 1999, Product specification, pp. 1-11.
International Preliminary Report on Patentability Issued in corresponding international application No. PCT/US04/16668, filed May 27, 2004.
International Application No. PCT/US13127965, International Preliminary Examination Report, dated Sep. 2, 2014.
International Patent Application PCT/US13/027965, International Search Report and Written Opinion, dated Jun. 2, 2013.
International Application No. PCT/US12144045, International Preliminary Examination Report, dated Jan. 28, 2014.
International Patent Application No. PCT/US2012/044045, International Search Report and Written Opinion, dated Jan. 2, 2013.
International Patent Application No. PCT/US2009/047734, International Search Report and Written Opinion, dated May 4, 2010.
Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.
International Patent Application No. PCT/US2010/029929, International Search Report and Written Opinion, dated Oct. 27, 2010.
Lowe, Electronics Basis: What is a Latch Circuit, http://www.dummies.com/how-to/content/electronics-basics-what-is-a-latch-circuit.html, from Electronics All-in-One for Dummies, Feb. 2012, downloaded Jul. 13, 2014.
International Patent Application No. PCT/US2011/020591, International Search Report and Written Opinion, dated Aug. 8, 2011.
International Patent Application No. PCT/US2011/033544, International Search Report and Written Opinion, dated Nov. 24, 2011.
J. Keller and B. Kroposki, titled, "Understanding Fault Characteristics of Inverter-Based Distributed Energy Resources", in a Technical Report NREl/TP-550-46698, published Jan. 2010, pp. 1 through 48.
International Patent Application No. PCT/US2008/081827, International Search Report and Written Opinion, dated Jun. 24, 2009.
International Patent Application No. PCT/US2010/046274 International Search Report and Written Opinion, dated Apr. 22, 2011.
International Patent Application No. PCT/US2011/033658, International Search Report and Written Opinion, dated Jan. 13, 2012.
International Patent Application No. PCT/US2011/029392, International Search Report and Written Opinion, dated Oct. 24, 2011.
European Patent Application No. 09829487.9, Extended Search Report, dated Apr. 21, 2011.
International Patent Application No. PCT/US2009/062536, International Search Report and Written Opinion, dated Jun. 17, 2010.
International Patent Application No. PCT/US2010/022915, International Search Report and Written Opinion, dated Aug. 23, 2010.
International Patent Application No. PCT/US2010/046272, International Search Report and Written Opinion, dated Mar. 31, 2011.
Exell et al., "The Design and Development of a Solar Powered Refrigerator", [retrieved on Feb. 13, 2013], Retrieved from he Internet <URL: http://www.appropedia.org/The_Design_and_Development_of_a_Solar_Powered_Refrigerator>, pp. 1-64.
"Development of Water-Lithium Bromide Low-Temperature Absorption Refridgerating Machine", 2002 Energy & Environment on Database on Noteworthy contributions for Science and Technology (Japan), Research Data (No. 1748) [online], [retrieved on Aug. 29, 2012]. Retrieved from the Internet: <URL: http://dbnstl.nii.ac.jp/english/detail/1748>, pp. 1-4.
Dictionary.com, "air conditioning" [online], [retrieved on Aug. 28, 2012]. Retrieved from the Internet: <URL: http://dictionary.reference.com/browse/air+conditioning?s=t>, pp. 1-3.
International Patent Application No. PCT/US2010/029936, International Search Report and Written Opinion, dated Nov. 12, 2010.
International Patent Application No. PCT/U508175127, International Search Report and Written Opinion, dated Apr. 28, 2009.
International Patent Application No. PCT/U509/35890, International Search Report and Written Opinion, dated Oct. 1, 2009.
European Patent Application No. 08845104.2, Extended Search Report, dated Jul. 31, 2014.
European Patent Application No. 11772811.3, Extended Search Report, dated Dec. 15, 2014.
International Patent Application No. PCT/US2008/082935, International Search Report and Written Opinion, dated Jun. 25, 2009.
Bhatnagar et al., Silicon Carbide High Voltage (400 V) Shottky Barrier Diodes, IEEE Electron Device Letters, vol. 13 (10) p. 501-503 Oct. 10, 1992.

(56) References Cited

OTHER PUBLICATIONS

Rodriguez, C., and G. A. J. Amaratunga. "Dynamic stability of grid-connected photovoltaic systems." Power Engineering Society General Meeting, 2004. IEEE, pp. 2194-2200.
Kikuchi, Naoto, et al. "Single phase amplitude modulation inverter for utility interaction photovoltaic system." Industrial Electronics Society, 1999. IECON'99 Proceedings. The 25th Annual Conference of the IEEE. vol. 1. IEEE, 1999.
Nonaka, Sakutaro, et al. "Interconnection system with single phase IGBT PWM CSI between photovoltaic arrays and the utility line." Industry Applications Society Annual Meeting, 1990., Conference Record of the 1990 IEEE.
Calais, Martina, et al. "Inverters for single-phase grid connected photovoltaic systems—an overview." Power Electronics Specialists Conference, 2002. pesc 02. 2002 IEEE 33rd Annual. vol. 4. IEEE, 2002.
Marra, Enes Goncalves, and José Antenor Pomilio. "Self-excited induction generator controlled by a VS-PWM bidirectional converter for rural applications." Industry Applications, IEEE Transactions on 35.4 (1999): 877-883.
Xiaofeng Sun, Weiyang Wu, Xin Li, Qinglin Zhao: A Research on Photovoltaic Energy Controlling System with Maximum Power Point Tracking:; Proceedings of the Power Conversion Conference—Osaka 2002 (Cat. No. 02TH8579) IEEE—Piscataway, NJ, USA, ISBN 0-7803-7156-9, vol. 2, p. 822-826, XP010590259: the whole document.
International Search Report for corresponding PCT/GB2005/050198 completed Jun. 28, 2006 by C. Wirner of the EPO.
Brunello, Gustavo, et al., "Shunt Capacitor Bank Fundamentals and Protection," 2003 Conference for Protective Relay Engineers, Apr. 8-10, 2003, pp. 1-17, Texas A&M University, College Station, TX, USA.
Cordonnier, Charles-Edouard, et al., "Application Considerations for Sensefet Power Devices," PCI Proceedings, May 11, 1987, pp. 47-65.
Kotsopoulos, Andrew, et al., "Predictive DC Voltage Control of Single-Phase PV Inverters with Small DC Link Capacitance," IEEE International Symposium, Month Unknown, 2003, pp. 793-797.
Meinhardt, Mike, et al., "Multi-String-Converter with Reduced Specific Costs and Enhanced Functionality," Solar Energy, May 21, 2001, pp. 217-227, vol. 69, Elsevier Science Ltd.
Kimball, et al: "Analysis and Design of Switched Capacitor Converters"; Grainger Center for Electric Machinery and Electromechanics, University of Illinois at Urbana-Champaign, 1406 W. Green St, Urbana, IL 61801 USA, © 2005 IEEE; pp. 1473-1477.
Martins, et al: "Interconnection of a Photovoltaic Panels Array to a Single-Phase Utility Line From a Static Conversion System"; Power Electronics Specialists Conference, 2000. PESC 00. 2000 IEEE 31st Annual; Jun. 18, 2000-Jun. 23, 2000; ISSN: 0275-9306; pp. 1207-1211, vol. 3.
International Search Report for corresponding PCT/GB2005/050197, completed Dec. 20, 2005 by K-R Zettler of the EPO.
Kjaer, Soeren Baekhoej, et al., "Design Optimization of a Single Phase Inverter for Photovoltaic Applications," IEEE 34th Annual Power Electronics Specialist Conference, Jun. 15-19, 2003, pp. 1183-1190, vol. 3, IEEE.
Shimizu, Toshihisa, et al., "A Flyback-type Single Phase Utility Interactive Inverter with Low-frequency Ripple Current Reduction on the DC Input for an AC Photovoltaic Module System," IEEE 33rd Annual Power Electronics Specialist Conference, Month Unknown, 2002, pp. 1483-1488, vol. 3, IEEE.
Written Opinion of PCT/GB2005/050197, dated Feb. 14, 2006, Enecsys Limited.
Yatsuki, Satoshi, et al., "A Novel AC Photovoltaic Module System based on the Impedance-Admittance Conversion Theory," IEEE 32nd Annual Power Electronics Specialists Conference, Month Unknown, 2001, pp. 2191-2196, vol. 4, IEEE.
Jul. 13, 2017—Chinese Office Action—CN201210007491.3.

Sep. 15, 2012—Huimin Zhou et. al—"PV balancers: Concept, architectures, and realization"—Energy Conversion Congress and Exposition (ECCE), 2012 IEEE, IEEE pp. 3749-3755.
Jul. 31, 2014—Huimin Zhou et al.—"PV Balancers: Concept, Architectures, and Realization"—IEEE Transactions on Power Electronics, vol. 30, No. 7, pp. 3479-3487.
Jul. 17, 2017—International Search Report—PCT/US2017/031571.
U.S. Appl. No. 13/308,517, Distributed Power Harvesting Systems Using DC Power Sources, filed Nov. 30, 2011.
U.S. Appl. No. 13/015,219, Testing of a Photovoltaic Panel, filed Jan. 27, 2011.
U.S. Appl. No. 13/238,041, Current Sensing on a Mosfet, filed Sep. 21, 2011.
U.S. Appl. No. 13/487,311, Integrated Photovoltaic Panel Circuitry, filed Jun. 4, 2012.
U.S. Appl. No. 13/430,388, Safety Mechanisms, Wake Up and Shutdown Methods in Distributed Power Installations, filed Mar. 26, 2012.
U.S. Appl. No. 13/440,378, Safety Mechanisms, Wake Up and Shutdown Methods in Distributed Power Installations, filed Apr. 5, 2012.
U.S. Appl. No. 13/738,533, Photovoltaic Module, filed Jan. 10, 2013.
U.S. Appl. No. 13/754,059, Maximizing Power in a Photovoltaic Distributed Power System, filed Jan. 30, 2013.
U.S. Appl. No. 14/033,781, Direct Current Link Circuit, filed Sep. 23, 2013.
U.S. Appl. No. 14/183,214, Distributed Power Harvesting Systems Using DC Power Sources, filed Feb. 18, 2014.
U.S. Appl. No. 14/303,067, Serially Connected Inverters, filed Jun. 12, 2014.
U.S. Appl. No. 14/323,531, System and Method for Protection During Inverter Shutdown in Distributed Power Installations, filed Jul. 3, 2014.
U.S. Appl. No. 14/582,363, Theft Detection and Prevention in a Power Generation System, filed Dec. 24, 2014.
U.S. Appl. No. 14/631,227, Photovoltaic Panel Circuitry, filed Feb. 25, 2015.
U.S. Appl. No. 14/693,264, Battery Power Delivery Module, filed Apr. 22, 2015.
U.S. Appl. No. 14/743,018, Pairing of Components in a Direct Current Distributed Power Generation System, filed Jun. 18, 2015.
U.S. Appl. No. 14/809,511, Distributed Power Harvesting Systems Using DC Power Sources, filed Jul. 27, 2015.
U.S. Appl. No. 15/149,353, Maximized Power in a Photovoltaic Distributed Power System, filed May 9, 2016.
U.S. Appl. No. 15/045,740, Photovoltaic System Power Tracking Method, filed Feb. 17, 2016.
U.S. Appl. No. 15/132,419, Direct Current Power Combiner, filed Apr. 19, 2016.
U.S. Appl. No. 15/139,745, Distributed Power System Using Direct Current Power Sources, filed Apr. 27, 2016.
U.S. Appl. No. 15/184,040, Parallel Connected Inverters, filed Jun. 16, 2016.
U.S. Appl. No. 15/369,881, Safety Mechanisms, Wake Up and Shutdown Methods in Distributed Power Installations, filed Dec. 5, 2016.
U.S. Appl. No. 15/407,881, Arc Detection and Prevention in a Power Generation System, filed Jan. 17, 2017.
U.S. Appl. No. 15/357,442, Testing of a Photovoltaic Panel, filed Nov. 21, 2016.
U.S. Appl. No. 15/365,084, Distributed Power Harvesting Systems Using DC Power Sources, filed Nov. 30, 2016.
U.S. Appl. No. 15/383,518, Method and Apparatus for Storing and Depleting Energy, filed Dec. 19, 2016.
U.S. Appl. No. 15/653,049, Distributed Power System Using Direct Current Power Sources, filed Jul. 18, 2017.
U.S. Appl. No. 15/480,574, Monitoring of Distributed Power Harvesting Systems Using DC Power Sources, filed Apr. 6, 2017.
U.S. Appl. No. 15/464,850, Direct Current Link Circuit, filed Mar. 21, 2017.
U.S. Appl. No. 15/478,526, Optimizer Garland, filed Apr. 4, 2017.

(56) References Cited

OTHER PUBLICATIONS

U.S. Appl. No. 15/479,530, Arc Detection and Prevention in a Power Generation System, filed Apr. 5, 2017.
U.S. Appl. No. 15/627,037, System and Method for Protection During Inverter Shutdown in Distributed Power Installations, filed Jun. 19, 2017.
U.S. Appl. No. 15/488,858, Zero Voltage Switching, filed Apr. 17, 2017.
U.S. Appl. No. 15/495,301, Digital Average Input Current Control in Power Converter, filed Apr. 24, 2017.
U.S. Appl. No. 15/593,761, Photovoltaic Power Device and Wiring, filed May 12, 2017.
U.S. Appl. No. 15/593,942, Method for Distributed Power Harvesting Using DC Power Sources, filed May 12, 2017.
U.S. Appl. No. 15/641,553, Distributed Power Harvesting Systems Using DC Power Sources, filed Jul. 5, 2017.
Aug. 4, 2017—European Search Report—EP 17165027.
Sep. 28, 2017—European Office Action—EP 08857835.6.
Dec. 14, 2017—EP Search Report App No. 17188362.2.
Dec. 15, 2017—EP Search Report App No. 17188365.5.
Jul. 19, 2016—Notice of Opposition—EP 2374190—EP App No. 08878650.4.
2000; Bascope, G.V.T. Barbi, I; "Generation of Family of Non-isolated DC-DC PWM Converters Using New Three-state Switching Cells"; 2000 IEEE 31st Annual Power Electronics Specialists Conference in Galway, Ireland; vol. 2.
Jan. 20, 2005; Duncan, Joseph, A Global Maximum Power Point Tracking DC-DC Converter, Massachussetts Institute of Technology, Dept. of Electrical Engineering and Computer Science Dissertation; 8 pages.
2005; Edelmoser, K.H. et al.; High Efficiency DC-to-AC Power Inverter with Special DC Interface; Professional Paper, ISSN 0005-1144, Automatika 46 (2005) 3-4, 143-148, 6 pages.
2006; Esmaili, Gholamreza; "Application of Advanced Power Electornics in Renewable Energy Sources and Hygrid Generating Systems" Ohio State Univerty, Graduate Program in Electrical and Computer Engineering, Dissertation. 169 pages.
Nov. 13, 2007; Gomez, M; "Consulting in the Solar Power Age," IEEE-CNSV: Consultants' Network of Scilion Valley; 30 pages.
Jul. 25, 1995-Jun. 30, 1998; Kern, G; "SunSine (TM)300: Manufacture of an AC Photovoltaic Module," Final Report, Phases I & II; National Renewable Energy Laboratory, Mar. 1999; NREL-SR-520-26085; 33 pages.
May 1, 2000; Kroposki, H. Thomas and Witt, B & C; "Progress in Photovoltaic Components and Systems," National Renewable Energy Laboratory; NREL-CP-520-27460; 7 pages.
Jan. 22-23, 1998 Oldenkamp, H. et al; "AC Modules: Past, Present and Future" Workshop Installing the Solar Solution; Haffield, UK; 6 pages.
Linear Technology Specification Sheet, LTC3443—"High Current Micropower 600kHz Synchronous Buck-Boost DC/DC Converter"—2004.
Linear Technology Specification Sheet, LTC3780—"High Efficiency Synchronous, 4-Switch Buck-Boost Controller"—2005.
Apr. 22, 2004—MICREL—MIC2182 High Efficiency Synchronous Buck Controller.
Apr. 1972—Methods for Utilizing Maximum Power From a Solar Array—Decker, DK.
2000—Evaluating Mppt converter topologies using a MATLAB PV model—Walker, Geoffrey.
Jun. 30, 2008—Wang, Ucilia; Greentechmedia; "National Semi Casts Solarmagic"; www.greentechmedia.com; 3 pages; accessed Oct. 24, 2017.
Sep. 2004; Yuvarajan, S; Dchuan Yu; Shanguang, Xu; "A Novel Power Converter for PHotovoltaic Applications," Journal of Power Sources; vol. 135, No. 1-2, pp. 327-331.
Jun. 1998—Stem M., et al., "Development of a Low-Cost Integrated 20-kW-AC Solar Tracking Subarray for Grid-Connected PV Power System Applications—Final Technical Report"—National Renewable Energy Laboratory; 41 pages.

1997; Verhoeve, C.W.G., et al., "Recent Test Results of AC_Module inverters," Netherlands Energy Research Foundation ECN, 1997; 3 pages.
2004—Nobuyoshi, M. et al., "A Controlling Method for Charging Photovoltaic Generation Power Obtained by a MPPT Control Method to Series Connected Ultra-Electric Double Layer Capacitors"—Industry Application Conference, 2004. 39th IAS Annual Meeting. Conference Record of the 2004 IEEE.
Feb. 23-27, 1992—Miwa, Brett et al., "High Efficiency Power Factor Correction Using Interleaving Techniques" Applied Power Electronics Conference and Exposition, 1992. APEC '92. Conference Proceedings 1992., Seventh Annual.
Mar. 4-8, 2001—Andersen Gert, et al.,—Aalborg University, Institute of Energy Technology, Denmark—"Current Programmed Control of a Single Phase Two-Switch Buck-Boost Power Factor Correction Circut"—Applied Power Electronics Conference and Exposition, 2001. APEC 2001. Sixteenth Annual IEEE.
Feb. 22-26, 2004—Andersen, Gert et al.,—"Utilizing the free running Current Programmed Control as a Power Factor correction Technique for the two switch Buck-Boost converter"—Applied Power Electronic Conference and Exposition, 2004. APEC '04. Nineteenth Annual IEEE.
Mar. 3-7, 1996—Caricchi F et al.,—"Prototype of Innovative Wheel Direct Drive With Water-Cooled Exial-Flux Motor for Electric Vehicle Applications"—Applied Power Electronics Conference and Expositions, 1996. APEC '96. Conference Proceedings 1996., Eleventh Annual IEEE.
Feb. 15-19, 1998—Caricchi, F. et al.,—"Study of Bi-Directional Buck-Boost Converter Topologies for Application in Electrical Vehicle Motor Drives"—Applied Power Electronics Conference and Exposition, 1998, APEC '98. COnference Proeedings 1998., Thirteenth Annual IEEE.
Nov. 27-30, 1990—Ensling, JHR—"Maximum Power Point Tracking: A Cost Saving Necessity in Solar Energy Systems"—Industrial Electomics Society, 1990. IECON '90., 16th Annual Conference of IEEE.
Feb. 22-26, 2004—Gaboriault, Mark et al.,—"A High Efficiency, Non-Inverting, Buck-Boost DC-DC Converter"—Applied Power Electronics Conference and Exposition, 2004. APEC '04. Nineteenth Annual IEEE.
Feb. 15-19, 1998—Hua, et al.,—"Comparative Study of Peak Power Tracking Techniques for Solar Storage System"—Applied POwer Electronics Conference and Exposition, 1998. APEC'98. Conferenced Proceedings 1998., Thirteenth Annual IEEE.
Jun. 20-24, 1993—Sullivan, et al., "A High-Efficiency Maximum Power Point Tracker for Photovoltaic Arrays in a Solar-Powered Race Vehicle"—University of California, Berkeley, Department of Electrical Engineering and OCmputer Sciences—Power Electronics Specialists Conference, 1991 PESC '93 Record., 24th Annual IEEE.
May 19-24, 2002—Bower et at.,—"Certification of Photovoltaic Inverters: The Initial Step Toward PV System Certification"—Photovoltaic Specialists Conferences, 2002. Conference Record of the Twenty-Ninth IEEE.
Jun. 17-21, 2001—Tse et al., "A Novel Maximum Power Point Tracking Technique for PV Panels"—Power Electronics Specialists Conferences, 2001. PESC. 2001 IEEE 32nd Annual.
May 12-18, 2008—Cuadras et al., "Smart Interfaces for Low Power Energy Harvesting Systems"—Instrumentation and Measurement Technology Conferences Proceedings, 2008. IMTC 2008. IEEE.
Dec. 5-9, 1994—Haan, et al., "Test Results of a 130 W AC Module; a modular solar as power station"—Photovoltaic Energy Conversion 1994. Conference Record of the Twenty Fourth. IEEE Phtovoltaic Specialists Conference—1994.
Sep. 1-3, 2008—Jung, et al., "Soft Switching Boost Converter for Photovoltaic Power Generation System"—Power Electronics and Motion Control Conference, 2008. EPE-PEMC 2008.
Jun. 3-5, 2008—Duan, et al., "A Novel High-Efficiency Inverter for Stand Alone and Grid-Connected Systems"—Industrial Electronics and Applications, 2008. ICIEA 2008.
Nov. 7, 2002—Ertl, et al., "A Novel Multicell DC-AC Converter for Applicaiton in Renewable Energy Systems"—IEEE Transactions on Industrial Electronics (vol. 49, Issue 5, Oct. 2002).

(56) References Cited

OTHER PUBLICATIONS

Oct. 8-12, 2000 Hashimoto, et al., "A Novel High Peforamance Utility Interactive Photovoltain Inverter System"—Industry Applications Conference, 2000. Conference Record of the 2000 IEEE.

Feb. 22-26, 2004—Ho, et al., "An Integrated Inverter with Maximum Poer Tracking for Grid-Connected PV Systems"—Applied Power Electronics Conference and Exposition, 2004. APEC '04. Nineteenth Annual IEEE.

Nov. 14, 1997, Hua et al., "Control of DC/DC Converters for Solar Energy System with Maximum Power Tracking" Industrial Electronics, Control and Instrumentation, 1997. IECON 97. 23rd International Conference on Industrial Electronics, Control and Instrumentation vol. 4 of 4.

Sep. 1-3, 2008, Lee et al., "Soft Switching Mutli-Phase Boost Converter for Photovoltaic System"—Power Electronics and Motnion Control Conference, 2008. EPE-PEMC 2008.

Jul. 5, 2005, Yao et al., "Tapped-Inductor Buck Converter for High-Step-Down DC-DC Conversion" IEEE Transactions on Power Electronics (vol. 20, Issue 4, Jul. 2005).

Sep. 21-23, 1998, Kretschmar, et al., "An AC Converter with a Small DC Link Capacitor for a 15KW Permanent Magnet Synchronous Integral Motor"—Power Electronics and Variable Speed Drives, 1998. Sevent International Converterest (Conf. Publ. No. 456).

May 25, 2000—Hong Lim, et al., "Simple Maximum Power Point Tracker for Photovoltaic Arrays"—Electronics Letters (vol. 36, Issue 11, May 25, 2000).

Aug. 14-16, 2004, Nishida et al., "A Novel Type of Utility-Interactive Inverter for Phtovoltaic System"—Power Electronics and Mtion Control Conference, 2004. IPEMC 2004.

May 30-Jun. 3, 2011, Jung, et al., "DC-Link Ripple Reduction of Series-connected Module Integrated Converter for Photovoltaic Systems."—Power Electronics and ECCE Asia (ICPE & ECCE).

Jan. 8, 2007, Li et al., "An Analysis of ZVS Two-Inductor Boost Converter under Variable Frequency Operation"—IEEE Transactions on Power Electronics (vol. 22, Issue 1, Jan. 2007).

Sep. 17, 2007, Rodriguez et al., "Analytic Solution to the Photovoltaic Maximum Power Point Problem"—IEEE Transactions on Circuits and Systems I: Regular Papers (vol. 54, Issue 9, Sep. 2007).

Jun. 27, 1997, Reimann et al., "A Novel Control Principle of Bi-Directional DC-DC Power Conversion"—Powre Electronics Specialists Conference 1997. PESC '97 Record.

Sep. 15-22, 2000, Russell et al., "The Massachusetts Electric Solar Project: A Pilot Project to Commercialize Residential PV Systems"—Photovoltaic Specialists Conference, 2000, Conference Record of the Twenty-Eighth IEEE Photovoltaic Specialists Conference—2000.

May 2001, Shimizu et al., "Generation Control Circuit for Photvoltaic Modules"—IEEE Transactions of Power Electronics (vol. 16, Issue 3, May 2001).

Feb. 6-10, 2000, Siri, Kasemsan "Study of System Instability in Current-Mode Converter Power Systems Operating in Solar Array Voltage Regulation Mode"—Applied Power Electronics Conference and Exposition, 2000. APEC 2000. Fiftheenth Annual IEEE.

Aug. 13-16, 1990—Rajan, Anita "A Maximum Power Point Tracker Optimized for Solar Powered Cars"—Future Transportation Technology Conference and Expostion.

Jul. 10, 1995—"Battery I.D. chip from Dallas Semiconductor monitors and reports battery pack temperature"—Business Wire.

Nov. 3, 1999—Takahashi et al., "Development of a Long-Life Three-Phase Flywheel UPS Using an Electrolytic Capacitorless Converter/Inverter"—Electrical Engineering in Japan, vol. 127.

Jan. 2001—Walker, Geoffrey "Evaluating MPPT Converter Topologies Using a Matlab PV Model"—"Journal of Electrical and Electronics Engineering, Australia".

Feb. 13, 2007—Roman et al., "Experimental Results of Controlled PV Module for Building Integrated PV Systems"—Solar Energy 82 (2008) 471-480.

2006—Bower et al., "Innovative PV Micro-Inverter Topology Eliminates Electrolytic Capacitors for Longer Lifetime"—IEEE 1-4244-0016-3/06/ pp. 2038-2041.

Aug. 23-27, 1993—Case et al., "A Minimum Component Photovoltaic Array Maximum Power Point Tracker"—European Space Power Conference vol. 1. Power Systems, Power Electronics.

Jun. 4, 1997—Maranda et al., "Optimization of the Master-Slave Inverter System for Grid-Connected Photovoltaic Plants"—Energy Conyers. Mgmt. vol. 39, No. 12 pp. 1239-1246.

2005—Kang et al., "Photovoltaic Power Interface Circuit Incorporated with a Buck-Boost Converter and a Full-Bridge Inverter"—Applied Energy 82, pp. 266-283.

Nov. 21, 1997—Feuermann et al., "Reversable Low Soalr Heat Gain Windows for Energy Savings"—Solar Energy vol. 52, No. 3 pp. 169-175.

May 16, 2005—Enrique et al., "Theoretical assessment of the maximum power point tracking efficiency of photovoltaic facilities with different converter topologies"—Solar Energy 81 (2007) p. 31-38.

Dehbonei, Hooman "Power Conditioning for Distrbuted Renewable Energy Generation"—Curtin University of Technology, School of Electrical and Computer Engineering, 2003 568 pages Dissertation: Thesis. Abstract, 1 page—retrieved on Nov. 13, 2017 on https://books.google.com/books/about/Power_Conditioning_for_Distributed_Renew.html?id=3wVXuAAACAAJ.

Korean Patent Application No. 102005-7008700, filed May 13, 2015. Applicant: Exar Corporation.

Jan. 23, 2018—EP Search Report, EP App No. 17187230.2.

Nov. 2, 2017—EP Search Report App No. 13157876.7.

Nov. 7, 2017—EP Search Report—App No. 17171489.2.

Chinese Office Action—CN 201510423458.2—dated Jan. 3, 2017 (english translation provided).

Chinese Office Action—CN 201410098154.9—dated Mar. 3, 2017 (enligsh translation provided).

European Search Report—EP Appl. 13150911.9—dated Apr. 7, 2017.

Howard et al, "Relaxation on a Mesh: a Formalism for Generalized Localization." Proceedings of the IEEE/RSJ International Conference on Intelligent Robots and Systems (IROS 2001). Wailea, Hawaii, Oct. 2001.

Chinese Office Action and Search Report—CN 201510578586.4—dated Apr. 19, 2017.

Apr. 16, 2018—EP Examination Report 12707899.6.

Jun. 6, 2018—EP Search Report EP App No. 18151594.1.

Jun. 29, 2018—EP Search Report—EP App No. 18175980.4.

Aug. 9, 2010, Hong, Wei, et al., "Charge Equalization of Battery POwer Modules in Series" The 2010 International Power Electronics Conference, IEEE, p. 1568-1572.

\* cited by examiner

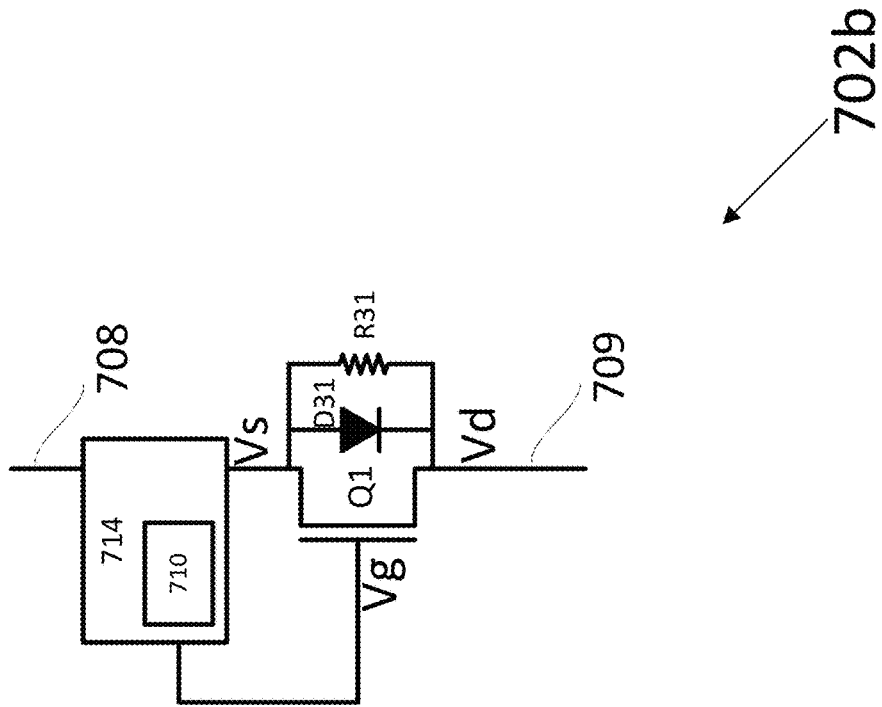
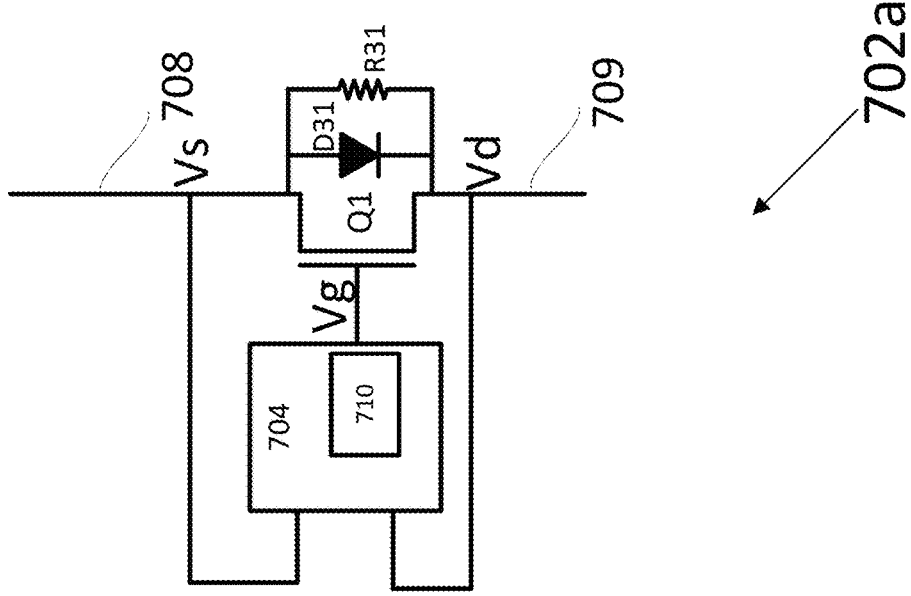
Fig. 7B
Fig. 7A

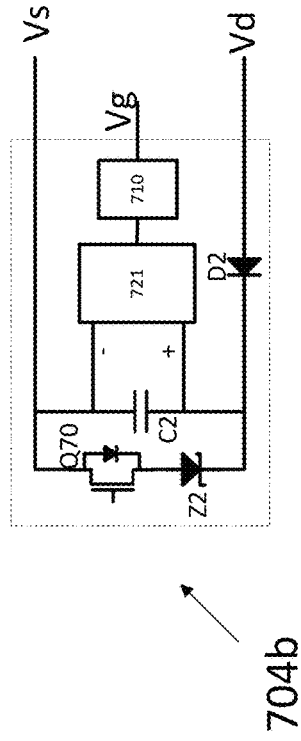
Fig. 7E
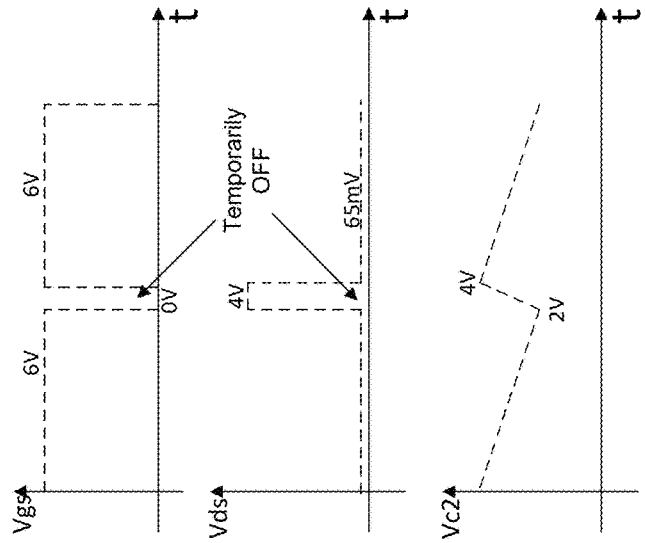
Fig. 7F
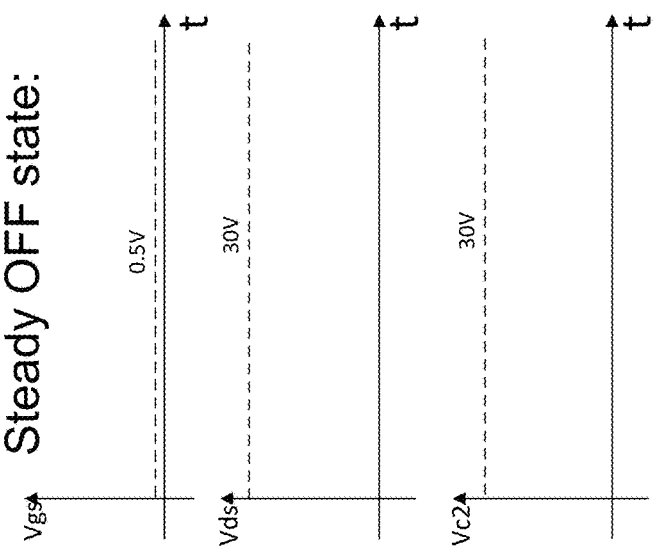

704c

SAFETY SWITCH FOR PHOTOVOLTAIC SYSTEMS

CROSS-REFERENCE TO RELATED APPLICATIONS

The present application claims priority to U.S. provisional patent application Ser. No. 62/318,303, filed Apr. 3, 2016, entitled "Optimizer Garland," hereby incorporated by reference in its entirety. Additionally, the present application claims priority to U.S. provisional patent application Ser. No. 62/341,147, filed May 25, 2016, entitled "Photovoltaic Power Device and Wiring," hereby incorporated by reference in its entirety.

BACKGROUND

Safety regulations may require disconnecting and/or short-circuiting one or more photovoltaic (PV) generators or other components in case of an unsafe condition occurring in a photovoltaic installation. For example, safety regulations require that in case of an unsafe condition (e.g. a fire, a short-circuit, carrying out of maintenance work), the maximum voltage at any point in a photovoltaic installation may not exceed a safe voltage level. In some photovoltaic systems, it may be necessary to disconnect and/or short-circuit one or more photovoltaic generator(s) to achieve the safe voltage requirement. While photovoltaic systems may be deployed for tens of years, safety regulations may change at shorter time intervals (e.g. every several years). It would be advantageous to have a controllable safety switch which may be controlled to disconnect or short-circuit a PV generator in case of a safety hazard, and which may be controlled to reconnect the photovoltaic generator once the system is safe again. It would be desirable for controllable safety switches to be cost-effective and easily deployed.

SUMMARY

The following summary is a short summary of some of the inventive concepts for illustrative purposes only, and is not intended to limit or constrain the inventions and examples in the detailed description. One skilled in the art will recognize other novel combinations and features from the detailed description.

Embodiments herein may employ safety switches and associated apparatuses and methods for controlling currents through branches and/or voltages at nodes in photovoltaic (PV) installations.

In illustrative embodiments comprising one or more electrical systems, a group of electrical safety switches may be electrically connectable to a plurality of electrical power sources. The electrical safety switches may be controllable to maintain safe operation of the electrical systems.

In illustrative electrical systems, a safety switch may be deployed between serially-connected photovoltaic generators in a photovoltaic installation. In some embodiments, safety switches may be installed between each pair of PV generators. In some embodiments, the number and location of safety switches may be chosen with regard to current safety regulations, and in some embodiments, the number and location of safety switches may be chosen with regard to anticipated "worst-case" safety regulations. For example, in locales where adding, reconfiguring and/or removing system components is easy and inexpensive, safety switches may be deployed in a PV installation in accordance with the safety regulations at the time the installation was built. In locales where adding, reconfiguring and/or removing system components may be difficult or expensive, safety switches may be deployed in a manner that complies with a "worst-case" (i.e. most stringent) prediction of future regulations.

Illustrative safety switches according to some embodiments may be retrofit to existing photovoltaic installations and components. Illustrative safety switches according to some embodiments may be integrated in other PV system components (e.g. connectors, PV generators, power devices, combiner boxes, batteries and/or inverters), potentially reducing the cost of design and manufacturing of the safety switches, and increasing In some embodiments, auxiliary power circuits are used to provide power to safety switches and associated controllers. In some embodiments, safety switches are located at system points which do not carry significant electrical power when the safety switches are in a particular state (e.g., when safety switches are in the ON state). Illustrative auxiliary power circuits are disclosed herein, along with associated methods for providing power to the auxiliary power circuits and safety switches regardless of the state of the safety switches.

In some embodiments, components and design of safety switches may be selected to regulate or withstand electrical parameters when illustrative safety switches are in the ON or OFF states. For example, some illustrative safety switches may comprise shunt resistors sized to regulate electrical current flowing through safety switches when the safety switches are in the OFF position.

Further embodiments include photovoltaic power devices comprising internal circuitry configured to limit a voltage between input terminals to the photovoltaic power devices in case of a potentially unsafe condition while continuously providing operational power to the photovoltaic power devices.

Further embodiments include electrical circuits for interconnecting photovoltaic generators and photovoltaic power devices configured to limit a voltage between various system nodes while continuously providing operational power to the photovoltaic power devices.

Further embodiments include a chain of preconnected photovoltaic power devices with associated safety switches, which may provide a cost-effective, easy way to wire a photovoltaic generation system along with associated safety switches.

In some embodiments, safety switches may be in communication with accompanying system devices, such as system control devices and/or end-user devices such as graphical user interfaces for monitoring applications.

Further embodiments include user interfaces for monitoring the state of and parameters measured by safety switches in illustrative power systems. A system owner or operator may be able to view a list of system safety switches, associated switch states and electrical parameter measured thereby. In some embodiments, the list may be a graphical user interface (GUI) viewable on a computing device, such as a computer monitor, tablet, smart-television, smartphone, or the like. In some embodiments, the system operator may be able to manually control safety switches (e.g. by pressing buttons).

As noted above, this Summary is merely a summary of some of the features described herein and is provided to introduce a selection of concepts in a simplified form that are further described below in the Detailed Description. The Summary is not exhaustive, is not intended to identify key features or essential features of the claimed subject matter and is not to be a limitation on the claims.

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures.

FIGS. 7A-7C illustrate circuits for providing operational power to a safety switch according to various aspects of the present disclosure.

FIG. 7F illustrates a timing diagram depicting some of the operational parameters of a safety switch according to various aspects of the present disclosure.

DETAILED DESCRIPTION

In the following description of various illustrative embodiments, reference is made to the accompanying drawings, which form a part hereof, and in which is shown, by way of illustration, various embodiments in which aspects of the disclosure may be practiced. It is to be understood that other embodiments may be utilized and structural and functional modifications may be made, without departing from the scope of the present disclosure.

Figure 1A:
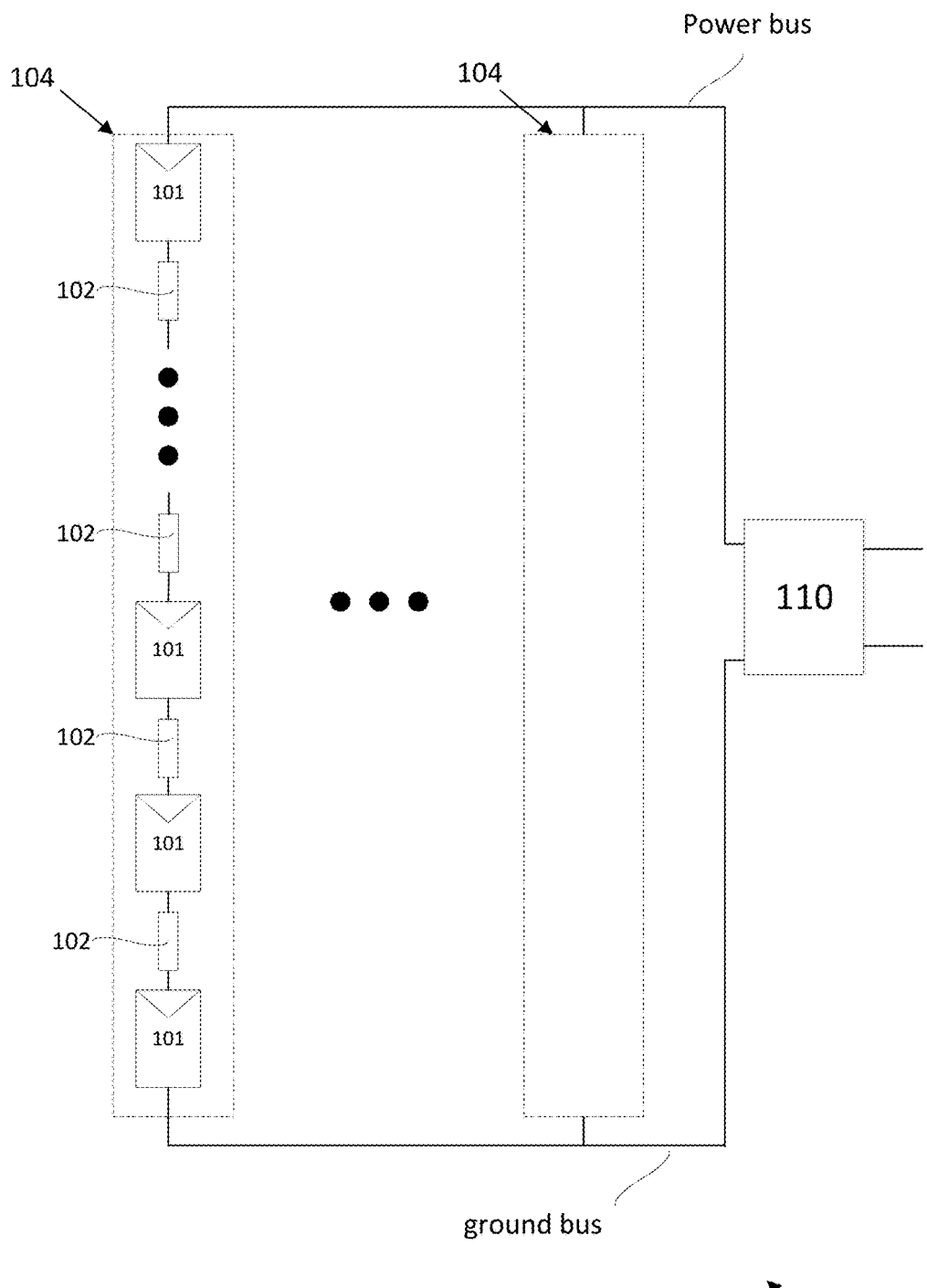
FIG. 1A illustrates a photovoltaic system configuration according to various aspects of the present disclosure.

Reference is now made to FIG. 1A, which shows a photovoltaic (PV) system according to illustrative embodiments. PV system 100 may comprise a plurality of PV strings 104 coupled in parallel between a ground bus and a power bus. Each of PV strings 104 may comprise a plurality of serially-connected PV generators 101 and a plurality of safety switches 102. PV generators 101 may comprise one or more photovoltaic cells(s), module(s), panel(s) or shingle(s). In some embodiments, PV generators 101 may be replaced by direct current (DC) batteries or alternative direct current or alternating current (AC) power sources.

In the illustrative embodiment of FIG. 1A, a safety switch 102 is disposed between each pair of PV generators 101. In some embodiments (e.g. the embodiment shown in FIG. 2) a safety switch 102 may be disposed between groups of more than one serially-connected PV generators. Safety switch 102 may comprise a control device and a communication device, and may be operated to disconnect adjacent PV generators when receiving (e.g. via the communication device) a command to disconnect PV generators.

In some embodiments, the power and ground buses may be input to system power device 110. In some embodiments, system power device 110 may include a DC/AC inverter and may output alternating current (AC) power to a power grid, home or other destinations. In some embodiments, system power device 110 may comprise a combiner box, transformer and/or safety disconnect circuit. For example, system power device 110 may comprise a DC combiner box for receiving DC power from a plurality of PV strings 104 and outputting the combined DC power. In some embodiments, system power device 110 may include a fuse coupled to each string 104 for overcurrent protection, and/or one or more disconnect switches for disconnecting one or more PV strings 104.

In some embodiments, system power device 110 may include or be coupled to a control device and/or a communication device for controlling or communicating with safety switches 102. For example, system power device 110 may comprise a control device such as a microprocessor, Digital Signal Processor (DSP) and/or a Field Programmable Gate Array (FPGA) configured to control the operation of system power device 110. In some embodiments, system power device 110 may comprise multiple interacting control devices. System power device 110 may further comprise a communication device (e.g. a Power Line Communication circuit and/or a wireless transceiver) configured to communicate with linked communication devices included in safety switches 102. In some embodiments, system power device 110 may comprise both a control device and a communication device, the control device configured to determine desirable modes of operation for PV power devices (e.g. power devices 103), and the communication device configured to transmit operational commands and receive reports from communication devices included in the PV power devices.

System power device 110 may be coupled to any number of other devices and/or systems such as PV systems 100 (e.g., various discrete and/or interconnected devices such as disconnect(s), PV cell(s)/array(s), inverter(s), micro inverter(s), PV power device(s), safety device(s), meter(s), breaker(s), AC main(s), junction box(es), camera etc.), network(s)/Intranet/Internet, computing devices, smart phone devices, tablet devices, camera, one or more servers which may include data bases and/or work stations. System power device 110 may be configured for controlling the operation of components within PV system 100 and/or for controlling the interactions with other elements coupled to PV system 100.

In some embodiments, the power and ground buses may be further coupled to energy storage devices such as batteries, flywheels or other energy storage devices.

Safety regulations may define a maximum allowable voltage between the ground bus and any other voltage point in PV system 100, during both regular operating conditions and during potentially unsafe conditions. Similarly, safety regulations may define a maximum allowable voltage between any two voltage points in PV system 100. In some scenarios, an unsafe condition in PV system 100 may require disconnecting or short-circuiting one or more of the PV generators 101 in a PV string 104.

As a numerical example, an illustrative PV string 104 may comprise 20 serially-connected PV generators 101. Each PV generator 101 may have an open-circuit voltage of 45V. In case of an unsafe condition (e.g. a fire, detection of an arc or a dangerous short-circuit somewhere in PV system 100), safety regulations may require that system power device 110 cease drawing power from PV string 104, resulting in an open-circuit voltage of 45·20=900V across PV string 104. Safety regulations may further require that in case of an unsafe condition, the maximum voltage between any two points in PV system 100 may not exceed, for example, 80V. To comply with safety regulations, safety switches 102 may disconnect the plurality of PV generators 101 comprising PV string 104, resulting in PV generators 101 (excluding the PV generators 101 coupled to the ground and power buses) having a "floating" voltage with regard to ground, and a voltage drop of about 45V between the two terminals of each PV generator.

In some embodiments, system power device 110 may respond to a potentially unsafe system condition by limiting the voltage across each PV string 104. For example, system power device 110 may comprise an inverter configured to regulate a voltage of about 60V across each PV string 104 in case of a potentially unsafe condition.

Figure 1B:
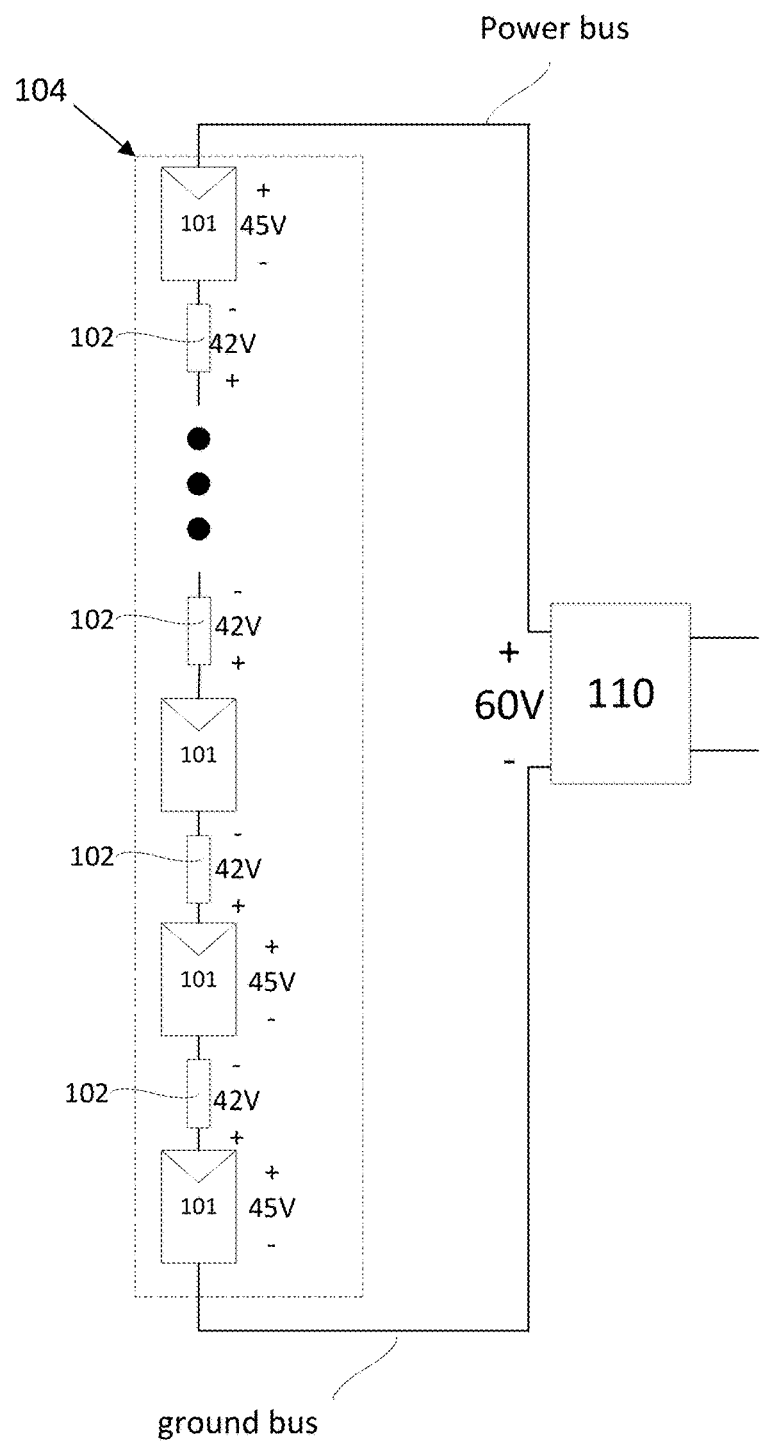
FIG. 1B illustrates a photovoltaic system configuration according to various aspects of the present disclosure.

Reference is now made to FIG. 1B, which illustrates a single PV string 104 coupled to system power device 110. In case of a potentially unsafe system condition, safety switches 102 may disconnect (i.e. each switch may move to the OFF state), and system power device 110 may apply a voltage to PV string 104. In the numerical example of FIG. 1B, each PV generator is assumed to be operating at an open-circuit voltage of 45V, and system power device 110 may apply a voltage of 60V across PV string 104. Safety switches 102, in accordance with embodiments disclosed herein, may be configured to provide and withstand a voltage drop of opposite polarity to the PV generators. In the numerical example of FIG. 1B, PV string 104 comprises twenty PV generators 101 and twenty safety switches 102. Each PV generator has a positive voltage drop of 45V, and each safety switch 102 has a negative voltage drop of 42V, providing a string voltage of (45−42)·20=60V. It may be noted that the voltage drop between each pair of locations in the PV system does not exceed 60V.

It is to be noted that the ratio of photovoltaic generators to safety switches, and the location of safety switches, may change depending on electrical parameters of photovoltaic generators and safety regulations. For example, if low-voltage PV generators (e.g. PV generators having an open-circuit voltage of 10V) are used as PV generators 101, and safety regulations allow a maximum point-to-point voltage of 55V in case of a potentially unsafe condition, a single safety switch 102 may be disposed per five PV generators 101. If safety regulations are changed to allow a maximum point-to-point voltage of 45V in case of a potentially unsafe condition, additional safety switches 102 may be added.

Safety switches 102 may comprise a resistor for regulating current through safety switches 102 when the switches are in the OFF state. For example, each of safety switches 102 may comprise a shunt resistor (e.g. resistor R31 of FIG. 3) having a resistance of about 1 kΩ, to regulate the OFF-state current to be about 42V/1 kΩ=42 mA. In general, the value of a shunt resistor may vary according to expected OFF-state voltages and currents, and may be between 10Ω and 5 kΩ.

In some embodiments, the values may vary depending on the regulated voltage provided by system power device 110 and the open-circuit voltage of each PV generator 101. For example, string 104 may comprise ten PV generators, and ten safety switches, each PV generator having an open-circuit voltage of 30V, and system power device 110 may provide a voltage of 50V across PV string 104. In that case, each safety switch may be operated to have a negative voltage of 25V, providing the String voltage of (30−25)·10=50V.

Figure 2:
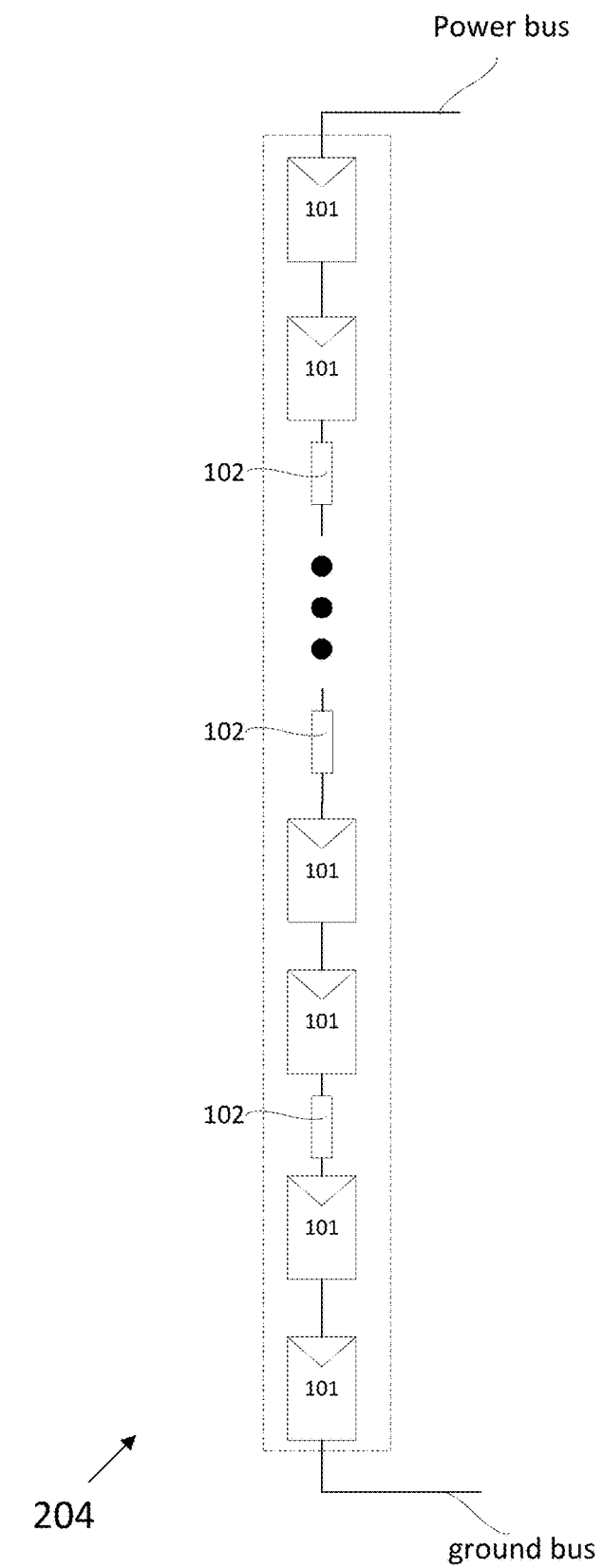
FIG. 2 illustrates part of a photovoltaic system configuration according to various aspects of the present disclosure.

Reference is now made to FIG. 2, which shows a photovoltaic string according to illustrative embodiments. PV string 204 may comprise a plurality of PV generators 101 and safety switches 102. PV generators 101 may be similar to or the same as PV generators 101 of FIG. 1A, and safety switches 102 may be similar to or the same as safety switches 102 of FIG. 1. Safety switches 102 may be installed between each pair of PV generators 101, such that each PV generator 101 (excluding the PV generators connected to the ground and power buses) has a first terminal connected to a different PV generator 101 and a second terminal connected to a safety switch 102. The arrangement illustrated in FIG. 2 may be appropriate in systems where the maximum allowed safe voltage is greater than or equal to double the open-circuit voltage of a single PV generator 101. For example, if each PV generator 101 has an open-circuit voltage of 45V and the maximum allowed safe voltage is 100V, or each PV generator 101 has an open-circuit voltage of 30V and the maximum allowed safe voltage is 80V, the arrangement illustrated in FIG. 2 may reduce costs by reducing the required number of safety switches while still complying with safety regulations.

Figure 3:
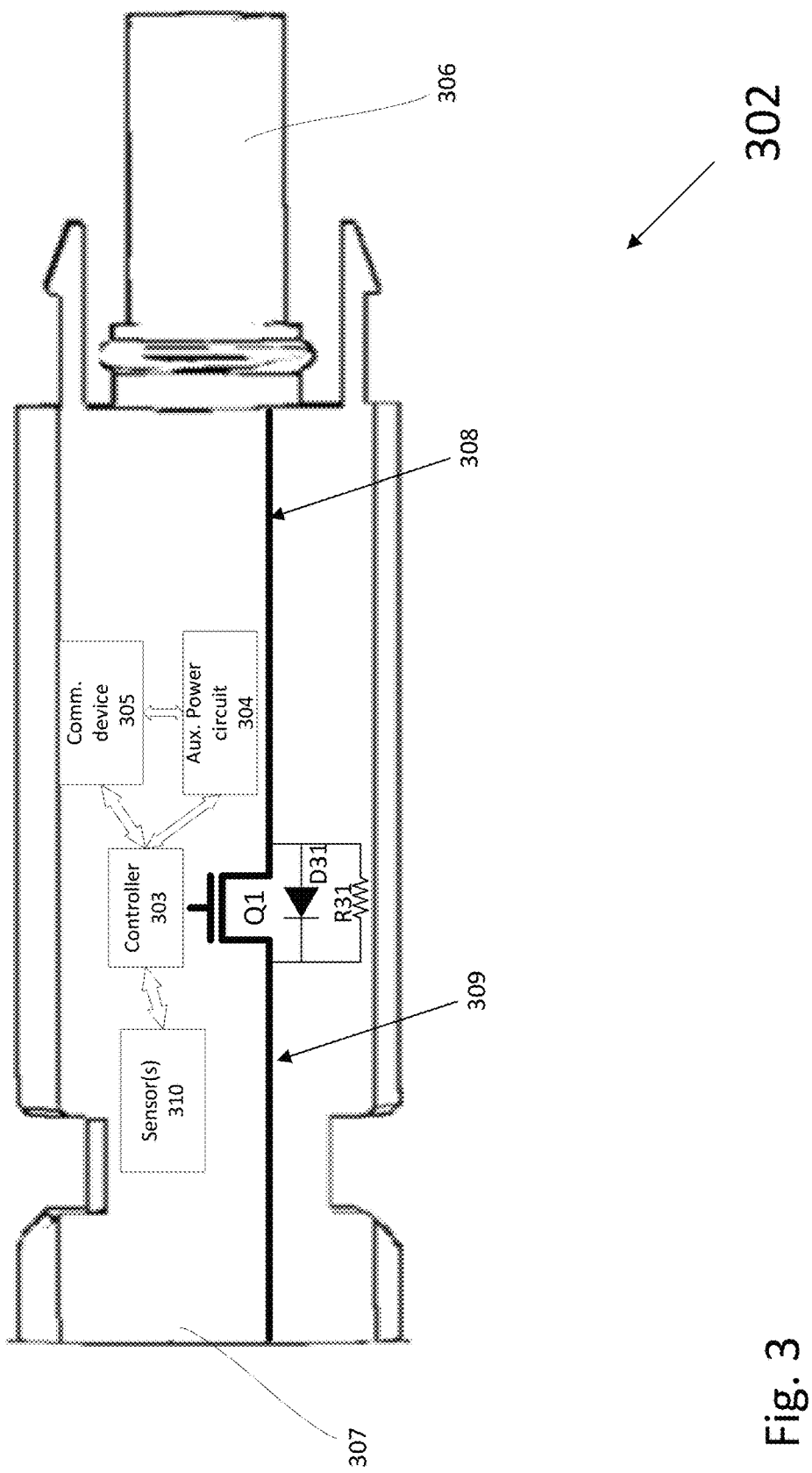
FIG. 3 illustrates a safety switch according to various aspects of the present disclosure.

Reference is now made to FIG. 3, which illustrates a safety switch according to illustrative embodiment. Safety switch 302 may be used as safety switch 102 in FIG. 1A and FIG. 2. Safety switch may comprise male connector 306 and female connector 307, male connector 306 designed to fit a female connector features by a PV generator (e.g. PV generator 101) and female connector 307 designed to fit a male connector features by a PV generator. Conductor 308 may provide an electrical connection to male connector 306, and conductor 309 may provide an electrical connection to female connector 307. In some embodiments, various interconnecting connectors may be used. Safety switch 302 may include a switching element disposed between conductor 308 and conductor 309. In the illustrative embodiment of FIG. 3, transistor Q1 may be used as a switching element disposed between conductor 308 and conductor 309. Safety switch 302 may further include controller 303 for controlling the operation of transistor Q1. Transistor Q1 may be realized using various electrical devices, such as Metal- Oxide-Semiconductor Field Effect Transistor (MOSFET), Insulated Gate Bipolar Junction transistor (IGBT), Bipolar Junction Transistor (BJT), Junction gate field-effect transistor (JFET) or other appropriate devices. In some embodiments, transistor Q1 may be realized using multiple transistors connected in parallel, to improve electrical performance (e.g. to reduce losses). In the illustrative embodiments disclosed herein, transistor Q1 and similar switching elements will be assumed to be MOSFETs comprising a body diode. Diode D31 may be the body diode of transistor Q1. In some embodiments (e.g. in case Q1 is a MOSFET comprising a low-quality body diode) a separate diode may be coupled in parallel to diode D31 to function as an alternative bypass diode. Diode D31 may be oriented to prevent forward bias of diode D31 when the transistor is in the OFF position. Resistor R31 may be disposed across the terminals of transistor Q1. Resistor R31 may be sized to regulate the OFF-state resistance across the terminals of transistor Q1. For example, if the anticipated OFF-state voltage drop across transistor Q1 is 40V, and the desired OFF-state leakage current through safety switch 302 is 20 mA, R31 may be about 40V/20 mA=2000Ω. In some embodiments, R31 might not be featured (e.g. if there is no need or desire to regulate the OFF-state leakage current).

Safety switch 302 may comprise communication device 305 for communicating with other devices and controller 303 for controlling the operation (e.g. turning ON and OFF) of transistor Q1. Controller 303 may be an analog circuit, microprocessor, Digital Signal Processor (DSP), Application-Specific Integrated Circuit (ASIC) and/or a Field Programmable Gate Array (FPGA). In some embodiments, communication device 305 may receive a command from an external device to change the state of transistor Q1, and communication device 305 may convey the command to controller 303. Communication device 305 may communicate with external devices using various technologies such as Power Line Communications (PLC), acoustic communications transmitted over conductors 308 and 309, and wireless communication protocols (e.g. Wi-Fi™, ZigBee™, Bluetooth™, cellular communications, etc.).

Auxiliary power circuit 304 may be coupled to conductors 308 and/or 309, and may provide power to controller 303, sensor/sensor interface(s) 310 and/or communication device 305. Auxiliary power circuit 304 may be variously realized, with illustrative embodiments disclosed herein (e.g. in FIGS. 7A-7C, 7E, 7H). In some embodiments, two or more of controller 303, auxiliary power circuit 304 and communication device 305 may be integrated as a single unit. For example, in FIG. 7C, communication device 305 may receive a PLC signal which also provides power to controller 303.

In some embodiments, safety switch 302 may further comprise measurement sensor(s) and/or sensor interface(s) 310 for measuring parameters such as current, voltage and/or temperature. For example, sensor/sensor interface(s) 310 may include a current sensor for measuring the current through conductor 308 or conductor 309, and/or a voltage sensor for measuring the voltage drop across transistor Q1, and/or a temperature sensor for measuring the temperature at or near male connector 306, female connector 307 and/or transistor Q1. In some embodiments, sensor(s)/sensor interface(s) 310 may provide measurements to controller 303, with controller 303 configured to take action (e.g. change the state of transistor Q1) according to the measurements received. For example, controller 303 may be configured to set the state of Q1 to OFF if a high current is measured through conductor 309, or if a high temperature is measured near male connector 306. In some embodiments, controller 303 may provide the measurements obtained from sensor(s)/sensor interface(s) 310 to communication device 305, with communication device 305 configured to transmit the measurements to a system controller or data-collection device (not explicitly depicted), such as system power device 110 of FIG. 1. In some embodiments, sensor(s)/sensor interface(s) 310 may provide measurements directly to communication device 305, bypassing controller 303.

It should be noted that while a preferred embodiment of the disclosure includes providing transistor Q1 for safety features (e.g. the ability to disconnect two PV generators from each other), other embodiments included herein might not include transistor Q1. Sensor/sensor interface(s) 310, auxiliary power circuit 304 and communication device 305 may be combined to provide measurement and data-reporting features even without the safety advantages (e.g. ability to disconnect a photovoltaic generator) provided by safety transistor Q1.

Figure 4A:
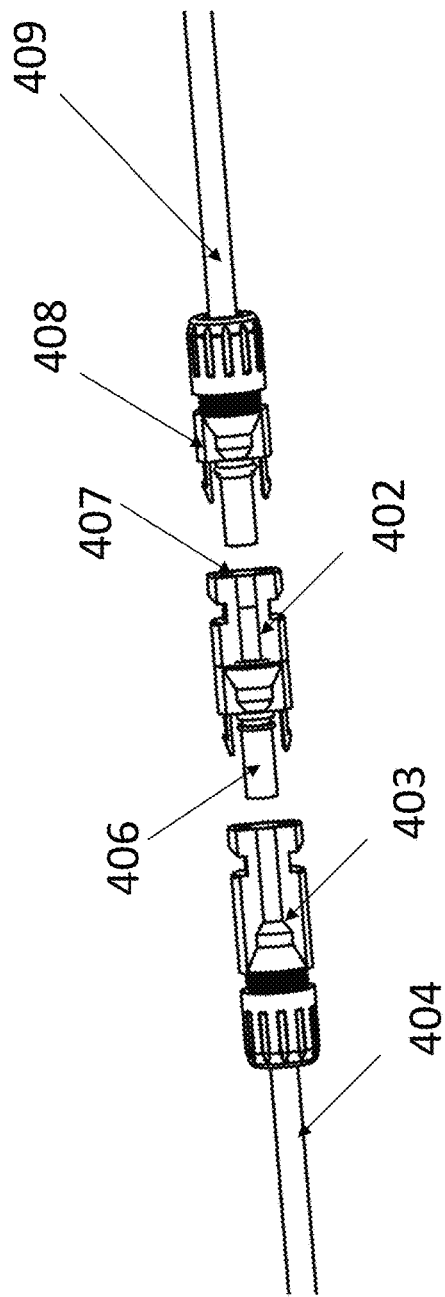
FIGS. 4A-4B illustrate a safety switch according to various aspects of the present disclosure.
Figure 4B:
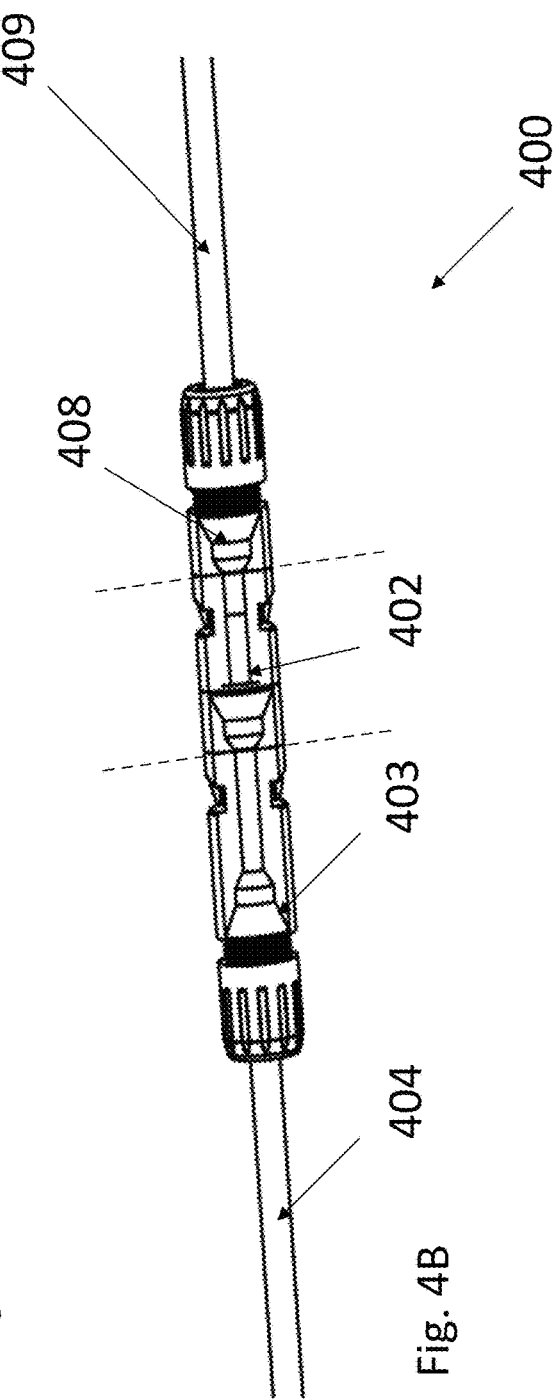

Reference is now made to FIGS. 4A-4B, which illustrates the connectivity of a safety switch according to illustrative embodiments. Safety switch 402 may be similar to or the same as safety switch 302 of FIG. 3. Safety switch 402 may comprise male connector 406 for connecting to connector 403, with connector 403 connected to conductor 404 which carries power generated by a first PV generator (not explicitly depicted). Similarly, safety switch 402 may comprise female connector 407 for connecting to connector 408, with connector 408 connected to conductor 409 which carries power generated by a second PV generator (not explicitly depicted). In some conventional photovoltaic systems, the first and second photovoltaic generators may be serially connected by connecting connector 403 to connector 408. Safety switch 402 may be designed to seamlessly connect to connector 403 on one end and to connector 408 on the other end, adding safety-disconnect, control and/or monitoring features to a photovoltaic installation, either during construction of the installation or as a retrofit feature at a later time.

FIG. 4A shows safety switch 402 along with connectors 408 and 403 prior to connecting, according to illustrative embodiments, while FIG. 4B shows connection point 400 comprising safety switch 402 connected to connectors 408 and 403 (the component boundaries indicated by dashed lines).

In some embodiments, advantages may be obtained by integrating safety switch 402 into a photovoltaic generator connector or a PV generator junction box. For example, safety switch 402 may be built into connector 403 or connector 408 of a PV generator, providing safety switching functionality in a PV generator without necessitating additional components and connections. Integrating safety switches in PV generator connectors or junction boxes may reduce costs (e.g. by not requiring a separate enclosure and connectors for the safety switch) and simplify installation (since no additional components need be connected).

Figure 5A:
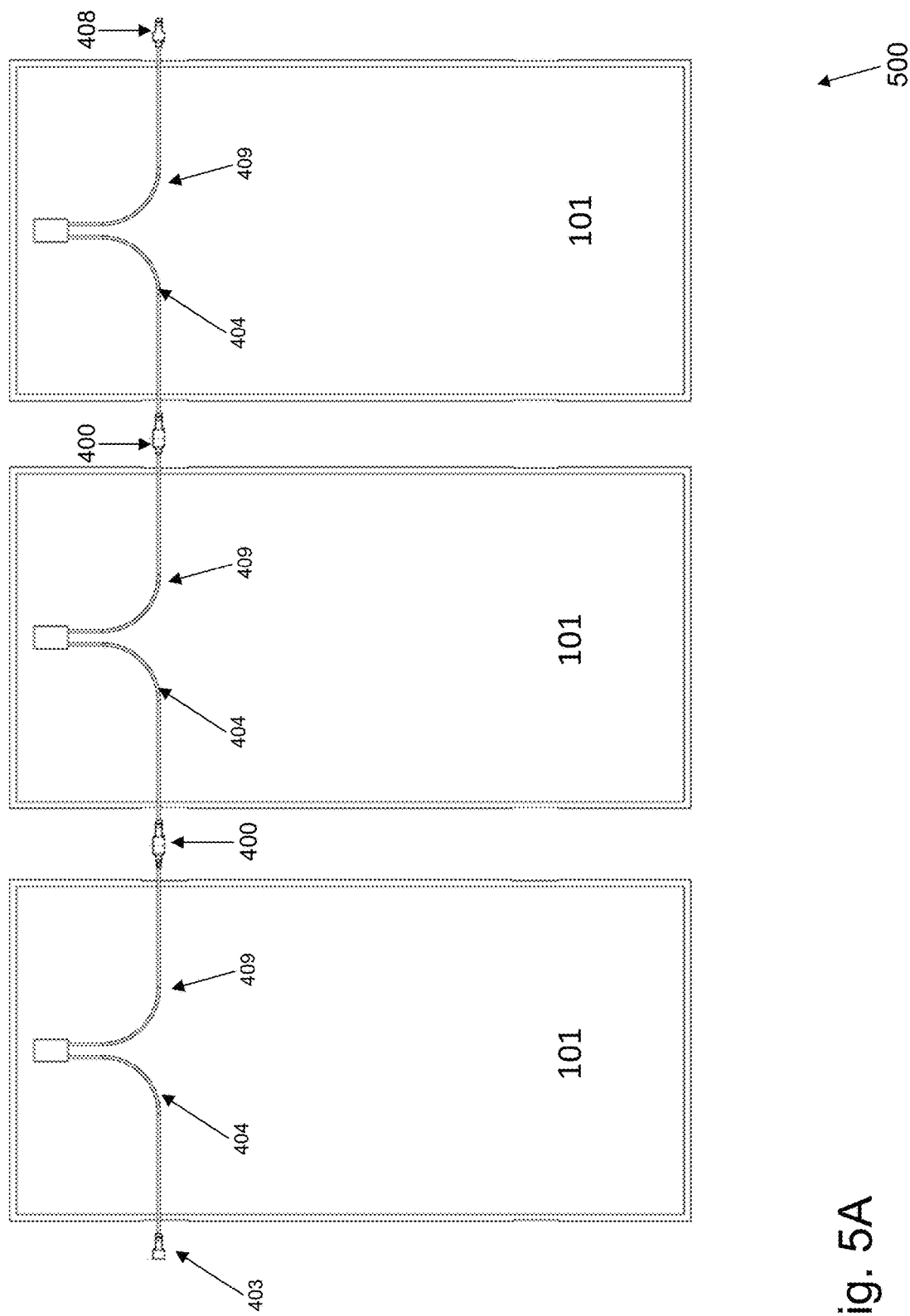
FIG. 5A illustrates part of a photovoltaic system configuration according to various aspects of the present disclosure.

Reference is now made to FIG. 5A, which shows part of a photovoltaic (PV) string featuring a safety switch according to illustrative embodiments. PV string 500 may be part of a string of PV generators 101 (e.g. part of a string similar to or the same as PV string 104 of FIG. 1A, comprising generators similar to or the same as PV generators 101 of FIG. 1A and FIG. 2) connected to each other via connection points 400. Connection points 400 may be similar to or the same as connection point 400 of FIG. 4A and FIG. 4B, and may include a safety switch (e.g. safety switch 402) coupled in between two PV generator connectors (e.g. connectors 403 and 408). Each PV generator 101 may comprise conductors 404 and 409 for carrying photovoltaic power from PV cells comprising the PV generator, and connectors 403 and 408 for connecting to safety switch 402.

Figure 5B:
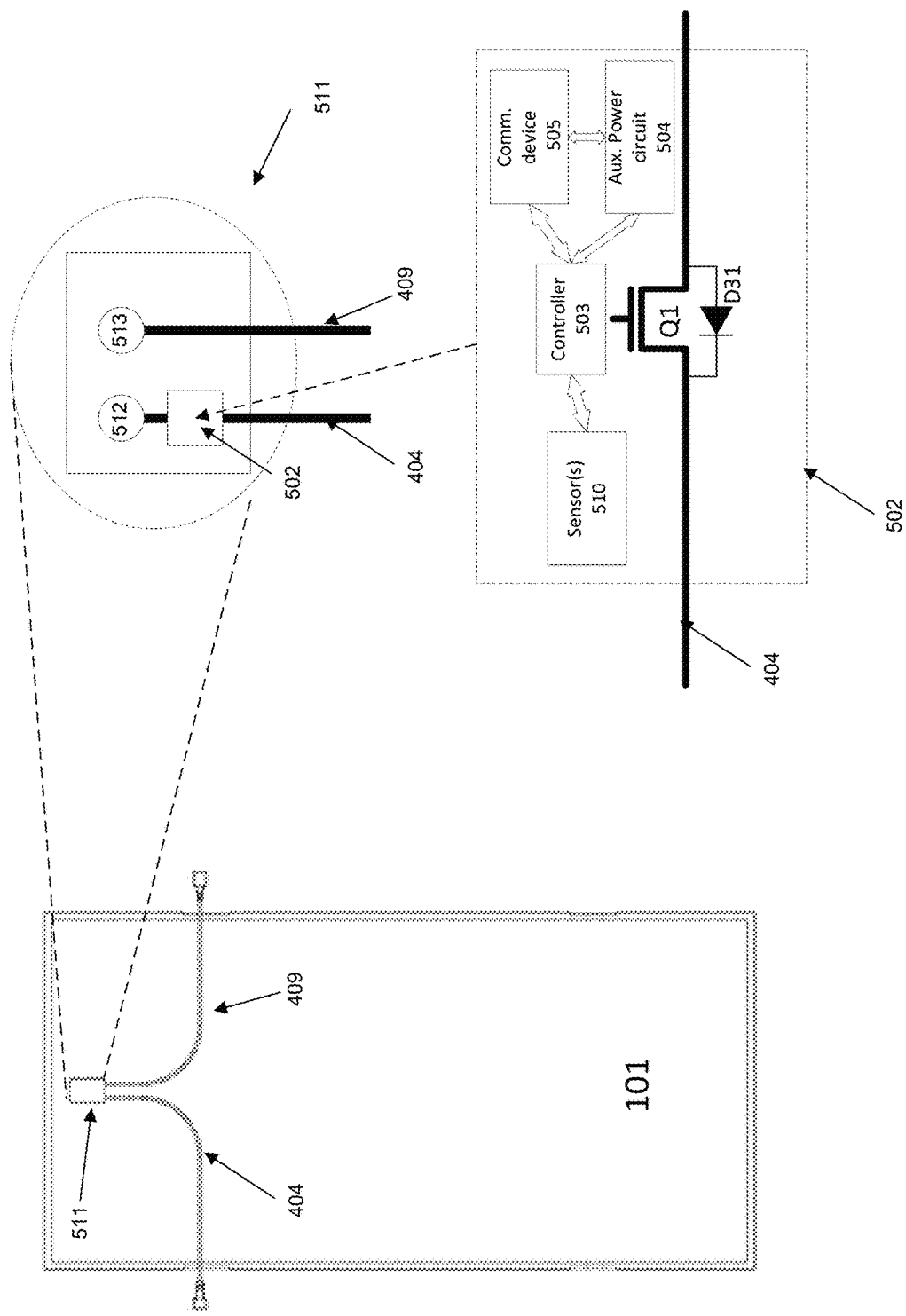
FIG. 5B illustrates a photovoltaic generator according to various aspects of the present disclosure.

Reference is now made to FIG. 5B, which illustrates a PV generator comprising a safety switch according to illustrative embodiments. PV generator 101 may comprise junction box 511 and conductors 404 and 409. FIG. 5B may illustrate the back side on a PV generator, with PV cells mounted on the front side of the PV generator (not explicitly shown). In some embodiments, PV cells may be mounted on both sides of the PV generator, or the back side of the PV generator may be constructed to allow solar irradiance to reach the PV cells from both sides of the PV generator. Junction box 511 may comprise electrical connections 512 and 513 for collecting photovoltaic power from the PV cells, and providing the photovoltaic power via conductors 409 and 404.

In illustrative embodiments disclosed herein, safety switch 502 may be disposed between conductor 404 and electrical connection 512. Safety switch 502 may be functionally similar or the same as safety switch 302 of FIG. 3, without requiring the physical enclosure and connectors 306 and 307. Transistor Q1, diode D31, sensor(s)/sensor interfaces 510, controller 503, communication device 505 and/or auxiliary power circuit 504 may be integrated in junction box 511. In some embodiments, a resistor may be coupled across the terminals of transistor Q1 (similarly to resistor R31 of FIG. 3) for regulating the OFF-state current through safety switch 502. In some embodiments, auxiliary power circuit 504 may be coupled between conductors 404 and 409 for receiving photovoltaic power generated by PV generator 101, and may provide power to controller 503, communication device 505 and/or sensor(s)/sensor interfaces 510.

Figure 9:
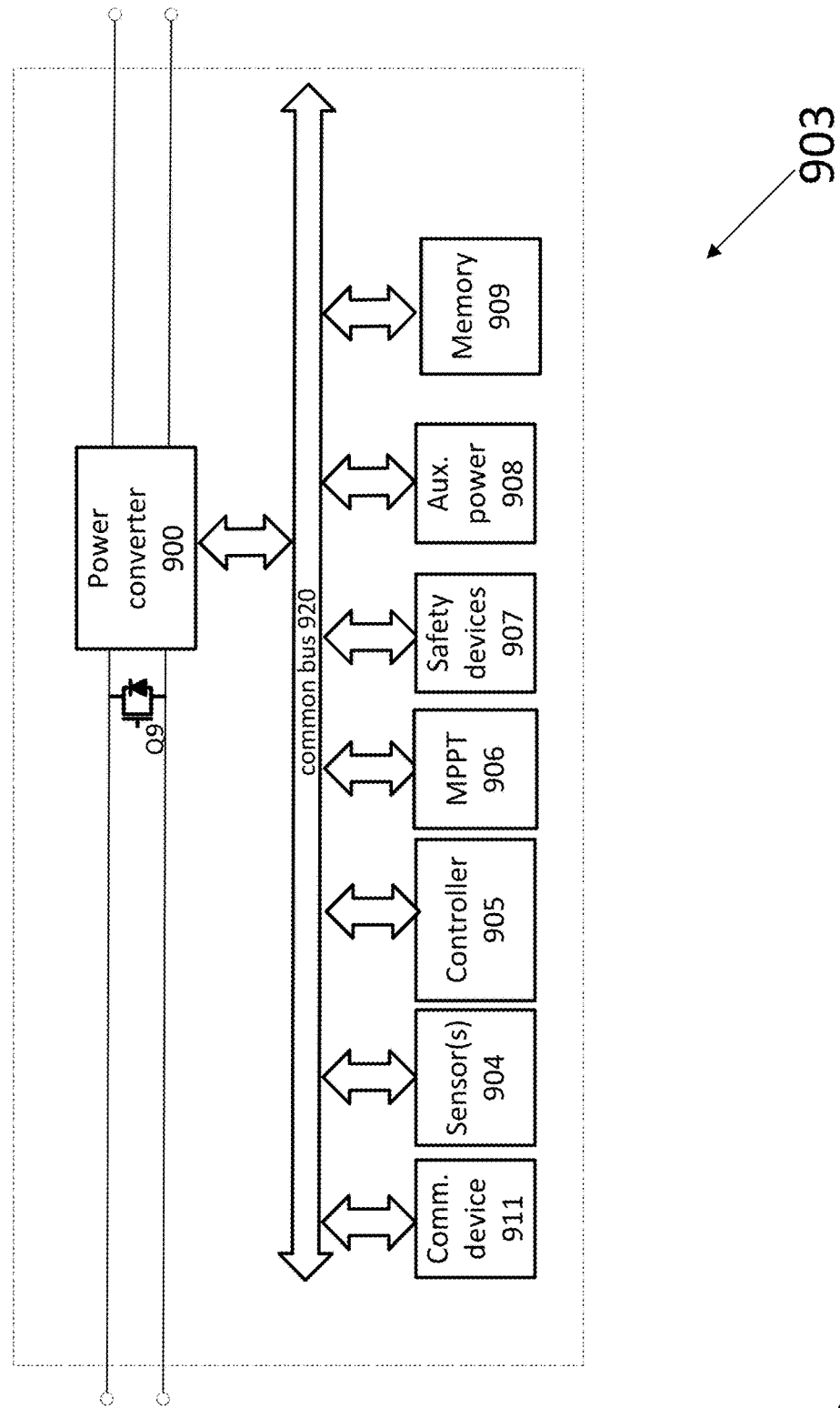
FIG. 9 illustrates a photovoltaic power device according to various aspects of the present disclosure.

In some embodiments, junction box 511 may further include an integrated PV power device similar to or the same as PV power device 903 of FIG. 9. PV power device 903 may be coupled between conductors 404 and 409 and electrical connections 512 and 513. For example, power converter 900 of FIG. 9 may receive power from electrical connections 512 and 513, and may output power to conductors 404 and 409. Safety switch 502 may be disposed between PV power device 903 and electrical connection 512, or, in some embodiments, may be integrated into PV power device 903.

Figure 6:
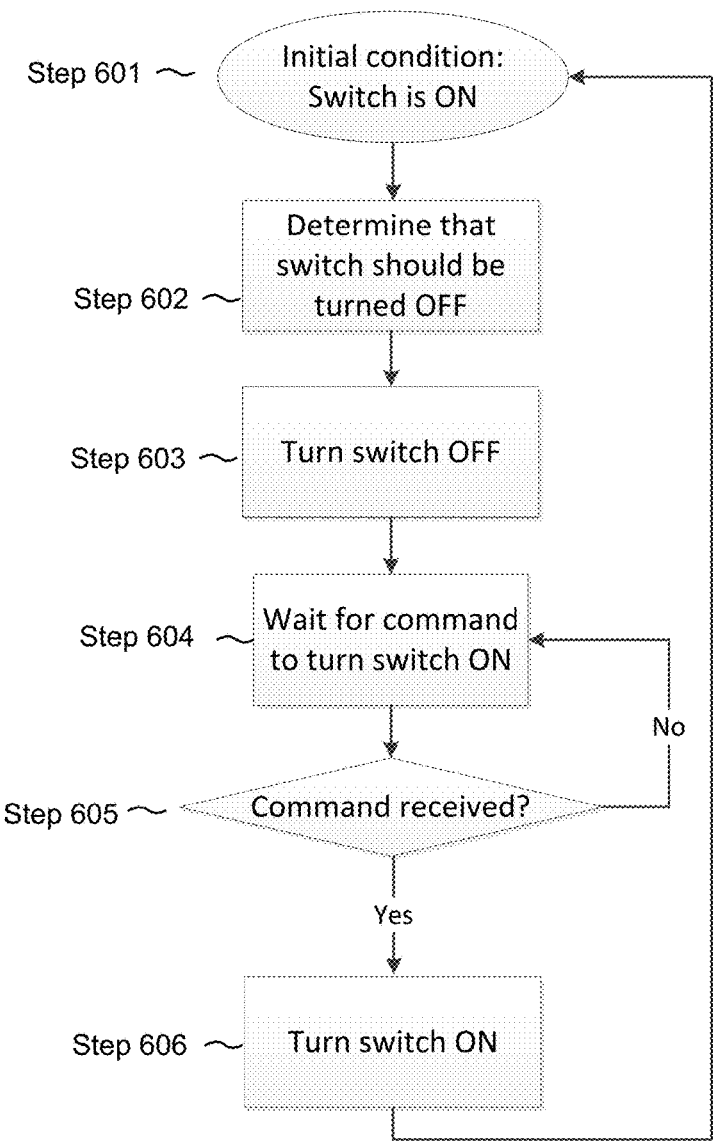
FIG. 6 illustrates a method for operating a safety switch according to various aspects of the present disclosure.

Reference is now made to FIG. 6, which shows a method for operating a safety switch (e.g. safety switch 102 of FIG. 1A, safety switch 302 of FIG. 3). Method 600 may be carried out by a controller similar to or the same as controller 303 of FIG. 3. At step 601, the initial condition may be that the switch is in the ON state, allowing current to flow between the two conductors coupled to the switch (e.g. conductors 404 and 409 of FIG. 5A). During step 601, an auxiliary power circuit coupled to the safety switch may provide power to the controller and/or a gate driver for maintaining the switch in the ON state (for example, some types of transistors implementing safety switches may be "normally OFF", in which case the auxiliary power circuit may power a voltage signal applied to a transistor gate node to maintain the ON state). At step 602, the controller may receive a command to turn the switch to the OFF state. In some embodiments, the command may be received via a communication device (e.g. communication device 305) in communication with a system control device. In some embodiments, at step 602, instead of receiving a command to turn the switch to the OFF state, the controller may independently determine that an unsafe condition may be present (e.g. due to sensor reporting high current or temperature, or a sensor detecting a rapid change in current flowing through the switch, or based on comparing two electrical parameters and detecting a substantial mismatch) and determine that the switch should be turned to the OFF state. In some embodiments, a determination that the switch should be turned to the OFF state may be made in response to not receiving a signal. For example, in some illustrative systems, a system control device continuously provides a "keep alive" signal to associated safety switches and PV power devices. Not receiving a "keep alive" signal may indicate a potentially unsafe condition and may cause a determination that the switch should be turned to the OFF state.

Still referring to FIG. 6, at step 603, the controller turns the switch to the OFF state. In some embodiments (e.g. if the switch is a "normally ON" transistor), turning the switch to the OFF state may include applying a voltage to a transistor terminal, and in some embodiments (e.g. if the switch is a "normally OFF" transistor), turning the switch to the OFF state may include ceasing to apply a voltage to a transistor terminal. At step 604, the controller waits to receive a command to turn the switch back to the ON position. Generally, once an unsafe condition has been resolved, a system control device may provide a signal indicating that it is safe to reconnect PV generators and to resume providing power. In some embodiments, at step 604 the controller may independently determine that it is safe to return the switch to the ON position (e.g., due to a sensor reporting that the unsafe condition is no longer present).

At step 605, the controller determines if a command (or, in some embodiments, a self-determination) to turn the switch to the ON state has been received. If no such command (or determination) has been received, the controller carrying out method 600 returns to step 604. If a command (or, in some embodiments, a self-determination) to turn the switch to the ON state has been received, the controller carrying out method 600 proceeds to step 606, turns the switch back to the ON state (e.g. by applying a voltage to a transistor node, or removing an applied voltage from a transistor node) and returns to step 601.

An auxiliary circuit for providing continuous power supply to a safety switch according to embodiments disclosed herein may be variously implemented. Auxiliary power circuits may provide power for operating a safety switch under varying conditions and at various times. For example, auxiliary power circuits may provide operational power to a safety switch at three times: at initial startup (i.e. when the system comprising a safety switch is first deployed), at steady-state ON time (i.e. when the system is up and running, during normal operating conditions, when the switch is ON), and at steady-state OFF time (i.e. when the system is up and running, during a potentially unsafe condition, when the switch is OFF).

Reference is now made to FIG. 7A, which illustrates a safety switch 702a comprising an auxiliary power circuit according to illustrative embodiments. Safety switch 702a may comprise conductors 708 and 709, transistor Q1, controller 710 and auxiliary power circuit 704. Safety switch 702a may further comprise a communication device similar to or the same as communication device 305 of FIG. 3 (not explicitly depicted, to reduce visual noise). Transistor Q1 may be similar to or the same as transistor Q1 described with regard to FIG. 3, resistor R31 may be the same as R31 of FIG. 3, diode D31 may be the same as D31 of FIG. 3, controller 710 may be similar to or the same as controller 303 of FIG. 3, and conductors 708 and 709 may be similar to or the same as conductors 308 and 309, respectively, of FIG. 3.

Auxiliary power circuit 704 may be coupled in parallel to transistor Q1. A first input of auxiliary power circuit 704 may be coupled to conductor 708, and a second input of auxiliary power circuit 704 may be coupled to conductor 709.

In some embodiments, auxiliary power circuit 704 may comprise analog circuitry configured to provide an appropriate control signal to transistor Q1. In some embodiments, auxiliary power circuit 704 may provide power to controller 710, with controller 710 configured to provide a control signal to transistor Q1.

Reference is now made to FIG. 7B, which illustrates a safety switch 702b comprising an auxiliary power circuit according to illustrative embodiments. Safety switch 702b may comprise conductors 708 and 709, transistor Q1, controller 710 and auxiliary power circuit 714. Safety switch 702b may further comprise a communication device similar to or the same as communication device 305 of FIG. 3 (not explicitly depicted, to reduce visual noise). Transistor Q1 may be similar to or the same as transistor Q1 described with regard to FIG. 3, resistor R31 may be the same as R31 of FIG. 3, diode D31 may be the same as D31 of FIG. 3, controller 710 may be similar to or the same as controller 303 of FIG. 3, and conductors 708 and 709 may be similar to or the same as conductors 308 and 309, respectively, of FIG. 3.

Auxiliary power circuit 714 may be coupled in series with transistor Q1. A first input of auxiliary power circuit 714 may be coupled to conductor 708, and a second input of auxiliary power circuit 704a may be coupled to transistor Q1.

Figure 7C:
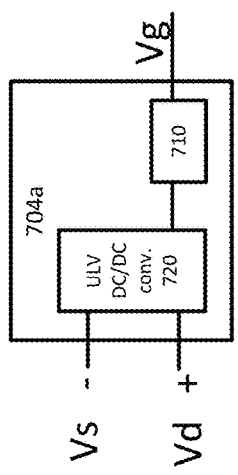

Reference is now made to FIG. 7C, which depicts an auxiliary power circuit according to illustrative embodiments. Auxiliary power circuit 704a may be used as auxiliary power circuit 704 of FIG. 7A. A first input to auxiliary power circuit 704a may be coupled to the source terminal of a transistor (e.g. Q1 of FIG. 7A), and a second input to auxiliary power circuit 704a may be coupled to the drain terminal of a transistor. An output of auxiliary power circuit 704a may be coupled to the gate terminal of a transistor. Auxiliary power circuit 704a may comprise Ultra Low Voltage Direct-Current to Direct Current (DC/DC) converter (ULVC) 720. Controller 710 may be an analog or digital controller, and may be similar to controller 303 of FIG. 3. Controller 710 may be integrated with or separate from auxiliary power circuit 304a. In some embodiments, an output of ULVC 720 may be coupled to an input of controller 710, with controller 710 applying a voltage to the gate of a transistor. ULVC 720 may be configured to receive a very low voltage (e.g. tens or hundreds of millivolts) at its input, and output a substantially larger voltage (e.g. several volts). ULVC 720 may be variously implemented. In some embodiments, ULVC may comprise an oscillator charge pump and/or several conversion stages. Variations of illustrative circuits found in "0.18-V Input Charge Pump with Forward Body Biasing in Startup Circuit using 65 nm CMOS" (P. H. Chen et. al., ©IEEE 2010), "Low voltage integrated charge pump circuits for energy harvesting applications" (W. P. M. Randhika Pathirana, 2014) may be used as or as part of ULVC 720.

Figure 7D:
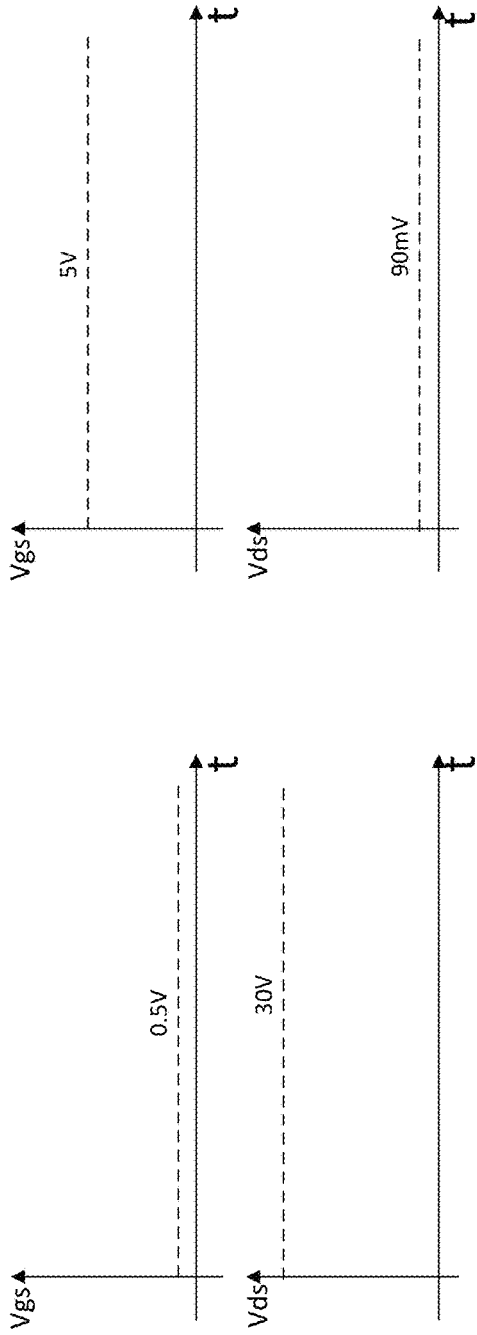
FIG. 7D illustrates a timing diagram depicting some of the operational parameters of a safety switch according to various aspects of the present disclosure.

Reference is now made to FIG. 7D, which shows a timing diagram for operating auxiliary power circuit 704a of FIG. 7C according to an illustrative embodiment. As a numerical example, auxiliary power circuit 704a may be as described above to the terminals of a MOSFET. ULVC 720 may be coupled between the source (Vs) and drain (Vd) terminals of the MOSFET. When the MOSFET is in the OFF position, the voltage drop between terminals Vs and Vd may be substantial, e.g. close to the open-circuit voltage of a PV generator. When the MOSFET is in the OFF position, ULVC 720 may be bypassed or disabled, with the substantial voltage drop between terminals Vs and Vd processed to provide power to controller 710. Controller 710 may hold the voltage between the MOSFET gate and source terminals to a low value, (e.g. 0V or 1V, under a minimum source-gate threshold of 2V), maintaining the MOSFET in the OFF position.

Still referring to FIG. 7D, controller 710 may receive a command via a communication circuit (not explicitly depicted) to turn the MOSFET to the ON state. Controller 710 may increase the gate-to-source voltage to about 5V. In illustrative PV systems, the current flowing through a PV string at certain points of operation may be about 10 A. At a gate-to-source voltage of 5V and drain-to-source current of 10 A, the drain-to-source voltage may be about 90 mV. ULVC 720 may boost the drain-to-source voltage of 90 mV to a voltage of several volts or more (e.g. 5V, 10V, 12V or 20V) for powering controller 710. Controller 710 may continuously hold the gate-to-source voltage at about 5V until a command is received to turn the MOSFET OFF. In some embodiments, the MOSFET is turned OFF at the end of every day, i.e. when PV generators cease producing significant power due to nightfall. When it is time to turn the MOSFET OFF, controller may decrease the gate-to-source voltage back to about 0V or 1V.

Operating auxiliary power circuit 704a according to the illustrative timing diagrams of FIG. 7D may provide several advantages. For example, the steady-state power consumed by safety switch 702a using auxiliary power circuit 704a may be low, in this illustrative example, 90 mV*10 A=900 mW when in the ON position, and 30V*10 uA=0.3 mW when in the OFF position. Furthermore, the steady-state voltage across safety switch 702a may be substantially constant when in the ON position (e.g. 90 mV).

Figures 7E, 7G:
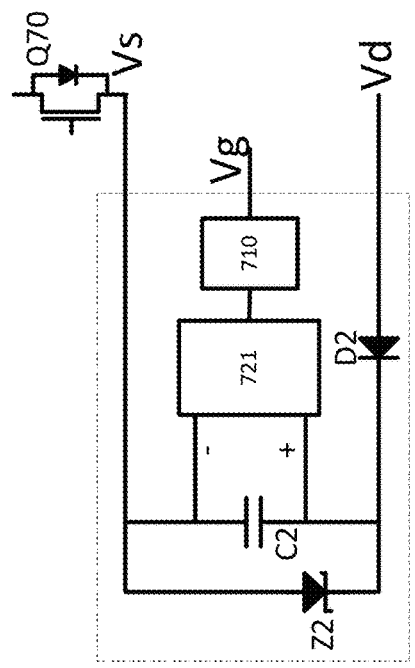
FIG. 7E illustrates a circuit for providing operational power to a safety switch according to various aspects of the present disclosure.
FIG. 7G illustrates a circuit for providing operational power to a safety switch according to various aspects of the present disclosure.

Reference is now made to FIG. 7E, which depicts an auxiliary power circuit according to illustrative embodiments. Auxiliary power circuit 704b may be used as auxiliary power circuit 704 of FIG. 7A. A first input to auxiliary power circuit 704b may be coupled to the source terminal of a transistor (e.g. Q1 of FIG. 7A), and a second input to auxiliary power circuit 704b may be coupled to the drain terminal of a transistor. An output of auxiliary power circuit 704b may be coupled to the gate terminal of a transistor. Auxiliary power circuit 704b may comprise capacitor C2, diode D2, diode Z2, transistor Q70 and DC-to-DC converter 721. In some embodiments, capacitor C2 may be replaced by a different charge device (e.g. a battery). Controller 710 may be analog or digital, and may be similar to controller 303 of FIG. 3. Controller 710 may be integrated with or separate from auxiliary power circuit 304a. Diode Z2 may be a Zener diode designed to limit and hold a reverse-bias voltage to a predetermined value. In this illustrative embodiment, diode Z2 is assumed to have a reverse-bias voltage of 4V. A first input to auxiliary power circuit 704b may be coupled to the source terminal of a transistor (e.g. Q1 of FIG. 7A), and a second input to auxiliary power circuit 704b may be coupled to the drain terminal of a transistor (e.g. Q1). An output of auxiliary power circuit 704b may be coupled to the gate terminal of a transistor (e.g. Q1). In some embodiments, an output of converter 721 may be coupled to an input of controller 710, with controller 710 applying a voltage to the gate of a transistor. Converter 721 may be configured to receive a voltage of several volts (e.g. between 3V-10V) at its input, and output a voltage for powering controller 710 or controlling the gate voltage of a transistor gate terminal.

The anode of diode D2 may be coupled to a transistor drain terminal (Vd), and the cathode of diode D2 may be coupled to the cathode of diode Z2 and a first terminal of capacitor C2. The anode of diode Z2 may be coupled to a drain terminal of transistor Q70, with the source terminal of transistor Q70 coupled to a transistor source terminal (Vs) and to a second terminal of capacitor C2. The gate voltage of transistor Q70 may be controlled by controller 710 (the control line is not explicitly depicted). The inputs of converter 721 may be coupled in parallel with capacitor C2.

Auxiliary power circuits 704a-b and 714 may be operated to provide a voltage drop across the terminals of safety switch 702 according to safety and effective system operation requirements. The drain-to-source voltage may be desired to be low during normal system operation, when safety switch 702 is in the "steady ON state", i.e. when the switch provides a low-impedance path for photovoltaic power to flow through a PV string. When safety switch 702 is in a "steady OFF state", safety switch 702 may be required to provide a drain-to-source voltage of about an open-circuit voltage of a PV generator without providing a low-impedance path for current flow.

Referring back to FIG. 7E, controller 710 may operate transistor Q70 and transistor Q1 of FIG. 7A to provide a voltage drop across the terminals of safety switch 702 according to safety and effective system operation requirements. In the "steady OFF state", transistors Q1 and Q70 may be held in the OFF state. In the "steady ON state" transistor Q1 may be ON, providing a low impedance path between the drain and source terminals, and transistor Q70 may be either ON or OFF. It may be desirable during the "steady ON state" to temporarily move Q1 to the "temporarily OFF state" for a short period of time, to allow capacitor C2 to recharge and continue providing operational power to controller 710. In the "temporarily OFF" state, transistor Q1 may be OFF and transistor Q70 may be ON. Diode Z2 may provide a limited charging voltage (e.g. 4V) across the terminals of capacitor C2, with capacitor C2 providing a current path for the current of a PV string.

Reference is now made to FIG. 7F, which shows a timing diagram for operating auxiliary power circuit 704b of FIG. 7E according to an illustrative embodiment. As a numerical example, auxiliary power circuit 704a may be coupled as described above to the terminals of a MOSFET. Converter 721 may be coupled between the source (Vs) and drain (Vd) terminals of the MOSFET. When the MOSFET is in the steady-OFF-state, the voltage drop between terminals Vs and Vd may be substantial, e.g. close to the open-circuit voltage of a PV generator. When the MOSFET is in the steady-OFF-state, converter 721 may be bypassed or disabled, with the substantial voltage drop between terminals Vs and Vd processed to provide power to controller 710. In some embodiments, when the MOSFET is in the steady-OFF-state, converter 721 may process the drain-to-source voltage to provide power to controller 710. Controller 710 may hold the voltage between the MOSFET gate terminal and source terminals to a low value, (e.g. 0V or 1V, under a minimum source-gate threshold of 2V), maintaining the MOSFET in the OFF position. When the MOSFET is in the steady-OFF-state, capacitor C2 may be charged to about the voltage between the drain and source terminals. In some embodiments, diode D2 may be disconnected (e.g. by turning Q70 to the OFF state), to increase the drain-to-source voltage when the MOSFET is in the steady-OFF-state. In some embodiments, having a large drain-to-source voltage (e.g. about the same voltage as a PV generator open-circuit voltage) when the MOSFET is in the steady-OFF-state increases system safety by decreasing the total voltage across a PV generator and an accompanying safety switch.

Still referring to FIG. 7F, controller 710 may receive a command via a communication circuit (not explicitly depicted) to turn the MOSFET to the ON state. Controller 710 may increase the gate-to-source voltage of Q1 to about 6V. In illustrative PV systems, the current flowing through a PV string at certain points of operation may be about 10 A. At a gate-to-source voltage of 6V and drain-to-source current of 10 A, the drain-to-source voltage may be about 65 mV. Diode D2 might not be forward biased (e.g., if diode has a forward voltage of 0.6V, a drain-to-source voltage of 65 mV might not forward-bias diode D2), disconnecting capacitor C2 from the drain terminal. Capacitor C2 may slowly discharge by providing power to converter 721. Converter 721 may include circuitry (e.g. analog comparators) to monitor the voltage across capacitor C2, and may respond to the voltage across capacitor C2 falling below a first threshold. If the voltage across capacitor falls below the first threshold, controller 710 may reduce the gate-to-source voltage to about 0V or 1V, resulting in the MOSFET moving to the OFF state. Diode D2 may then become forward-biased, and diode Z2 may limit the drain-to-source voltage to a second threshold. Transistor Q70 may be held in the ON state, allowing diode Z2 to regulate the drain-to-source voltage. Capacitor C2 may then be rapidly charged back to about the voltage level of the second threshold, with controller 710 configured to increase the gate-to-source voltage back to 6V when capacitor C2 reaches the second threshold voltage. This iterative process may repeat itself while the MOSFET is operating in a "steady ON state" mode. In the illustrative embodiment illustrated in FIG. 7F, the first threshold is 2V, and the second threshold is 4V. The voltage across capacitor C2 varies between the two levels, with the gate-to-source voltage alternating between about 0V and about 6V, and the drain-to-source voltage alternating between 4V and 65 mV.

Operating auxiliary power circuit 704b according to the illustrative timing diagrams of FIG. 7F may provide several advantages. For example, a converter designed to receive an input voltage between 2-30V (e.g. converter 721) may be cheap, efficient and easy to implement. In some embodiments, additional zener diodes may be coupled in series with diode Z2, increasing the first voltages. Increasing the first threshold voltage (e.g. to 10V, 15V or 20V, respectively) may provide advantages such as decreasing the frequency of charge-discharge cycles over capacitor C2, and may provide a voltage to converter 721 which may be easier to process.

It is to be understood that illustrative operating points comprising MOSFET drain-to-source voltages of 65 mV and 90 mV, MOSFET gate-to-source voltages of 5V and 6V, and MOSFET drain-to-source currents of 10 A are used for illustrative purposes and are not intended to be limiting of operating points used in conjunction with illustrative embodiments disclosed herein. In some embodiments, multiple MOSFET transistors may be parallel-coupled to reduce ON-state resistance, thereby reducing the drain-to-source voltage across MOSFETs when in the ON state. For example, coupling five MOSFETs in parallel may reduce a drain-to-source ON-state voltage from 65 mV to 15 mV.

Reference is now made to FIG. 7G, which depicts an auxiliary power circuit according to illustrative embodiments. Auxiliary power circuit 704c may be used as auxiliary power circuit 704 of FIG. 7A. Auxiliary power circuit 704c may be similar to auxiliary power circuit 704b, with a modification in that the anode of diode Z2 is coupled to the drain terminal of transistor Q1 (Vs), and that the drain terminal of transistor Q70 is also coupled to the source terminal of transistor Q1 (Vs). When safety switch 702 is in the "steady ON state", transistors Q1 and Q70 may be ON, providing a low impedance path for PV string current. When safety switch 702 is in the "steady OFF state", transistors Q1 and Q70 may be OFF, preventing a low impedance path for a PV string current, and providing a substantial voltage drop across the terminals of safety switch 702 (e.g. about the same voltage or a slightly lower voltage than a PV-generator open-circuit voltage). When safety switch 702 is in the "temporarily OFF state", transistor Q1 may be OFF and transistor Q70 may be ON, diode Z2 providing a charging voltage to capacitor C2 and Q70 providing a low-impedance current path for a PV string current.

Figure 7H:
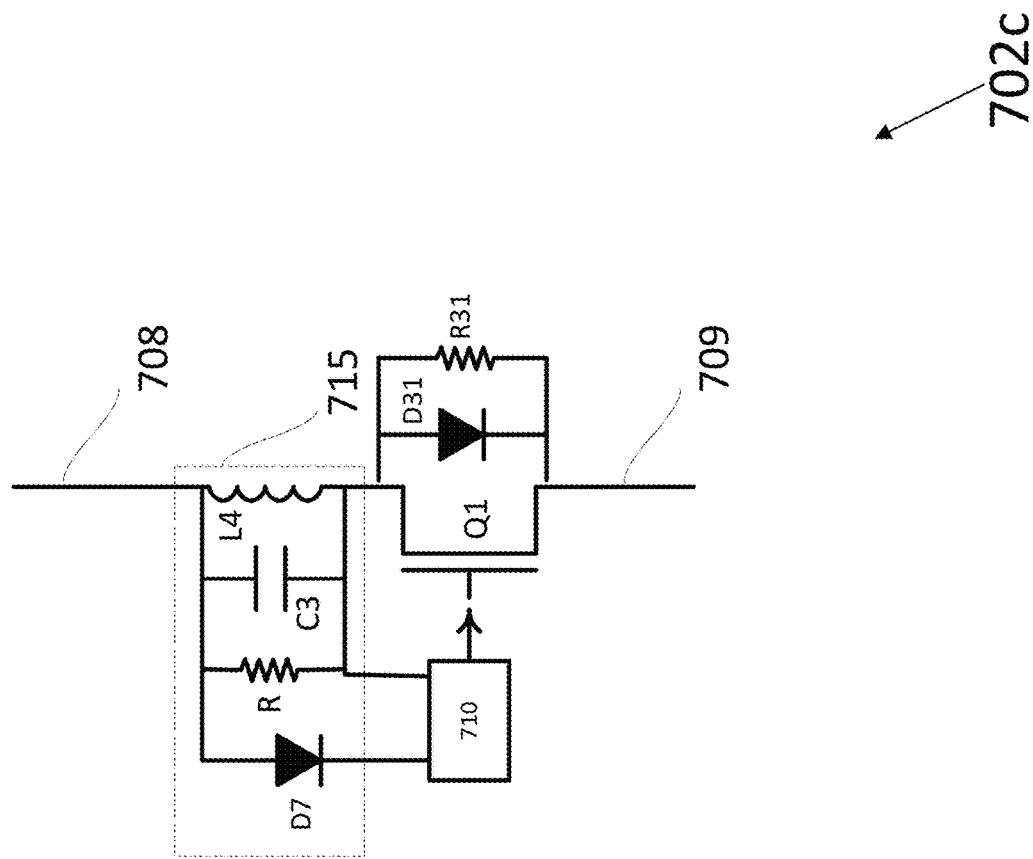
FIG. 7H illustrates a circuit for providing operational power to a safety switch according to various aspects of the present disclosure.

Reference is now made to FIG. 7H, which illustrates a safety switch comprising an auxiliary power circuit according to illustrative embodiments. Safety switch 702c may comprise conductors 708 and 709, transistor Q1, controller 710 and auxiliary power circuit 715. Auxiliary power circuit 715 may be used auxiliary power circuit 714 of FIG. 7B. In this illustrative embodiment, auxiliary power circuit 715 may double as a power line communication (PLC) device. Inductor L4, capacitor C3 and resistor R may be coupled in parallel, with a first node of inductor L4 coupled to conductor 708, and a second node of inductor L4 coupled to the source terminal of transistor Q1. The values of inductor L4 and capacitor C3 may be selected to resonate at a resonant frequency (e.g. 60 kHz).

Still referring to FIG. 7H, an external device (e.g. system power device 110 of FIG. 1) may transmit a PLC high-frequency alternating current signal (e.g. using frequency shift keying, amplitude modulation or other modulation schemes) over conductor 708. The PLC signal may induce a high-frequency alternating-current voltage drop across the terminals of resistor R, with diode D7 providing a voltage to controller 710 when the voltage across resistor R is positive (i.e. the voltage at conductor 708 is higher than the voltage at the source terminal of transistor Q1). In some embodiments, diode D7 may be replaced by a "full bridge" of diodes providing a voltage to controller 710 when the voltage across R is nonzero (either positive or negative). In some embodiments, the PLC-induced voltage across resistor R may serve a dual purpose. The PLC signal may provide operational information to controller 710 by varying the voltage drop across resistor R. Additionally, in some embodiments, the PLC signal may provide operational power to controller 710. Controller 710 may draw power from the resonant circuit comprising resistor R, capacitor C3 and inductor L4, and use the drawn power to set the state of transistor Q1.

Implementing auxiliary power circuit 715 as illustrated in FIG. 7H may provide certain advantages. For example, auxiliary power circuit 715 of FIG. 7H may double as a communication device, reducing the total component count in safety switch 702c. Furthermore, integrating control and power signals may reduce the complexity required to program controller 710. For example, an 'ON' signal may be broadcast by a system controller at a high power, and an 'OFF' signal may be broadcast by a system controller at low power. Auxiliary power circuit 715 may directly apply the converted power signal to the gate of transistor Q1, wherein the power of the 'ON' signal may be sufficient to hold Q1 in the ON state, and the power of the 'OFF' signal might not be sufficient to hold Q1 in the ON state.

Elements of auxiliary power circuits 704a, 704b and 715 may be variously combined. For example, auxiliary power circuit 714 of FIG. 7B may be added to safety switch 702a of FIG. 7A, auxiliary power circuit 714 functioning as a PLC circuit as well as being configured to provide power to controller 710 in case of a malfunction in auxiliary power circuit 704. In some embodiments, auxiliary power circuit 714 may provide initial power to controller 710 at system setup, with auxiliary power circuit 704 providing power to controller 710 during "steady state" operation.

Figure 7I:
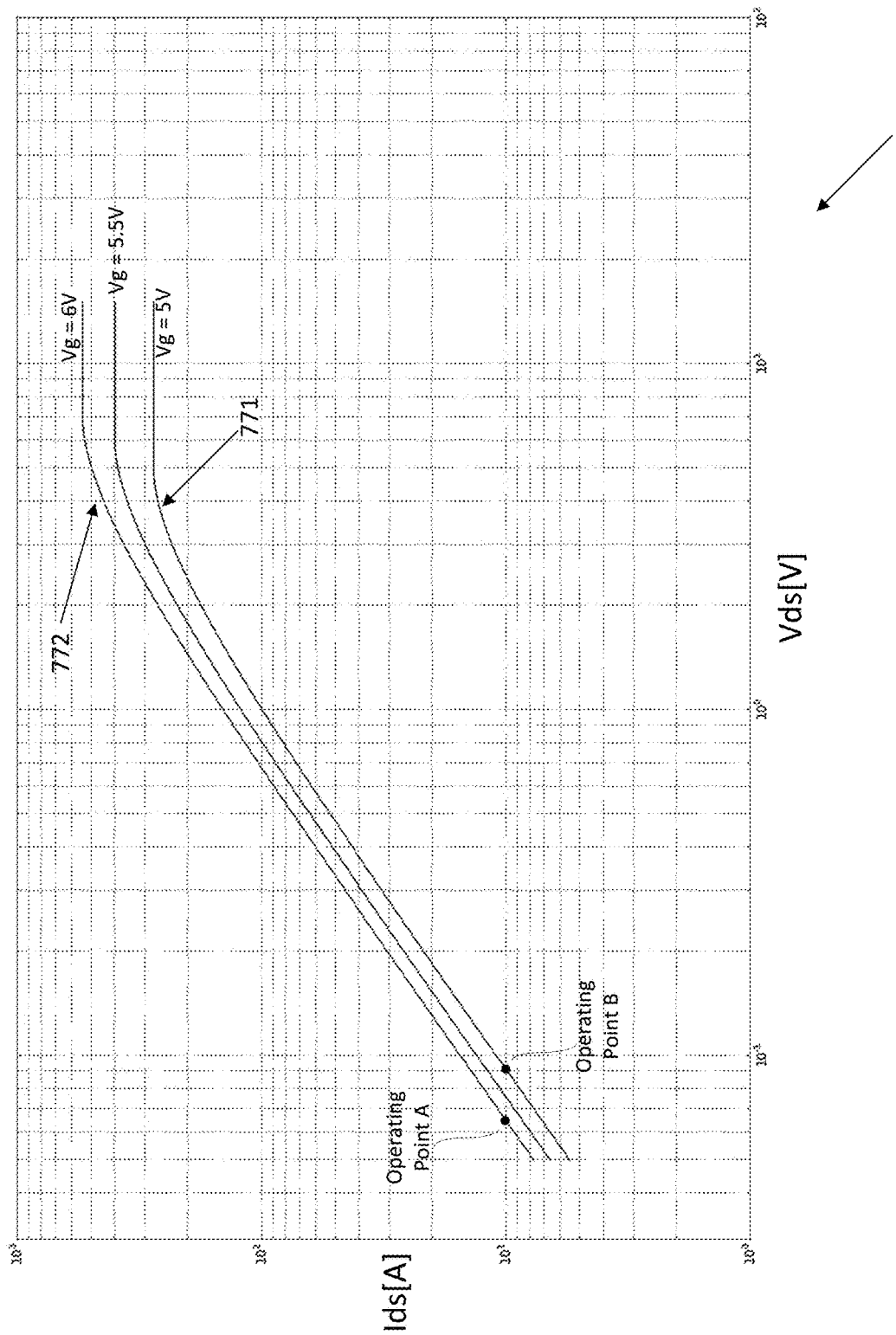
FIG. 7I illustrates part of an illustrative datasheet indicating possible operating points for operating a transistor according to various aspects of the present disclosure.

Reference is now made to FIG. 7I, which illustrates part of a MOSFET datasheet according to an illustrative embodiment. Plot 770 may depict relationships between drain-to-source voltage and drain-to-source current through a MOSFET. Curve 771 may depict a current-voltage relationship when the gate-to-source voltage applied to a MOSFET is 5V. Curve 771 may depict a current-voltage relationship when the gate-to-source voltage applied to a MOSFET is 6V. Operating point A may indicate that when a gate-to-source voltage applied to a MOSFET is 6V and the drain-to-source current flowing through the MOSFET is 10 A, the drain-to-source voltage across the MOSFET is about 65 mV. This may correspond to a possible operating point for a MOSFET operated according to FIG. 7F. Operating point B may indicate that when a gate-to-source voltage applied to a MOSFET is 5V and the drain-to-source current flowing through the MOSFET is 10 A, the drain-to-source voltage across the MOSFET is about 90 mV. This may correspond to a possible operating point for a MOSFET operated according to FIG. 7D. As noted above, these operating points are illustrative only, and may adapted by connected multiple MOSFETs in parallel to obtain new operating points.

Figure 8:
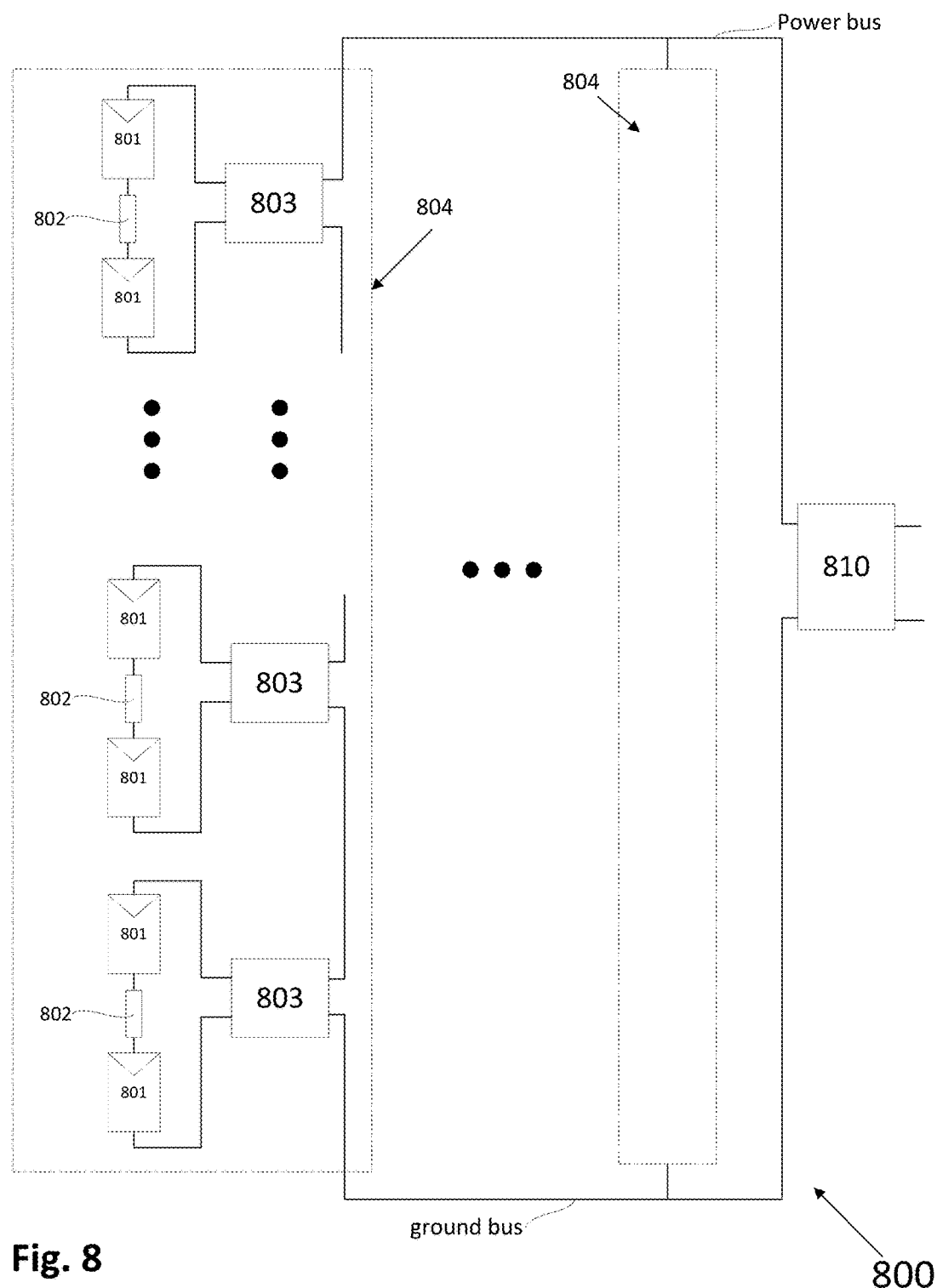
FIG. 8 illustrates a photovoltaic system configuration according to various aspects of the present disclosure.

Reference is now made to FIG. 8, which shows a photovoltaic (PV) system according to illustrative embodiments. PV system 800 may comprise a plurality of PV strings 804 coupled in parallel between a ground bus and a power bus. Each of PV strings 804 may comprise a plurality of photovoltaic generators 801, a plurality of safety switches 802 and a plurality of PV power devices 803. PV generators 801 may be similar to or the same as PV generators 101 of FIG. 1A, and safety switches 802 may be similar to or the same as safety switch 102 of FIG. 1A, safety switch 302 of FIG. 3 and/or safety switches 702a-702c of FIGS. 7A-7C.

In some embodiments, the power and ground buses may be input to system power device 810. In some embodiments, system power device 810 may include a DC/AC inverter and may output alternating current (AC) power to a power grid, home or other destinations. In some embodiments, system power device 810 may comprise a combiner box, transformer and/or safety disconnect circuit. For example, system power device 810 may comprise a DC combiner box for receiving DC power from a plurality of PV strings 804 and outputting the combined DC power. In some embodiments, system power device 810 may include a fuse coupled to each PV string 804 for overcurrent protection, and/or one or more disconnect switches for disconnecting one or more PV strings 804. In some embodiments, system power device 810 may comprise a system controller (e.g. a Digital Signal Processor (DSP), Application-Specific Integrated Circuit (ASIC) and/or a Field Programmable Gate Array (FPGA)) for providing commands to and receiving data from PV power devices 803 and safety switches 802.

Each safety switch 802 may be coupled between a first output of a first PV generator and a second output of a second output generator, and each PV power device may have two input terminals: a first input terminal coupled to the second output of the first PV generator, and a second input terminal coupled to the first output of the second PV generator. In this "two-to-one" arrangement, each pair of PV generators 801 are effectively coupled in series, with the combined voltage and power of the two PV generators provided to the input of PV power device 803. Each safety switch 802 is disposed between the two PV generators, for disconnecting the pair of PV generators in case of a potentially unsafe condition.

Some conventional PV installations feature a similar arrangement, with each pair of PV generators 801 directly connected to each other without a safety switch disposed in between the generators. In case of an unsafe condition, a PV power device 803 may stop drawing power from the PV generators, resulting in an open-circuit voltage at the PV power device input terminals which is about double the open-circuit voltage of each PV power generator. This voltage may, in some systems, be as high as 80, 100 or even 120 volts, which may be higher than the allowed safe voltage defined by safety regulations.

By operating safety switches 802 according to apparatuses and methods disclosed herein, in case of an unsafe condition (e.g. detected by system power device 810, a PV power device 803 and/or a safety switch 802), one or more safety switches 802 may move to the OFF state, reducing the voltage drop between the input terminals of each PV power device 803 to about 40-60 volts, which may be an adequately safe voltage level.

Each PV power device 803 may receive power from two photovoltaic generators 801 coupled to the inputs of PV power device 803, and may provide the combined power of the two photovoltaic generators at the outputs of PV power device 803. The outputs of a plurality of PV power devices 803 may be coupled in series to form a PV string 804, with a plurality of PV strings 804 coupled in parallel to provide power to system power device 810.

While FIG. 8 illustrates an arrangement wherein two PV generators 801 are coupled in parallel to each PV power device 803, various arrangements can be easily obtained. For example, each PV power device receive power from three or more serially-connected PV generators 801, with safety switches 802 disposed between the PV generators. In some embodiments, some PV power devices 803 may receive power from a single PV generator 801, some PV power devices may receive power from two PV generators 801, and some PV power devices may receive power from more than two PV generators 801. In some embodiments, PV power devices 803 may receive power from multiple parallel-connected serial strings of PV generators 801, with safety switches 802 disposed in the serial strings. Embodiments disclosed herein include the aforementioned modifications, and other modifications which will be evident to one of ordinary skill in the art.

Reference is now made to FIG. 9, which illustrates circuitry which may be found in a power device such as power device 903, according to an illustrative embodiment. PV power device 903 may be similar to or the same as PV power device 803 of FIG. 8. In some embodiments, PV power device 903 may include power converter 900. Power converter 900 may comprise a direct current-direct current (DC/DC) converter such as a Buck, Boost, Buck/Boost, Buck+Boost, Cuk, Flyback and/or forward converter. In some embodiments, power converter 900 may comprise a direct current—alternating current (DC/AC) converter (also known as an inverter), such a micro-inverter. Power converter 900 may have two input terminals and two output terminals, which may be the same as the input terminals and output terminals of PV power device 903. In some embodiments, PV power device 903 may include Maximum Power Point Tracking (MPPT) circuit 906, configured to extract increased power from a power source the power device is coupled to. In some embodiments, power converter 900 may include MPPT functionality. In some embodiments, MPPT circuit 906 may implement impedance matching algorithms to extract increased power from a power source the power device is coupled to. Power device 903 may further comprise controller 905 such as a microprocessor, Digital Signal Processor (DSP), Application-Specific Integrated Circuit (ASIC) and/or a Field Programmable Gate Array (FPGA).

Still referring to FIG. 9, controller 905 may control and/or communicate with other elements of power device 903 over common bus 920. In some embodiments, power device 903 may include circuitry and/or sensors/sensor interfaces 904 configured to measure parameters directly or receive measured parameters from connected sensors and/or sensor interfaces 904 configured to measure parameters on or near the power source, such as the voltage and/or current output by the power source and/or the power output by the power source. In some embodiments the power source may be a PV generator comprising PV cells, and a sensor or sensor interface may directly measure or receive measurements of the irradiance received by the PV cells, and/or the temperature on or near the PV generator.

Still referring to FIG. 9, in some embodiments, power device 903 may include communication device 911, configured to transmit and/or receive data and/or commands from other devices. Communication device 911 may communicate using Power Line Communication (PLC) technology, or wireless technologies such as ZigBee™, Wi-Fi, cellular communication or other wireless methods. In some embodiments, power device 903 may include memory device 909, for logging measurements taken by sensor(s)/sensor interfaces 904 to store code, operational protocols or other operating information. Memory device 909 may be flash, Electrically Erasable Programmable Read-Only Memory (EEPROM), Random Access Memory (RAM), Solid State Devices (SSD) or other types of appropriate memory devices.

Still referring to FIG. 9, in some embodiments, PV power device 903 may include safety devices 907 (e.g. fuses, circuit breakers and Residual Current Detectors). Safety devices 907 may be passive or active. For example, safety devices 907 may comprise one or more passive fuses disposed within power device 903 and designed to melt when a certain current flows through it, disconnecting part of power device 903 to avoid damage. In some embodiments, safety devices 907 may comprise active disconnect switches, configured to receive commands from a controller (e.g. controller 905, or an external controller) to disconnect portions of power device 903, or configured to disconnect portions of power device 903 in response to a measurement measured by a sensor (e.g. a measurement measured or obtained by sensors/sensor interfaces 904). In some embodiments, power device 903 may comprise auxiliary power circuit 908, configured to receive power from a power source coupled to power device 903, and output power suitable for operating other circuitry components (e.g. controller 905, communication device 911, etc.). Communication, electrical coupling and/or data-sharing between the various components of power device 903 may be carried out over common bus 920.

Still referring to FIG. 9, in some embodiments, PV power device 903 may comprise transistor Q9 coupled between the inputs of power converter 900. Transistor Q9 may be controlled by controller 905. If an unsafe condition is detected, controller 905 may set transistor Q9 to ON, short-circuiting the input to power converter 900. Transistor Q9 may be controlled in conjunction with safety switch 802 of FIG. 8. When safety switch 802 and transistor Q9 are OFF, each pair of PV generators 801 of FIG. 8 are disconnected, each PV generator providing an open-circuit voltage at its output terminals. When safety switch 802 and transistor Q9 are ON, each pair of PV generators 801 of FIG. 8 are connected and short-circuited, the pair of PV generators providing a voltage of about zero to power converter 900. In both scenarios, a safe voltage at all system locations may be maintained, and the two scenarios may be staggered to alternate between open-circuiting and short-circuiting PV generators. This mode of operation may allow continuous power supply to system control devices, as well as provide backup mechanisms for maintaining a safe voltage (i.e. in case a safety switch 802 malfunctions, operation of transistor Q9 may allow continued safe operating conditions).

Figure 10:
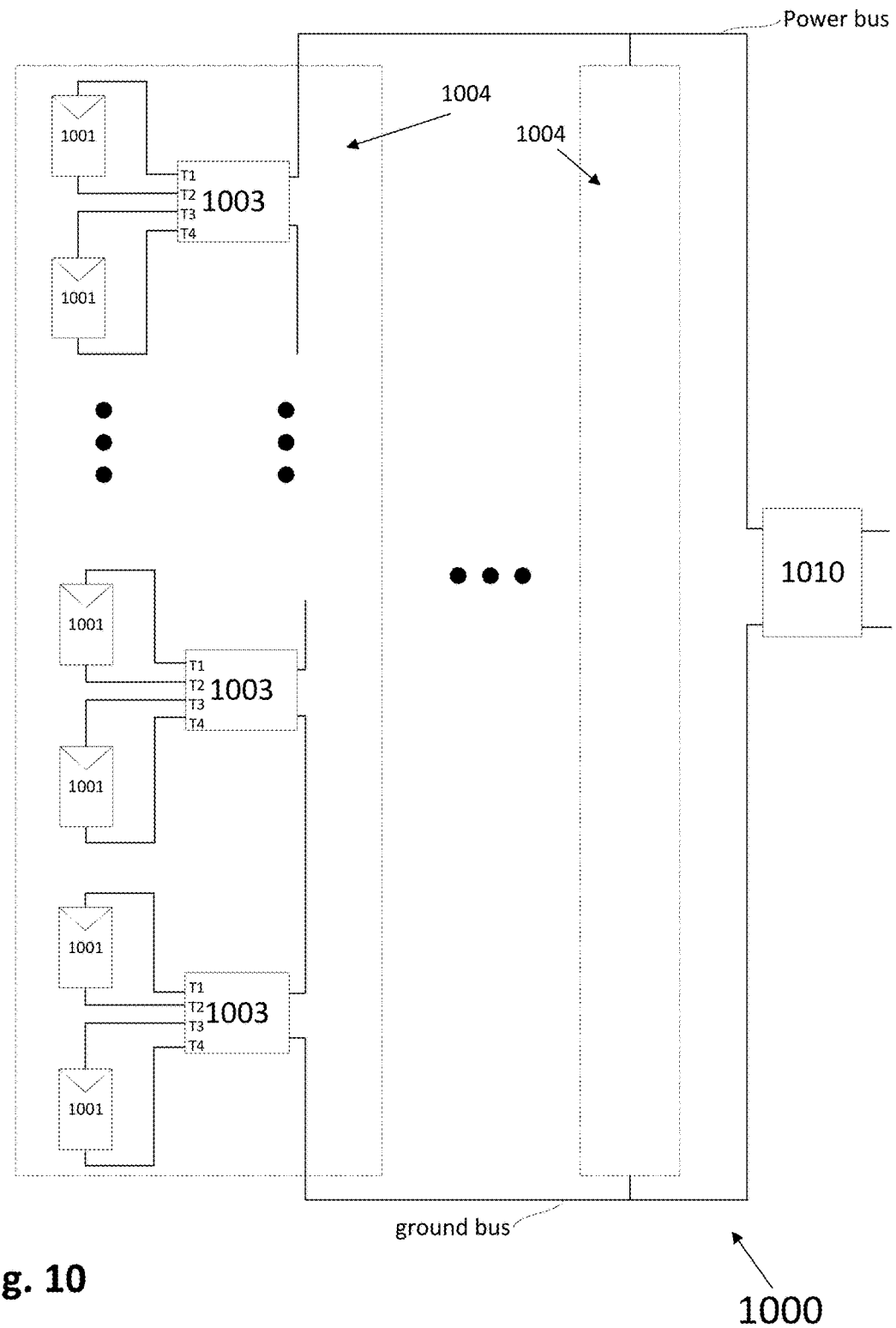
FIG. 10 illustrates a photovoltaic system configuration according to various aspects of the present disclosure.

Reference is now made to FIG. 10, which shows a photovoltaic (PV) system according to illustrative embodiments. PV system 1000 may comprise a plurality of PV strings 1004 coupled in parallel between a ground bus and a power bus. Each of PV strings 1004 may comprise a plurality of photovoltaic generators 1001 and a plurality of PV power devices 1003. PV generators 1001 may be similar to or the same as PV generators 801 of FIG. 8. In some embodiments, the power and ground buses may be input to system power device 1010, which may be similar to or the same as system power device 810 of FIG. 8.

Each of photovoltaic power devices 1003 may comprise four input terminals: T1, T2, T3 and T4. T1 and T2 may be coupled to and receive power from a first PV generator, and T3 and T4 may be coupled to and receive power from a second PV generator. In some embodiments, PV power device 1003 may be substantially the same as PV power device 803 of FIG. 8, with the addition of safety switch 802 integrated into PV power device 1003 and connected in between terminals T2 and T3 of PV power device 1003.

Figure 11B:
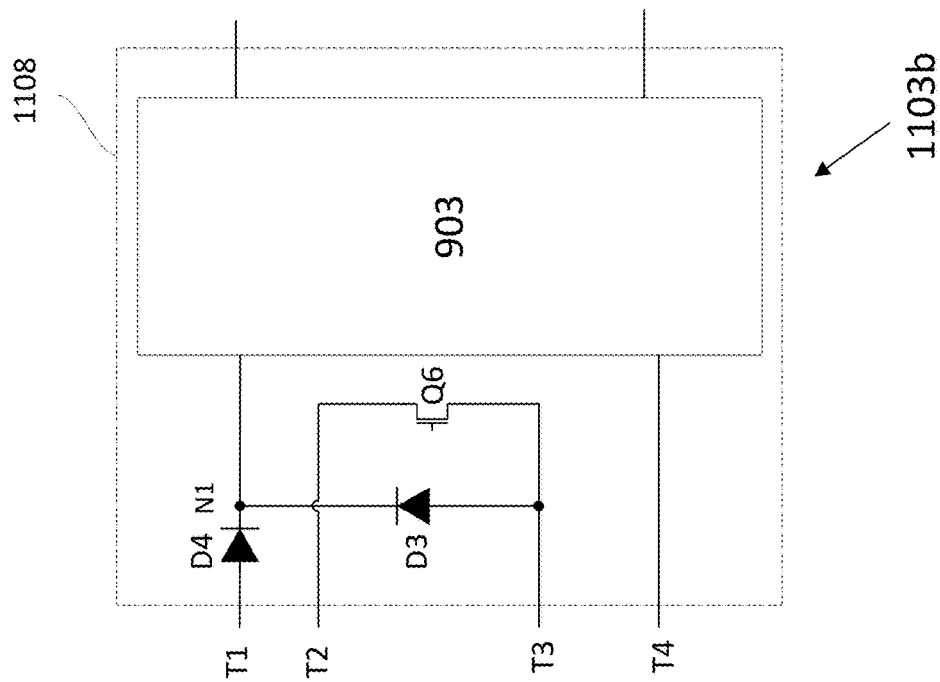
FIGS. 11A-11B illustrate a photovoltaic power devices according to various aspects of the present disclosure.
Figure 11A:
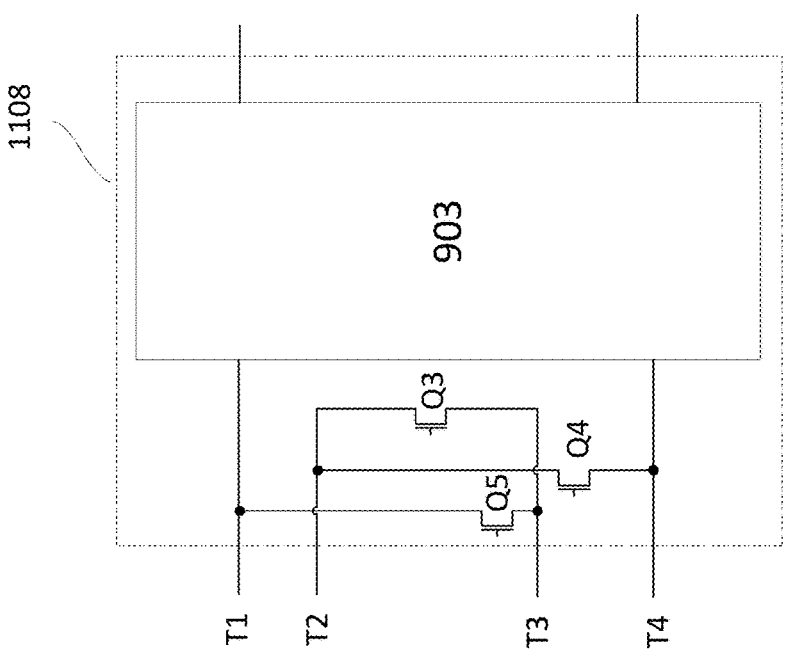

Reference is now made to FIG. 11A, which shows a photovoltaic power device according to illustrative embodiments. PV power device 1103a may be used as PV power device 1003 of FIG. 10. PV power device 1103a may comprise a PV power device similar to or the same as PV power device 803 of FIG. 8 or PV power device 903 of FIG. 9. For convenience, in the illustrative embodiments of FIG. 11A and FIG. 11B, PV power device 1103a will be assumed to comprise PV power device 903 of FIG. 9.

PV power device 1103a may comprise transistors Q3, Q4 and Q5. Transistors Q3-Q5 may be MOSFETs, JFETs, IGBTs, BJTs or other appropriate transistors. For the illustrative embodiment of FIG. 11A, transistors Q3-Q5 will be assumed to be MOSFETs. Transistor Q3 may be connected between input terminals T2 and T3. Transistor Q4 may be connected between input terminals T2 and T4. Transistor Q1 may be connected between input terminals T1 and T3. Transistors Q3-Q5 may be controlled (e.g. have gate signals provided) by one or more controllers such as controller 905 of PV power device 903. The elements comprising PV power device 1103a may be jointly enclosed by enclosure 1108.

A first PV generator (not explicitly depicted) may be coupled between terminals T1 and T2, and a second PV generator (not explicitly depicted) may be coupled between terminals T3 and T4. Under normal operating conditions, transistor Q3 may be ON, and transistors Q4 and Q5 may be OFF. Under these conditions, the two photovoltaic generators may be serially connected, with the combined serial voltage of the two PV generators provided between terminals T1 and T4. When a potentially unsafe condition is detected, the controller controlling transistor Q3 may turn Q3 to the OFF state, reducing the voltage drop between terminals T1 and T4.

Even when transistor Q3 is OFF, power may still be provided at the input to PV power device 903. For example, in some embodiments, controller(s) controlling transistors Q4 and Q5 may switch Q4 and Q5 to the ON state when Q3 is OFF, resulting in terminal T1 being short-circuited to terminal T3, and terminal T2 being short-circuited to terminal T4. Under these conditions, the first and second photovoltaic generator may be coupled in parallel between terminal T1 and T4, allowing PV power device 903 to draw power from the PV generators (e.g. for powering devices such as controller 905, communication device 911, auxiliary power circuit 908 and other devices depicted in FIG. 9). In some embodiments, Q4 or Q5 might not be included in PV power device 1103a. For example, Q4 might not be included, in which case by turning Q5 to the ON position when Q3 is OFF, power is provided to PV power device 903 by a single PV generator (coupled between T3 and T4). Similarly, Q5 might not be included, in which case by turning Q4 to the ON position when Q3 is OFF, power is provided to PV power device 903 by a single PV generator (coupled between T1 and T2).

Reference is now made to FIG. 11B, which shows a photovoltaic power device according to illustrative embodiments. PV power device 1103b may be used as PV power device 1003 of FIG. 10. PV power device 1103b may comprise a PV power device similar to or the same as PV power device 803 of FIG. 8 or PV power device 903 of FIG. 9. For convenience, in the illustrative embodiments of FIG. 11A and FIG. 11B, PV power device 1103a will be assumed to comprise PV power device 903 of FIG. 9.

Transistor Q6 may be similar to or the same as transistor Q3 of FIG. 11A. PV power device 1103b may further comprise diodes D3 and D4. The anode of diode D3 may be coupled to terminal T3 and the cathode of diode D3 may be coupled to the positive input of PV power device 903 at node N1. The anode of diode D4 may be coupled to terminal T1 and the cathode of diode D3 may be coupled to the positive input of PV power device 903 at node N1. The elements comprising PV power device 1103b may be jointly enclosed by enclosure 1108.

Still referring to FIG. 11B, a first PV generator (not explicitly depicted) may be coupled between terminals T1 and T2, and a second PV generator (not explicitly depicted) may be coupled between terminals T3 and T4. Under normal operating conditions, transistor Q3 may be ON, connecting terminals T2 and T3. The voltage at terminal T1 may be higher than the voltage at terminal T2 (e.g. if the positive output of a PV generator is coupled to terminal T1 and the negative output of the PV generator is coupled to terminal T2), so diode D4 may be forward-biased and diode D3 may be reverse-biased. The voltage at node N1 may be about the voltage at terminal T1 (assuming an insignificant voltage drop across diode D4), resulting in a voltage input to PV power device 903 about equal to the voltage between terminals T1 and T4.

When a potentially unsafe condition is detected, the controller controlling transistor Q6 may turn Q6 to the OFF state, disconnecting the coupling of terminals T2 and T3. The voltage at node N1 may be the voltage at terminal T1 or the voltage at terminal T3, the greater of the two. While the voltage at node N1 might not be predetermined, in either possible scenario, a PV generator may be coupled to the inputs of PV power device 903, providing power to PV power device 903 (e.g. for powering devices such as controller 905, communication device 911, auxiliary power circuit 908 and other devices depicted in FIG. 9).

Figure 12:
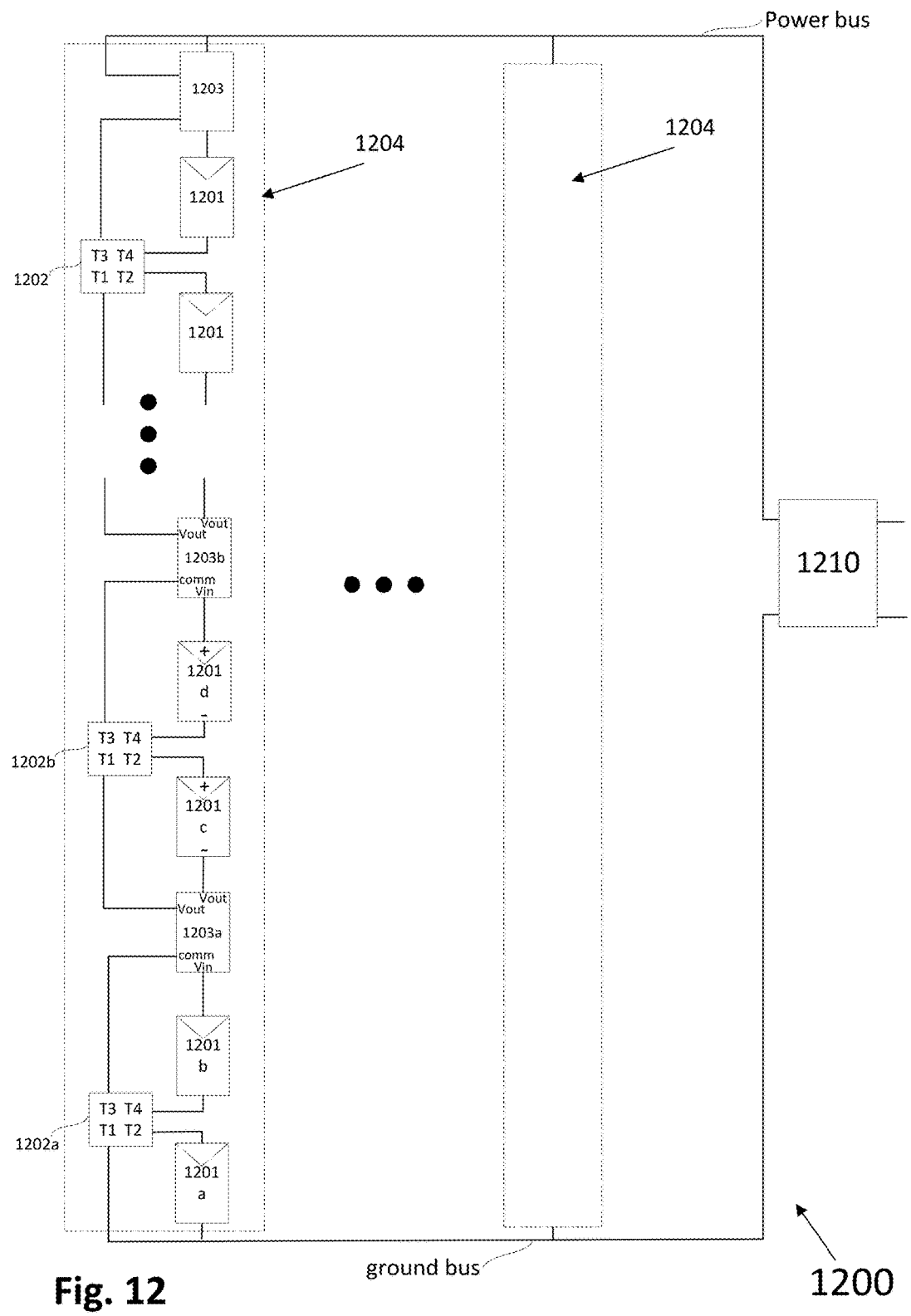
FIG. 12 illustrates a photovoltaic system configuration according to various aspects of the present disclosure.

Reference is now made to FIG. 12, which shows a photovoltaic (PV) system according to illustrative embodiments. PV system 1200 may comprise a plurality of PV strings 1204 coupled in parallel between a ground bus and a power bus. Each of PV strings 1204 may comprise a plurality of photovoltaic generators 1201, a plurality of safety switches 1202 and a plurality of PV power devices 1203. PV generators 1001 may be similar to or the same as PV generators 801 of FIG. 8. In some embodiments, the power and ground buses may be input to system power device 1210, which may be similar to or the same as system power device 810 of FIG. 8.

Each PV power device 1203 may be designed to be coupled to more than one PV power generator 1201. For example, in PV system 1200, each PV power device 1203 (except for the PV power devices coupled to the power bus) is coupled to two PV power generators and to two safety switches 1202, with each safety switch 1202 (except for the safety switch 1202 which is coupled to the ground bus) coupled to two PV generators 1201 and two PV power devices 1203.

Under normal operating conditions, each PV power device 1203 may receive power from two PV generators 1201, and may forward the power along PV string 1204 towards the power bus. Under normal operating conditions, each safety switch 1202 may provide a connection between two PV generators 1201 and may provide a connection between two PV power devices 1203 for forwarding power along PV string 1204. For example, under normal operating conditions, safety switch 1202a provides a connection between PV generators 1201a and 1201b. PV power device 1203a may receive power generated by PV generators 1201a and 1201b, with safety switches 1202b disposed between PV power devices 1203a and 1203b, providing PV power device 1203a with a connection for forwarding power to PV power device 1203b. Similarly, safety switch 1202b provides a connection between PV generators 1201c and 1201d, with PV power device 1203b receiving power from PV generators 1201c and 1201d.

In case of an unsafe condition, safety switch 1202a may be operated to disconnect PV generator 1201a from PV generator 1201b, and to disconnect PV power device 1203a from the ground bus. Similarly, safety switch 1202b may be operated to disconnect PV generator 1201c from PV generator 1201d, and to disconnect PV power device 1203a PV power device 1203b. Operating safety switches 1202 in this manner may reduce the voltage in various locations in PV system 1200 to safe voltage levels.

Figures 13A, 13B:
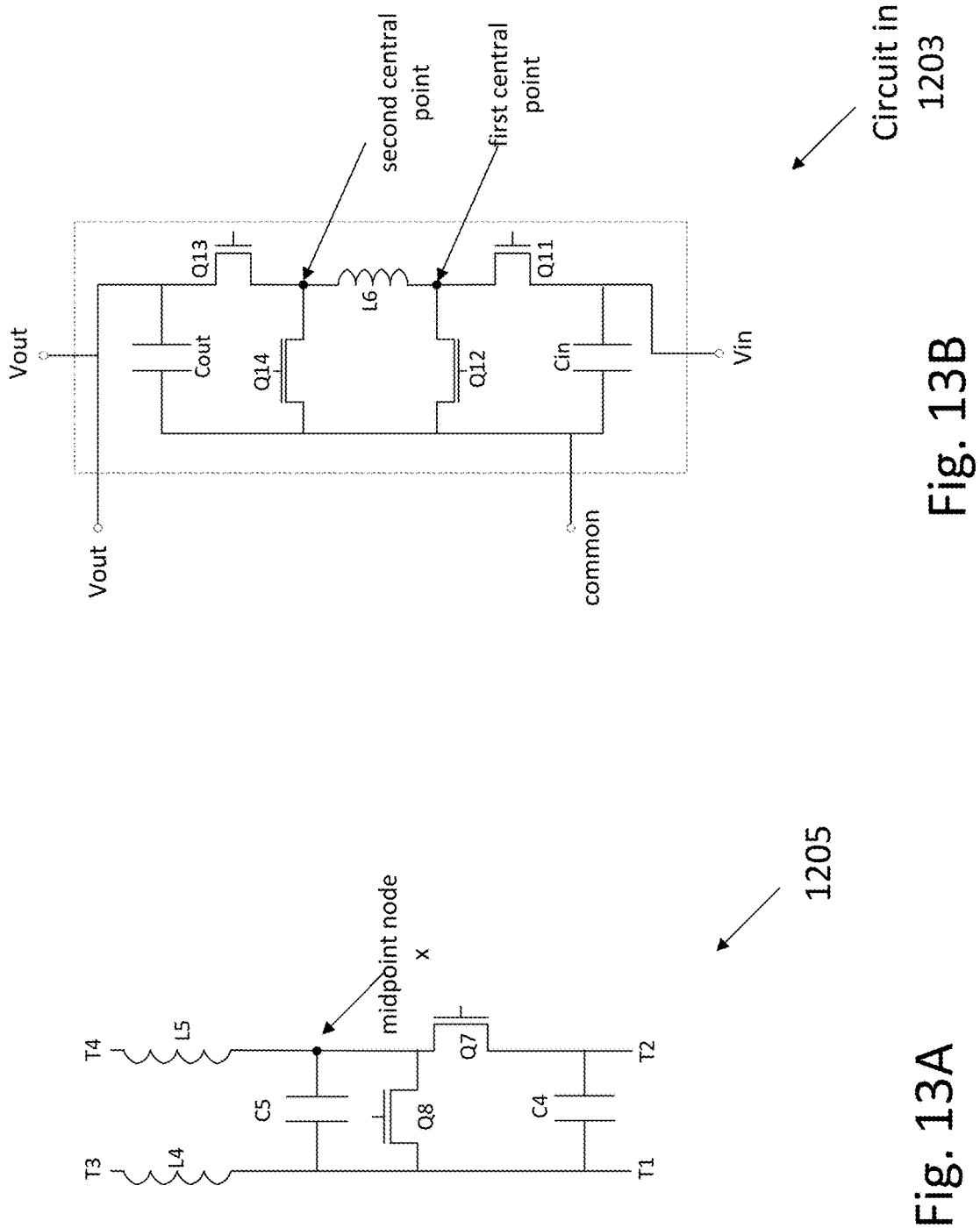
FIG. 13A illustrates circuitry of a safety switch according to various aspects of the present disclosure.
FIG. 13B illustrates circuitry of a photovoltaic power device according to various aspects of the present disclosure.

Reference is now made to FIG. 13A, which shows safety switch 1205 according to an illustrative embodiment. Safety switch 1205 may comprise terminals T1-T4, transistors (e.g. MOSFETs) Q7 and Q8, capacitors C4 and C5, and inductors L4 and L5. Inductor L4 may be provided between terminal T3 and terminal T1 to reduce ripples and/or spikes in a current flowing from terminal T1 to terminal T3, and inductor L5 may be provided between terminal T4 and midpoint node X to reduce ripples and/or spikes in a current flowing from transistor Q7 to terminal T4. In some embodiments, inductors L4 and L5 might not be provided. In some embodiments, transistors Q7 and Q8 may be replaced by alternative switching elements, such as IGBTs, BJTs, JFETs or other switching elements. Capacitor C4 may be coupled between terminals T1 and T2. Transistor Q7 may be coupled between terminal T2 and midpoint node X, and capacitor C5 may be coupled between terminal T1 and midpoint node X. Transistor Q8 may be coupled in parallel to capacitor C5, between terminal T1 and midpoint node X. In some embodiments, capacitor C5 and/or capacitor C4 might not be provided.

During normal system operation, transistor Q7 may be held in the ON state, and transistor Q8 may be in the OFF state. Capacitor C5 may then be in parallel with capacitor C4, and a first PV generator may be coupled between terminals T1 and T2, applying a voltage to capacitors C4 and C5 and providing electrical power at terminals T1 and T2. Terminal T4 may be coupled to an output terminal of a second PV generator, and terminal T3 may be coupled to an input terminal of a PV power device 1203. The power input to safety switch 1205 at terminals T1 and T2 may be output at terminals T3 and T4 to the second PV generators and the PV power device 1203.

Transistors Q7 and Q8 may be controlled by a controller (not explicitly depicted) similar to or the same as controller 710 of FIG. 7A. In some embodiments, the controller may be powered by capacitor C4 (e.g. a controller input power terminal may be coupled to terminal T2 or terminal T1 for receiving power from capacitor C4). Safety switch 1205 may further comprise a communication device (e.g. similar to or the same as communication device 305 of FIG. 3) for receiving operational commands from a system control device.

When an unsafe condition is detected, the controller may switch transistor Q7 to the OFF state and transistor Q8 to the ON state. Capacitor C5 may be short-circuited by transistor Q8, while capacitor C4 may maintain the voltage imposed between terminals T1 and T2.

Reference is now made to FIG. 13B, which shows some of the internal circuitry of a photovoltaic power device according to one illustrative embodiment. In some embodiments, PV power device 1203 may comprise a variation of a Buck+Boost DC/DC converter. The power device may include a circuit having two input terminals, denoted Vin and common, and two output terminals which output the same voltage Vout. The output voltage is in relation to the common terminal. The circuit may include an input capacitor Cin coupled between the common terminal and the Vin terminal, an output capacitor coupled between the common terminal and the Vout terminals. The circuit may include two central points used for reference. The circuit may include a plurality of switches (e.g. MOSFET transistors) Q11, Q12, Q13 and Q14 with Q11 connected between Vin and the first central point, and Q12 connected between the common terminal and the first central point. Q13 may be connected between the Vout terminal and the second central point, and Q14 may be connected between the common terminal and the second central point. The circuit may further include inductor L6 coupled between the two central points.

The operation of the Buck+Boost DC/DC converter in PV power device 1203 may be variously configured. If an output voltage lower than he input voltage is desired, Q13 may be statically ON, Q14 may be statically OFF, and with Q11 and Q12 being Pulse-Width-Modulation (PWM)-switched in a complementary manner to one another, the circuit is temporarily equivalent to a Buck converter and the input voltage is bucked. If an output voltage higher than he input voltage is desired, Q11 may be statically ON, Q12 may be statically OFF, and with Q13 and Q14 being PWM-switched in a complementary manner to one another, the input voltage is boosted. Staggering the switching of switches Q11 and Q12, the circuit may convert the input voltage Vin to output voltage Vout. If current is input to the circuit by the Vin and common terminals, and the voltage drop across capacitors Cin and Cout are about constant voltages Vin and Vout respectively, the currents input to the circuit are combined at inductor L6 to form an inductor current which is equal to the sum of the current input at the Vin and common terminals. The inductor current may contain a ripple due to the charging and discharging of capacitors Cin and Cout, but if the voltage drop across capacitors Cin and Cout are about constant, the voltage ripples over the capacitors are small, and similarly the inductor current ripple may be small. The inductor current may be output by the pair of output terminals Vout. In some embodiments, a single output terminal may be included, and system designers may split the output terminal externally (i.e. outside of the PV power device circuit), if desired.

In illustrative embodiments, PV power device 1203 may be similar to or the same as PV power device 903 of FIG. 9, with power converter 900 of FIG. 9 comprising the Buck+Boost converter of FIG. 13B. In some embodiments, boosting the voltage input to a PV power device 1203 might not be necessary, in which case PV power device 1203 may comprise a Buck converter similar to the Buck+Boost converter of FIG. 13B, with switch Q14 removed (i.e. replaced by an open-circuit) and switch Q13 replaced with a wire (i.e. connecting the Vout terminal to the second central point).

Referring back to FIG. 12, safety switch 1202b may be coupled to photovoltaic generators 1201c and 1201d, and to PV power devices 1203a and 1203b. Terminal T2 may be connected to the positive output of PV generator 1201c, and terminal T4 may be connected to the negative output of PV generator 1201d. Terminal T1 may be coupled to a first Vout terminal of PV power device 1203a, and terminal T3 may be coupled to the common terminal of PV power device 1203b. The positive output terminal of PV generator 1201d may be coupled to the Vin terminal of PV power device 1203b, and the negative output terminal of PV generator 1201c may be coupled to a second Vout terminal of PV power device 1203a. Under normal operating conditions, PV generators 1201c and 1201d are serially coupled, the combined voltage of PV generators 1201c and 1201d input between the common and Vin terminals of PV power device 1203b. If an unsafe condition is detected, safety switch 1202b may disconnect the connection between terminals T2 and T4 (e.g. by setting transistor Q7 of FIG. 13A to OFF) and couple terminals T3 and T4 (e.g. by setting transistor Q8 of FIG. 13A to ON). As a result, PV generator 1201d may be coupled between the common and Vin terminals of PV power device 1203b, and PV generator 1201c may be coupled between terminals T1 and T2 of safety switch 1202b.

The system topology illustrated in FIG. 12 may provide certain advantages. For example, during normal system operation, two PV generators 1201 provide a combined voltage and power to a PV power device 1203, requiring a reduced number of PV power devices for processing power generated by the PV generators. Furthermore, continuous operational power (i.e. power used for powering device components such as controllers and transistors) is provided to all PV power devices 1203 and safety switches 1202 both during normal operations and during a potentially unsafe condition.

Figure 14:
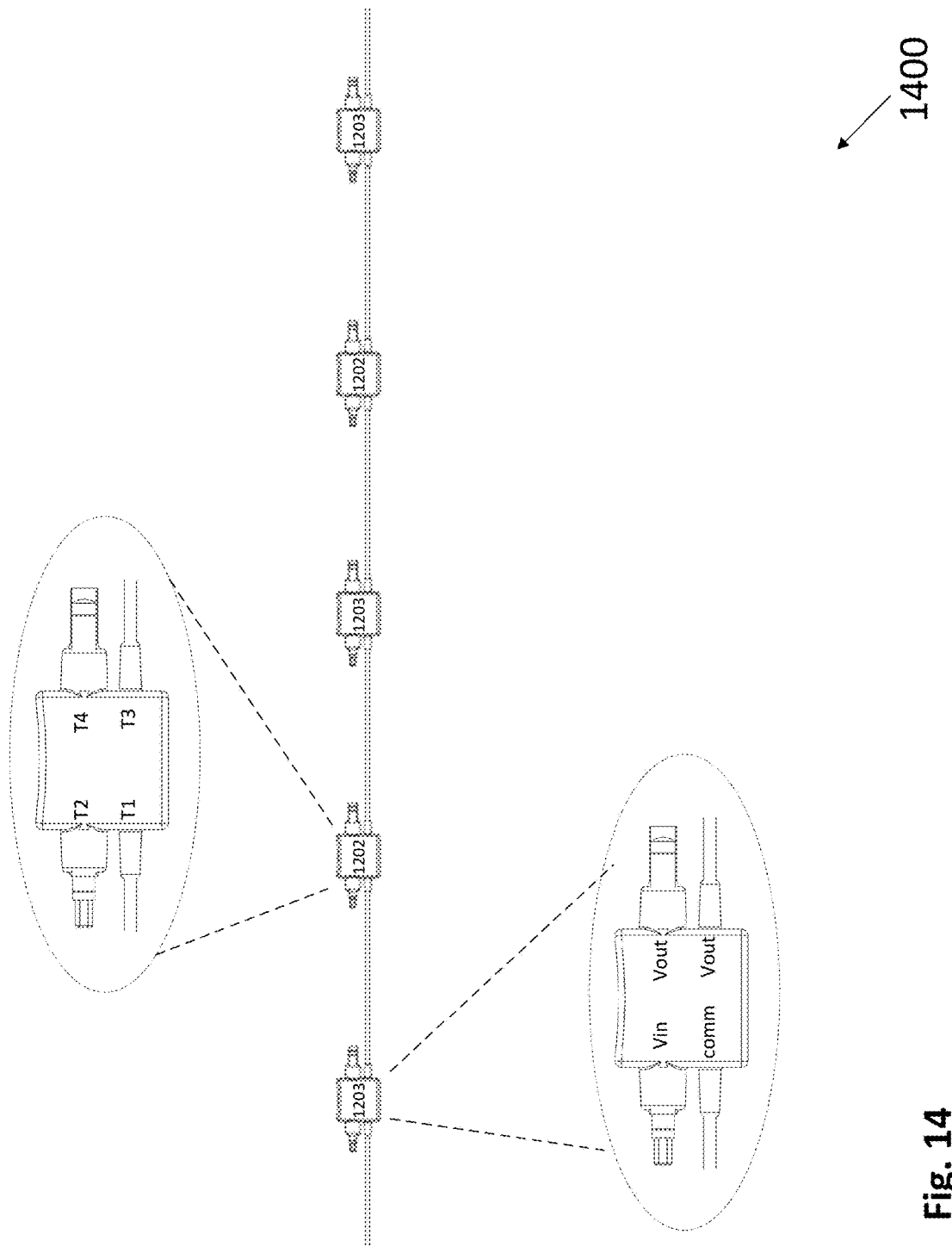
FIG. 14 illustrates a portion of a chain of photovoltaic power devices according to various aspects of the present disclosure.

Reference is now made to FIG. 14, which shows part of a chain of photovoltaic devices according to an illustrative embodiment. Chain 1400 may comprise a plurality of PV power devices 1203 and a plurality of safety switches 1202. Each safety switch 1202 may be connected, using conductors, between two PV power devices 1203. Terminal T1 of safety switch 1202 may be connected to a Vout terminal of a first PV power device, and terminal T3 of safety switch 1202 may be connected to a common terminal of a second PV power device. Terminals T2 and T4 may be accessible via external connectors similar to or the same as connectors 406 and 407 of FIG. 4A. Similarly, a Vout terminal and a Vin terminal of each PV power device 1203 may be accessible via external connectors similar to or the same as connectors 406 and 407 of FIG. 4A. Conductors connecting a PV power device terminal (e.g. the common terminal) to a safety switch terminal (e.g. terminal T3) may be sized to facilitate connecting chain 1400 to a plurality of PV generators, as depicted in FIG. 12. For example, in locales where PV generators are commonly 1-2 meters wide, each conductor disposed between a safety switch 1202 and a PV power device 1203 may be about 1-2 meters long. Chain 1400 may be assembled and sold as a single unit, saving cost and time when constructing a PV installation similar to or the same as PV system 1200 of FIG. 12.

Figure 15:
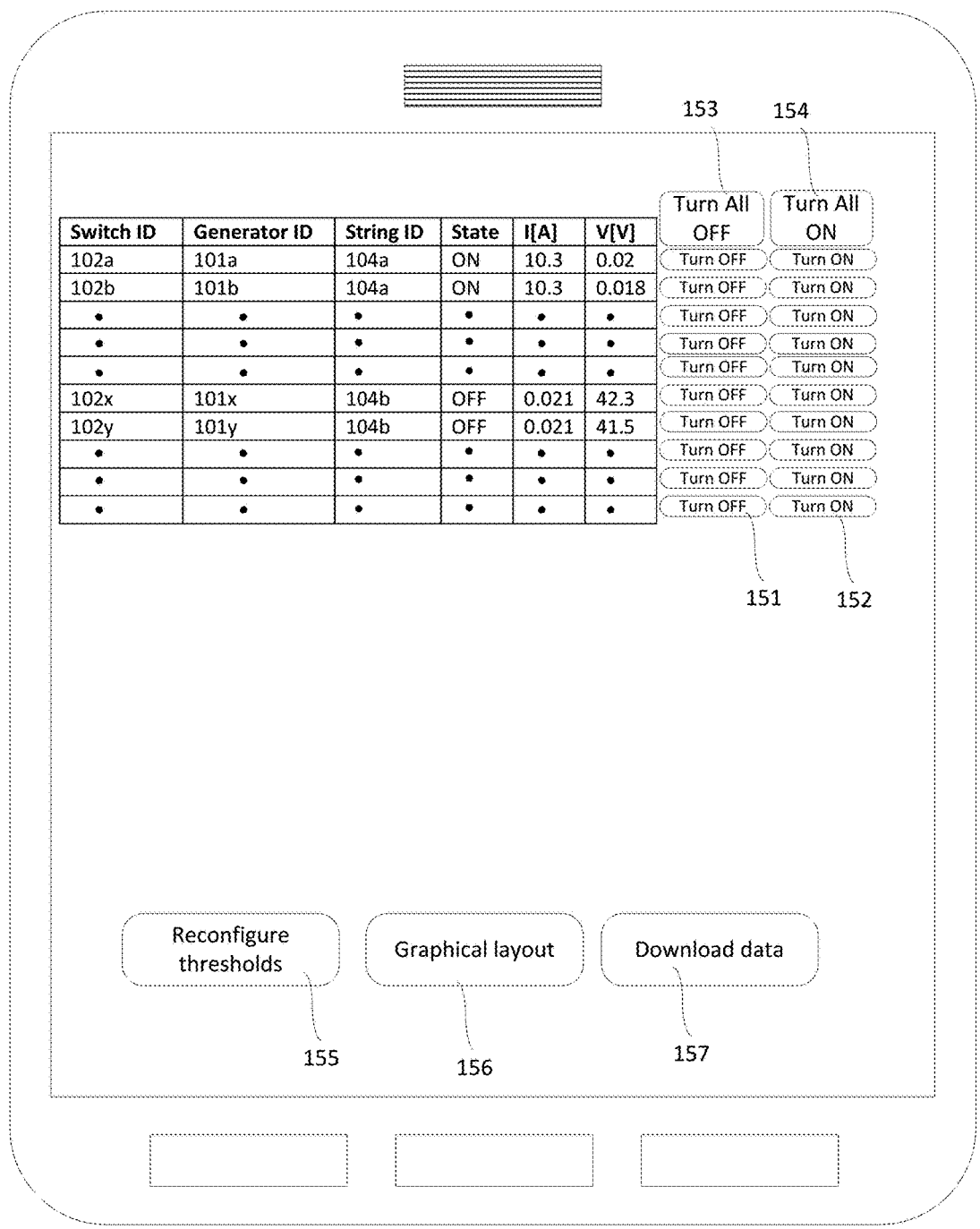
FIG. 15 is an illustrative mockup of a user interface for an electrical system according to illustrative embodiments.

Referring to FIG. 15, an illustrative application running on a smart phone, tablet, computer, workstation, mobile device (such as a cellular device) and/or a similar computing device is shown. The application may provide a list of safety switches disposed in a electrical power system (e.g. system 100 of FIG. 1). The application may indicate a serial number or other identifying information of each safety switch, as well as identifying information of coupled PV generators and/or identifying information of a PV string each safety switch is coupled to. In some embodiments, the application may indicate the state of each safety switch and/or electrical parameters of one or more safety switches, for example, the voltage across or current through one or more safety switches. In some embodiments, the application may provide touch-screen buttons or similar input controllers for controlling the state of one or more switches. For example, activating a button 151 may move an associated safety switch to the OFF state, and activating a button 152 may move an associated safety switch to the ON state. Activating button 153 may move all safety switches to the OFF state, and activating button 154 may move all safety switches to the ON state. In some embodiments, activating buttons 151-154 may be restricted based on a user access level. For example, the application may enable buttons 151-154 only when running in "Installer/Administrator" mode, to restrict the actions of unsophisticated users.

Still referring to FIG. 15, activating button 155 may enable a user to reconfigure a threshold. For example, an electrical voltage, current or power threshold which may be indicative of an arcing condition and trigger a system response (e.g. moving one or more safety switches to the OFF state) may be reconfigured by a user using the application of FIG. 15. Activating button 156 may display a graphical layout of an electrical system represented by the application, including physical location details of one or more safety switches. Activating button 157 may download current or past operational system data such as the state of safety switches, and/or electrical parameter measurement measured by safety switches. Buttons 155-157 may similarly be restricted depending on the level of user authorization.

The application of FIG. 15 may communicate directly with safety switches via wireless communications (e.g. cellular communication, or over the internet). In some embodiments, the application may communicate with a system power device (e.g. system power device 110 of FIG.

1), with the system power device configured to relay communication between the application and the safety switches via wireless communication or wired communication (e.g. power line communication).

In illustrative embodiments disclosed herein, photovoltaic generators are used as examples of power sources which may make use of the novel features disclosed. Each PV generator may comprise one or more solar cells, one or more solar cell strings, one or more solar panels, one or more solar shingles, or combinations thereof. In some embodiments, the power sources may include batteries, flywheels, wind or hydroelectric turbines, fuel cells or other energy sources in addition to or instead of photovoltaic panels. Systems, apparatuses and methods disclosed herein which use PV generators may be equally applicable to alternative systems using additional power sources, and these alternative systems are included in embodiments disclosed herein.

It is noted that various connections are set forth between elements herein. These connections are described in general and, unless specified otherwise, may be direct or indirect; this specification is not intended to be limiting in this respect. Further, elements of one embodiment may be combined with elements from other embodiments in appropriate combinations or subcombinations. For example, PV power device circuitry of one embodiments may be combined with and/or exchanged for power device circuitry of a different embodiment. For example, transistor Q9 of PV power device 903 may be disposed between electrical connections 512 and 513 of junction box 511 and operated to short-circuit the input to PV generator 101 of FIG. 5A.

What is claimed is:

1. An apparatus comprising:
    a first electrical conductor coupled to a first electrical connector, the first electrical connector designed to be connectable to a first power source;
    a second electrical conductor coupled to a second electrical connector, the second electrical connector designed to be connectable to a second power source;
    a switching element forming a series connection between the first power source and the second power source via the first electrical conductor and the second electrical conductor; and
    a controller coupled to a control terminal of the switching element, wherein the controller is configured to control the switching element, in response to a sensor measurement indicative of a potentially unsafe condition, to disconnect the series connection between the first power source and the second power source by disconnecting the first electrical conductor from the second electrical conductor.

2. The apparatus of claim 1, wherein the first power source and the second power source are photovoltaic generators.

3. The apparatus of claim 1, wherein the switching element comprises a transistor.

4. The apparatus of claim 1, further comprising a communication device coupled to the controller, wherein the communication device is configured to receive a message of the sensor measurement indicative of the potentially unsafe condition and to provide the sensor measurement indicative of the potentially unsafe condition to the controller.

5. The apparatus of claim 4, wherein the communication device comprises at least one of a Power Line Communication device and a wireless communication device.

6. The apparatus of claim 4, wherein the communication device is coupled to a power-supply terminal of the controller and is designed to provide operational power to the controller.

7. The apparatus of claim 1, further comprising a sensor coupled to the controller, wherein the sensor is configured to measure one or more electrical parameters and to provide one or more measurements to the controller, wherein the one or more measurements include the sensor measurement indicative of the potentially unsafe condition.

8. The apparatus of claim 7, wherein the sensor is a current sensor, and wherein the sensor measurement indicative of the potentially unsafe condition includes at least one of: a high current measurement, a measurement indicating a change in current flow, and a measurement indicating a mismatch with another electrical parameter.

9. The apparatus of claim 1, further comprising an auxiliary power circuit coupled to the first electrical conductor and the controller, wherein the auxiliary power circuit is configured to draw power from the first electrical conductor and to provide the drawn power to the controller.

10. The apparatus of claim 1, further comprising a resistor coupled in parallel to the switching element.

11. The apparatus of claim 10, wherein the resistor has resistance between 10Ω and 5 kΩ.

12. A method comprising:
    detecting, by a controller, a sensor measurement indicative of a potentially unsafe condition at a power generation installation comprising a plurality of power sources and one or more safety switches, wherein each of the one or more safety switches is connected in series between two power sources of the plurality of power sources;
    controlling, by the controller, the one or more safety switches to disconnect from the two power sources connected in series thereto;
    receiving, by the controller, a sensor measurement indicating that the potentially unsafe condition is no longer present; and
    controlling, by the controller, the one or more safety switches to reconnect to the two power sources connected in series thereto.

13. The method of claim 12, wherein detecting the sensor measurement indicative of the potentially unsafe condition comprises receiving the sensor measurement via a communication device.

14. The method of claim 12, wherein detecting the sensor measurement indicative of the potentially unsafe condition comprises receiving an electrical current measurement and determining that the electrical current measurement is indicative of the potentially unsafe condition, wherein the sensor measurement indicative of the potentially unsafe condition includes at least one of: a high current measurement, a measurement indicating a change in current flow, and a measurement indicating a mismatch with another electrical parameter.

15. The method of claim 12, further comprising:
    receiving, by the controller, operational power provided by an auxiliary power circuit; and
    receiving, by the auxiliary power circuit, power from at least one power source of the plurality of power sources.

16. The method of claim 12, wherein the controller is one of an analog circuit, microprocessor, Digital Signal Processor (DSP), Application-Specific Integrated Circuit (ASIC) and/or a Field Programmable Gate Array (FPGA).

17. An apparatus comprising:
a transistor including a first terminal, a second terminal, and a third terminal;
a diode coupled in parallel to the transistor;
a resistor coupled in parallel to the transistor; and
a power circuit coupled in parallel to the transistor, wherein the power circuit is configured to receive as input a voltage across the first terminal of the transistor and the second terminal of the transistor and to output a voltage to the third terminal of the transistor, wherein the power circuit comprises a direct current to direct current converter, and
wherein the first terminal of the transistor is coupled to a first terminal of a first photovoltaic generator and the second terminal of the transistor is coupled to a second terminal of a second photovoltaic generator.

18. The apparatus of claim 17, wherein the transistor comprises a Metal Oxide Semiconductor Field Effect Transistor (MOSFET), and the diode comprises a built-in body diode.

19. The apparatus of claim 17, wherein the resistor has resistance between 10Ω and 5 kΩ.

20. The apparatus of claim 17, further comprising the first photovoltaic generator, wherein the transistor is integrated into a junction box of the first photovoltaic generator.

21. An apparatus comprising:
a first terminal configured to be coupled to a first power device terminal;
a second terminal configured to be coupled to a first electrical power source;
a third terminal configured to be coupled to a second power device terminal;
a fourth terminal configured to be coupled to a second electrical power source;
a switching element coupled in series between the second terminal and the fourth terminal; and
a controller configured to control a state of the switching element, wherein the controller is configured to disconnect the first electrical power source from the second electrical power source in response to a sensor measurement indicative of a potentially unsafe condition.

22. The apparatus of claim 21, wherein the first power device terminal and the second power device terminal are two input terminals to a power device, and wherein the power device comprises one of a direct-current to direct-current (DC/DC) converter or a direct-current to alternating-current (DC/AC) converter.

23. The apparatus of claim 21, wherein the first power device terminal is an input terminal to a first power device comprising one of a direct-current to direct-current (DC/DC) converter or a direct-current to alternating-current (DC/AC) converter, and the second power device terminal is an input terminal to a second power device comprising one of a direct-current to direct-current (DC/DC) converter or a direct-current to alternating-current (DC/AC) converter.

24. The apparatus of claim 21, wherein the switching element comprises a Metal Oxide Semiconductor Field Effect Transistor (MOSFET).

25. The apparatus of claim 22, further comprising an enclosure housing the switching element and the power device.

* * * * *

UNITED STATES PATENT AND TRADEMARK OFFICE
CERTIFICATE OF CORRECTION

PATENT NO. : 10,230,310 B2
APPLICATION NO. : 15/250068
DATED : March 12, 2019
INVENTOR(S) : Loewenstern et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 102 days.

Signed and Sealed this
Tenth Day of December, 2019

Andrei Iancu
*Director of the United States Patent and Trademark Office*